(12) United States Patent
Sashida

(10) Patent No.: US 8,772,847 B2
(45) Date of Patent: Jul. 8, 2014

(54) SEMICONDUCTOR DEVICE AND METHOD FOR PRODUCING THE SAME

(71) Applicant: Fujitsu Semiconductor Limited, Yokohama (JP)

(72) Inventor: Naoya Sashida, Kuwana (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 13/687,715

(22) Filed: Nov. 28, 2012

(65) Prior Publication Data

US 2013/0168813 A1 Jul. 4, 2013

(30) Foreign Application Priority Data

Dec. 28, 2011 (JP) ................................ 2011-287732

(51) Int. Cl.
*H01L 21/02* (2006.01)

(52) U.S. Cl.
USPC ............... 257/295; 257/532; 257/E29.343; 257/E21.009; 438/3; 438/393

(58) Field of Classification Search
USPC .............. 257/295, 532, E29.343, E21.009; 438/3, 393
See application file for complete search history.

(56) References Cited

U.S. PATENT DOCUMENTS

| | | | | |
|---|---|---|---|---|
| 6,458,604 | B1 * | 10/2002 | Yang | 438/3 |
| 8,039,884 | B2 * | 10/2011 | Noda | 257/295 |
| 2002/0053739 | A1 | 5/2002 | Honma et al. | |
| 2007/0045687 | A1 * | 3/2007 | Kumura et al. | 257/295 |
| 2008/0237866 | A1 | 10/2008 | Wang | |
| 2008/0290385 | A1 * | 11/2008 | Urushido | 257/295 |
| 2009/0302362 | A1 * | 12/2009 | Kikuchi et al. | 257/295 |

FOREIGN PATENT DOCUMENTS

| | | |
|---|---|---|
| JP | 5-343617 A | 12/1993 |
| KR | 2002-0035748 A | 5/2002 |
| KR | 10-0970156 B1 | 7/2010 |

OTHER PUBLICATIONS

Office Action dated Nov. 28, 2013, issued in corresponding Korean application No. 10-2012-145157, w/ English translation.
Office Action dated May 10, 2014, issued in corresponding Korean Application No. 10-2012-145157, with English Translation.

* cited by examiner

*Primary Examiner* — Trung Q Dang

(74) *Attorney, Agent, or Firm* — Westerman, Hattori, Daniels & Adrian, LLP

(57) ABSTRACT

A semiconductor device includes a semiconductor substrate; a first insulating film that is formed over the semiconductor substrate; a capacitor that is formed over the first insulating film and is formed by sequentially stacking a lower electrode, a capacitor dielectric film, and an upper electrode; a second insulating film that is formed over the capacitor and has a hole including the entire region of the upper electrode in plan view; and a conductor plug that is formed in the hole and contains tungsten.

20 Claims, 60 Drawing Sheets

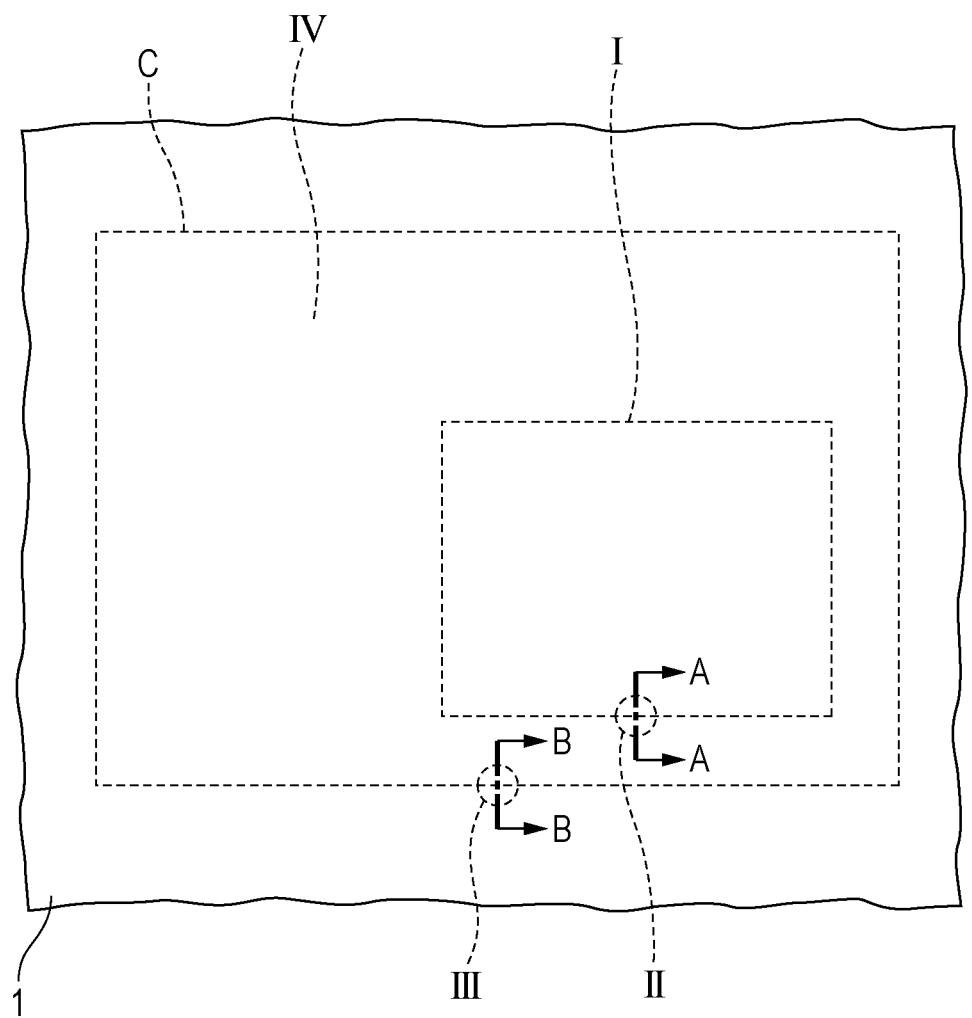

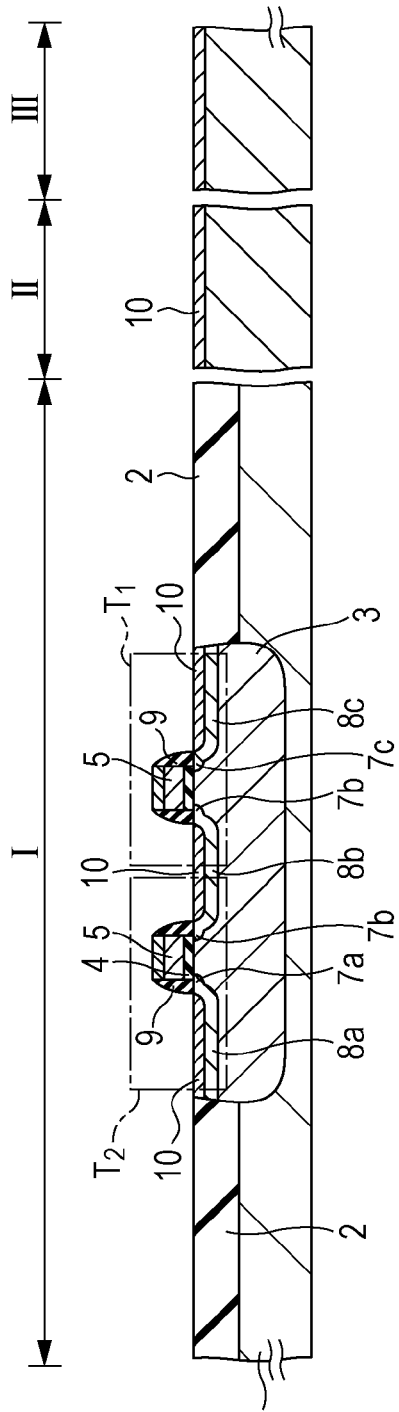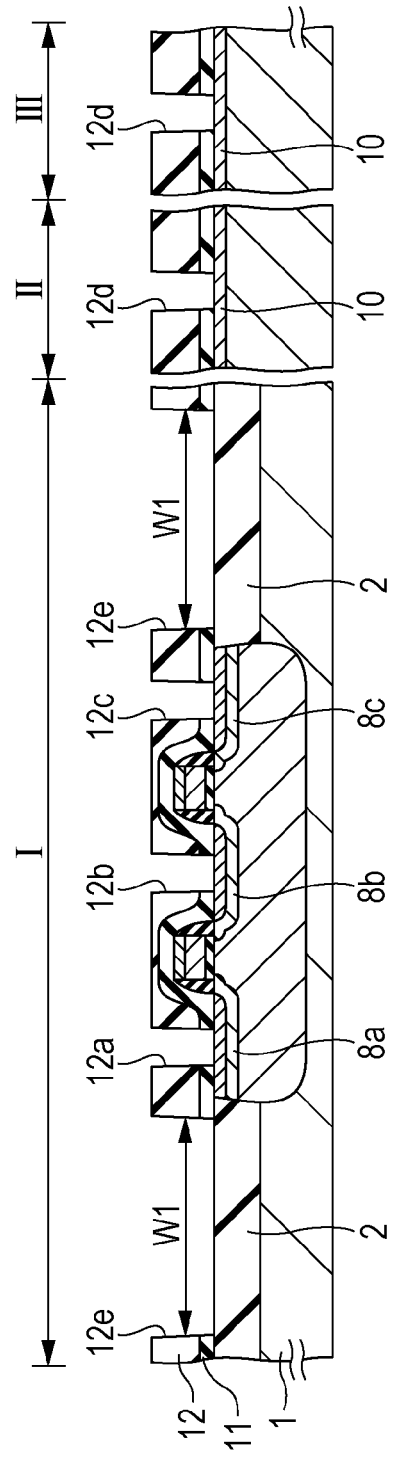

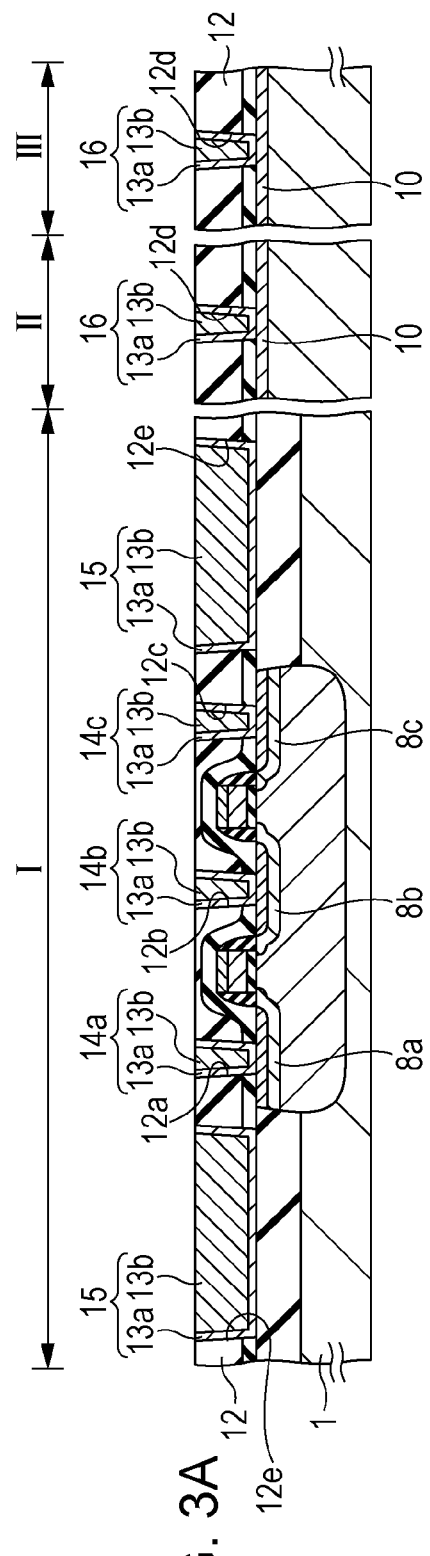
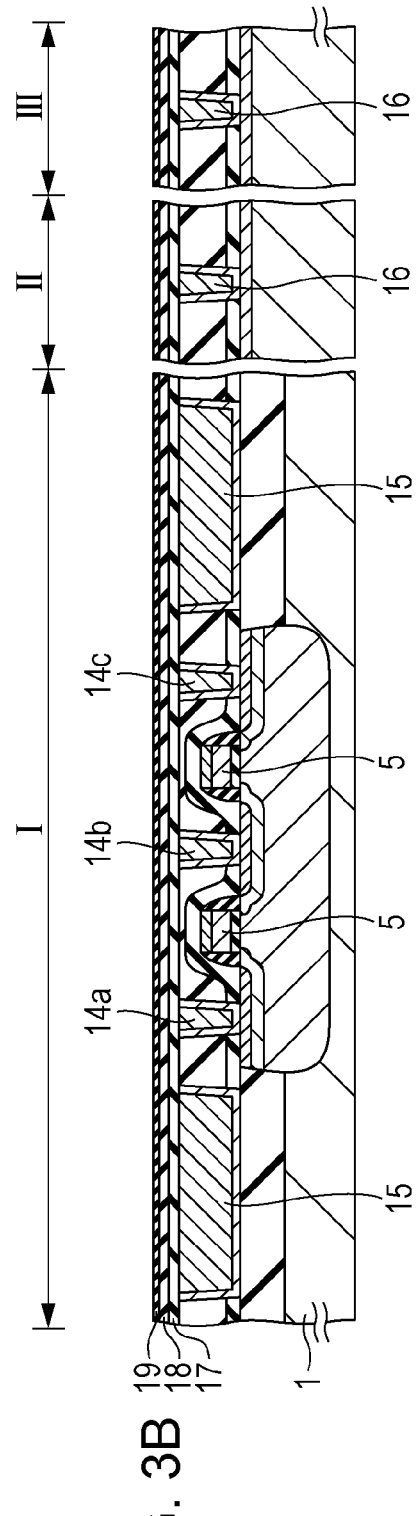
FIG. 3A
FIG. 3B

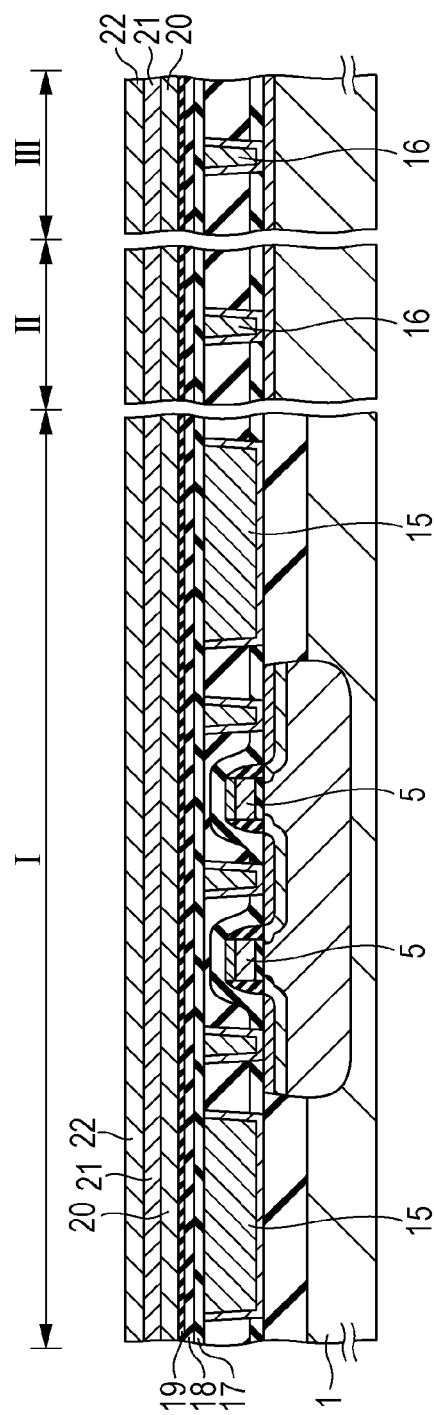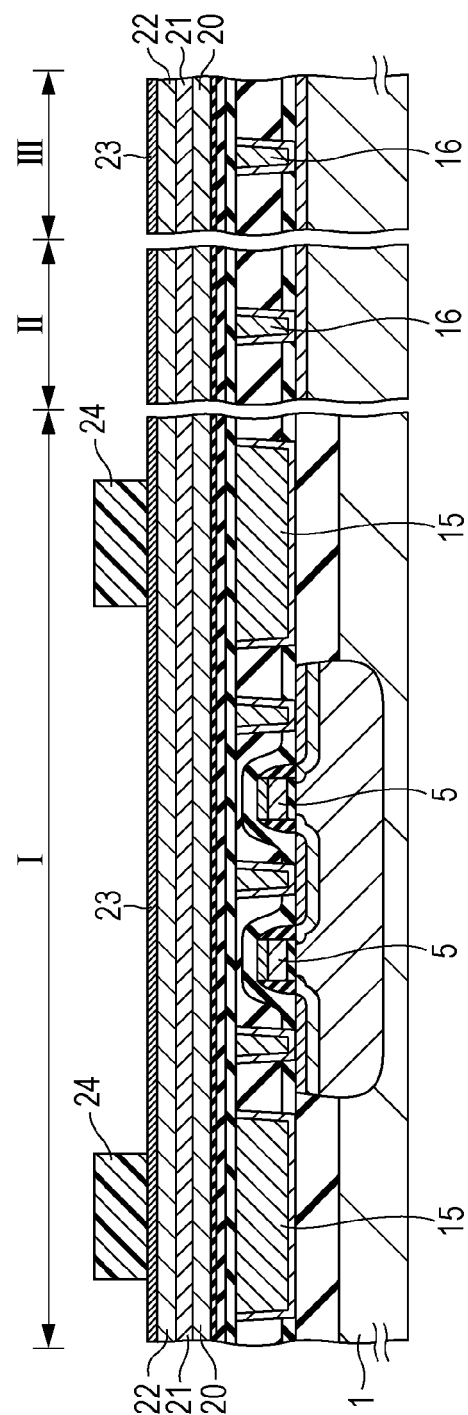

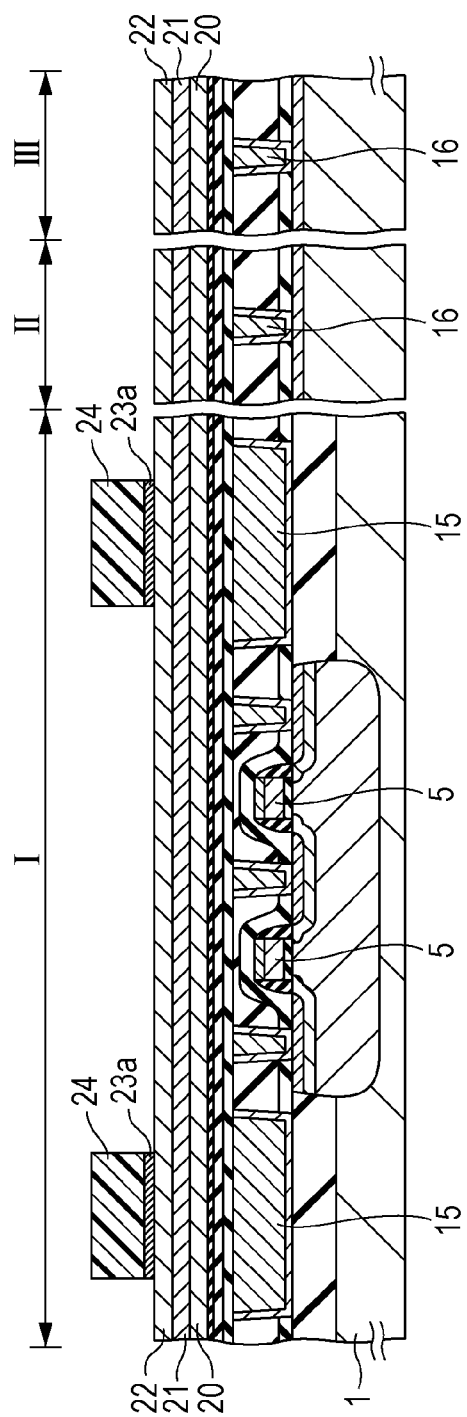
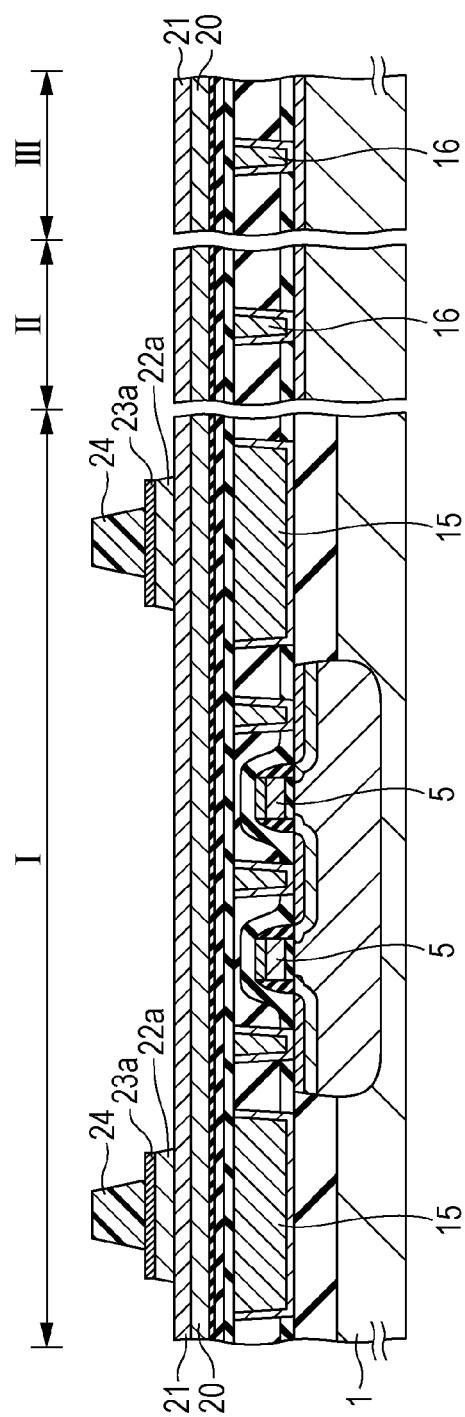

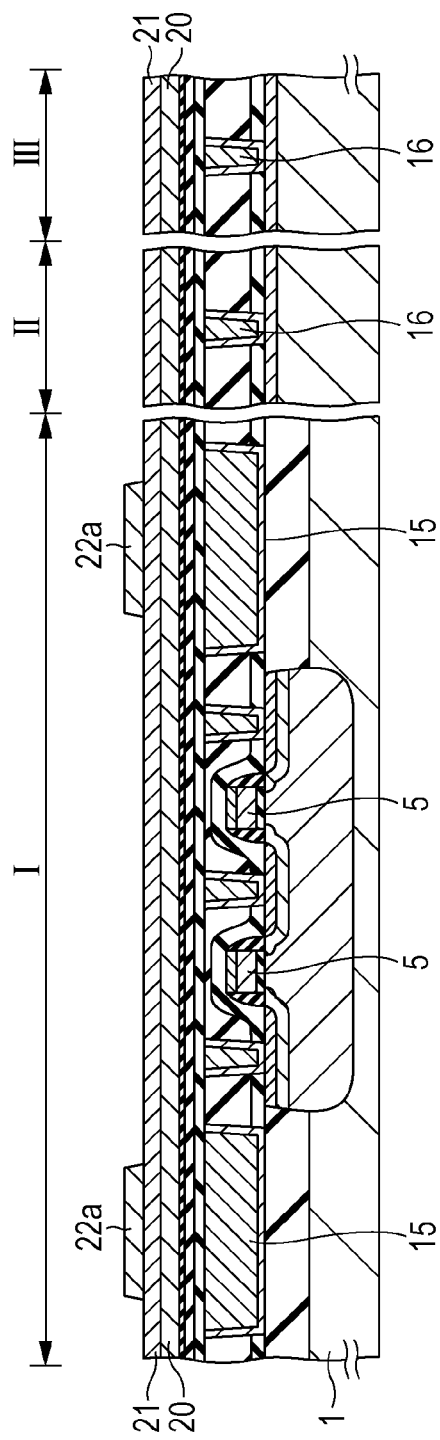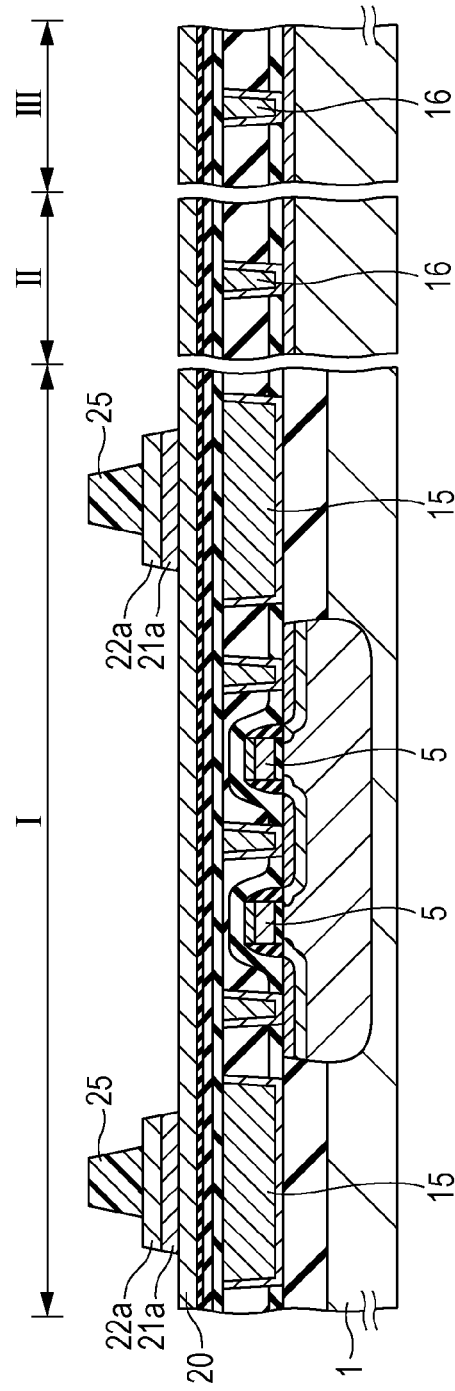

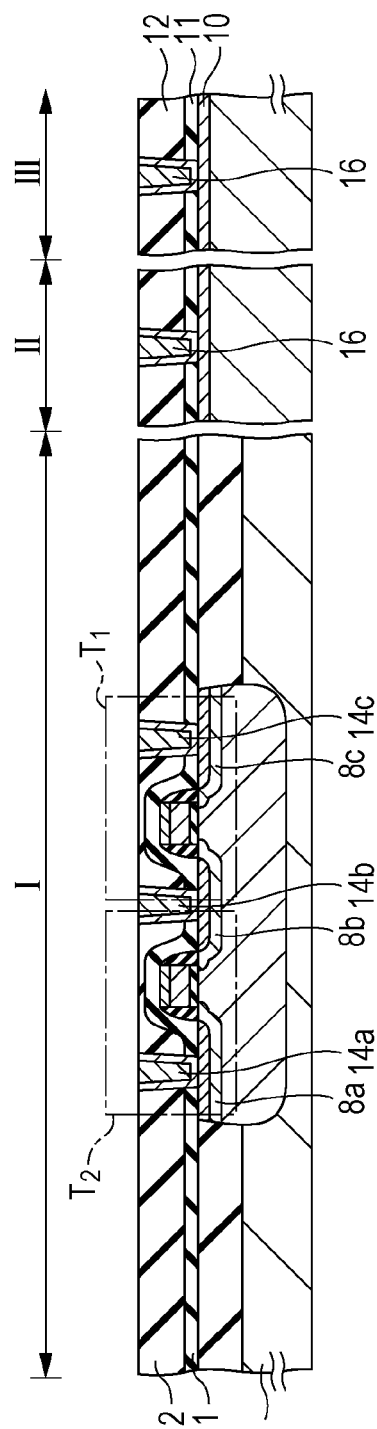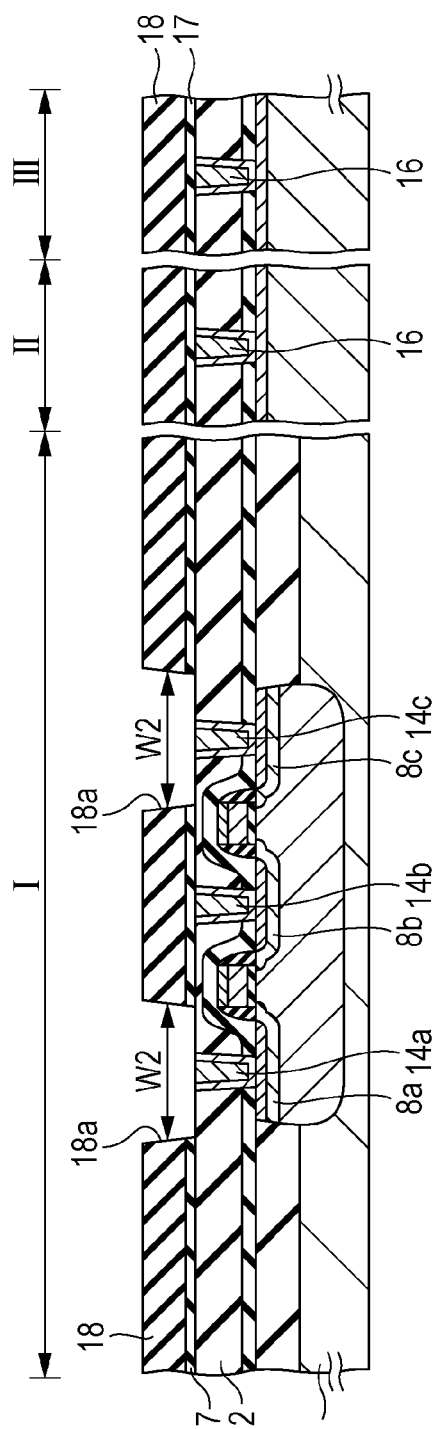

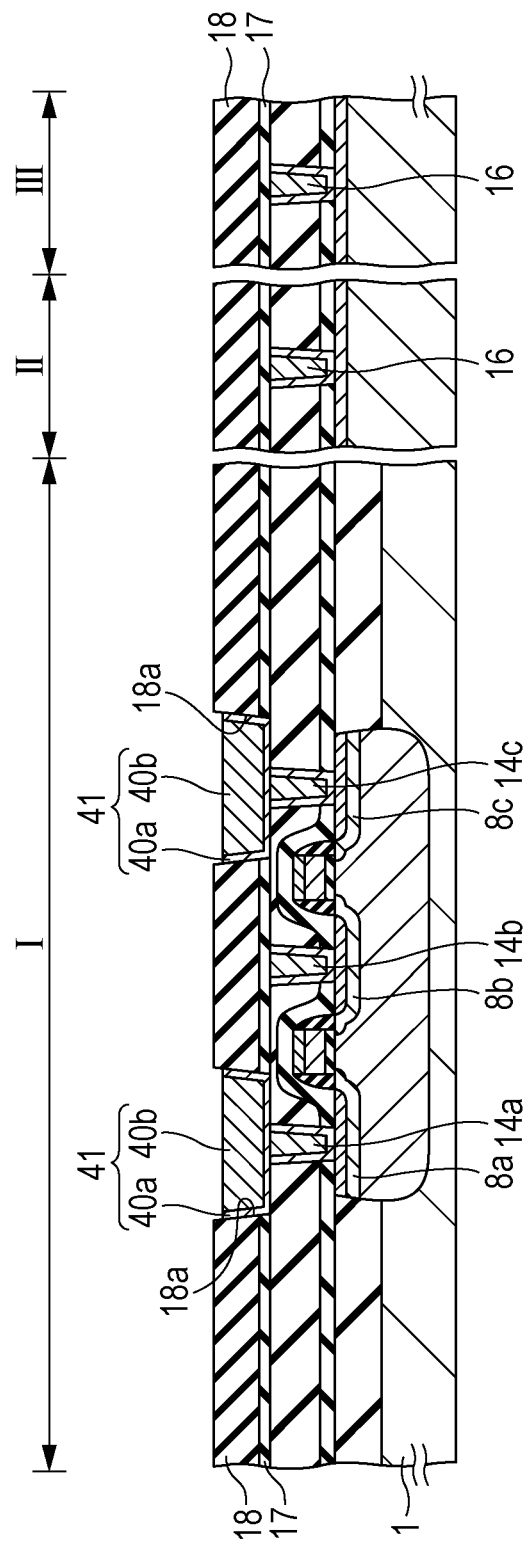

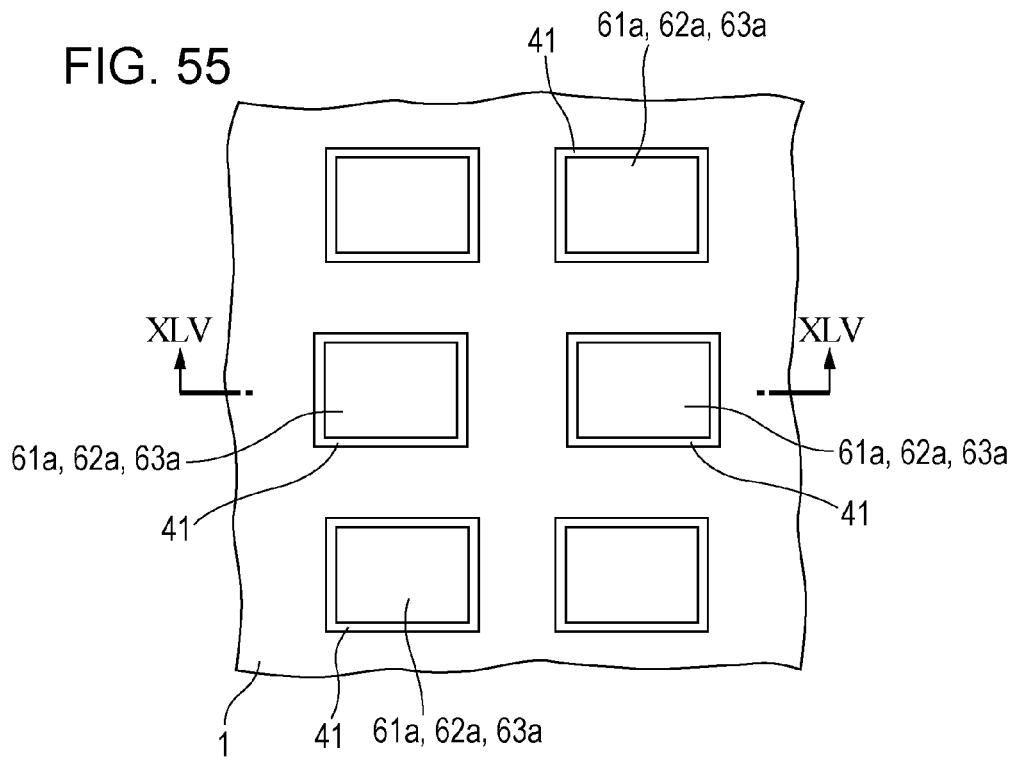
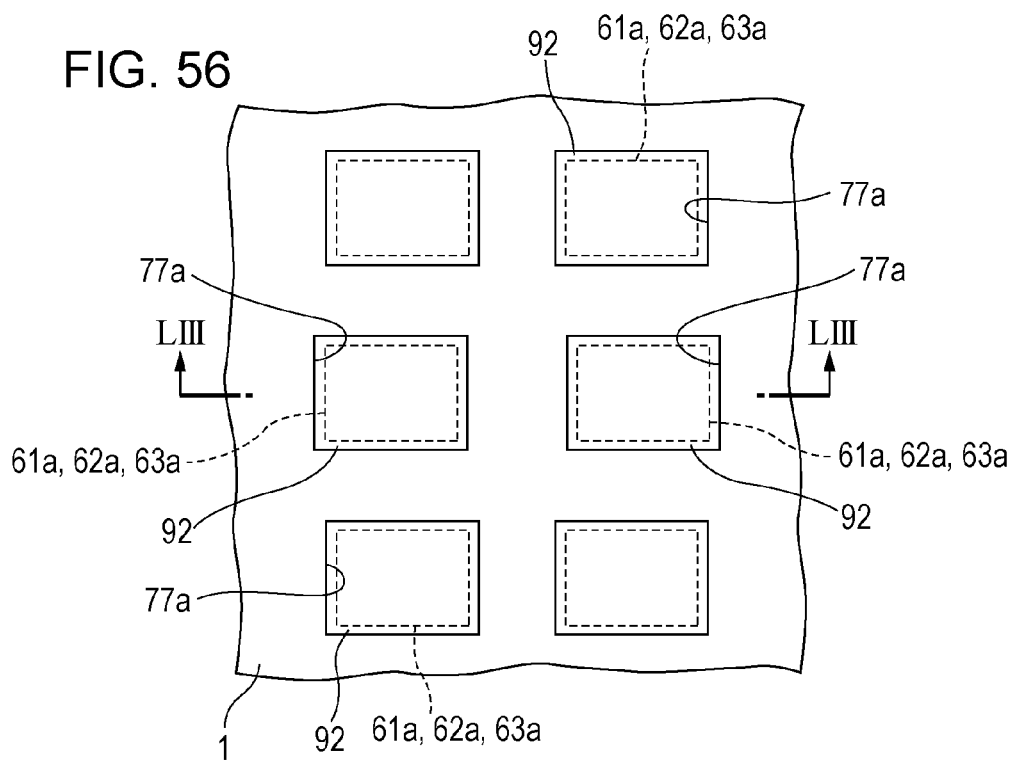

SEMICONDUCTOR DEVICE AND METHOD FOR PRODUCING THE SAME

CROSS-REFERENCE TO RELATED APPLICATION

This application is based upon and claims the benefit of priority of the prior Japanese Patent Application No. 2011-287732, filed on Dec. 28, 2011, the entire contents of which are incorporated herein by reference.

FIELD

The embodiments discussed herein are related to a semiconductor device and a method for producing the same.

BACKGROUND

Various types of semiconductor devices such as electrically erasable programmable read-only memories (EEPROMs) and ferroelectric random access memories (FeRAMs) are known as semiconductor devices from which data does not disappear even after a power supply is stopped.

Among such semiconductor devices, EEPROMs store data by storing charge in a floating gate, and are widely used in the form of a flash memory. However, when EEPROMs are irradiated with radiation, the charge in the floating gate easily flows to the outside, and thus EEPROMs have low radiation resistance.

On the other hand, FeRAMs store data not by utilizing stored charge but by making the direction of polarization of a ferroelectric film correspond to "0" or "1". Accordingly, FeRAMs have higher resistance to radiation than the EEPROMs do.

In the medical field, high-energy gamma rays are used for sterilizing medical appliances. Furthermore, devices used in nuclear power plants or outer space are also exposed to radiation having high energy, such as an electron beam or a neutron beam.

By further enhancing the radiation resistance of FeRAMs, products that may be used under such high-energy radiation may be provided, and furthermore, a new market of FeRAMs may be developed.

For example, Japanese Laid-open Patent Publication No. 05-343617 discloses a semiconductor memory device.

SUMMARY

According to an aspect of the invention, an apparatus includes a semiconductor device includes a semiconductor substrate; a first insulating film that is formed over the semiconductor substrate; a capacitor that is formed over the first insulating film and is formed by sequentially stacking a lower electrode, a capacitor dielectric film, and an upper electrode; a second insulating film that is formed over the capacitor and has a hole including the entire region of the upper electrode in plan view; and a conductor plug that is formed in the hole and contains tungsten.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 1 is an enlarged plan view of a silicon substrate on which a semiconductor device according to a first embodiment is to be formed;

FIGS. 2A and 2B are cross-sectional views (part 1) illustrating a process of producing a semiconductor device according to the first embodiment;

FIGS. 3A and 3B are cross-sectional views (part 2) illustrating a process of producing a semiconductor device according to the first embodiment;

FIGS. 4A and 4B are cross-sectional views (part 3) illustrating a process of producing a semiconductor device according to the first embodiment;

FIGS. 5A and 5B are cross-sectional views (part 4) illustrating a process of producing a semiconductor device according to the first embodiment;

FIGS. 6A and 6B are cross-sectional views (part 5) illustrating a process of producing a semiconductor device according to the first embodiment;

FIGS. 32A and 32B are cross-sectional views (part 1) illustrating a process of producing a semiconductor device according to a third embodiment;

FIG. 33 is a cross-sectional view (part 2) illustrating a process of producing a semiconductor device according to the third embodiment;

FIG. 55 is a plan view (part 1) illustrating a process of producing a semiconductor device according to the third embodiment;

FIG. 56 is a plan view (part 2) illustrating a process of producing a semiconductor device according to the third embodiment;

DESCRIPTION OF EMBODIMENTS

First Embodiment

Figure 7A:
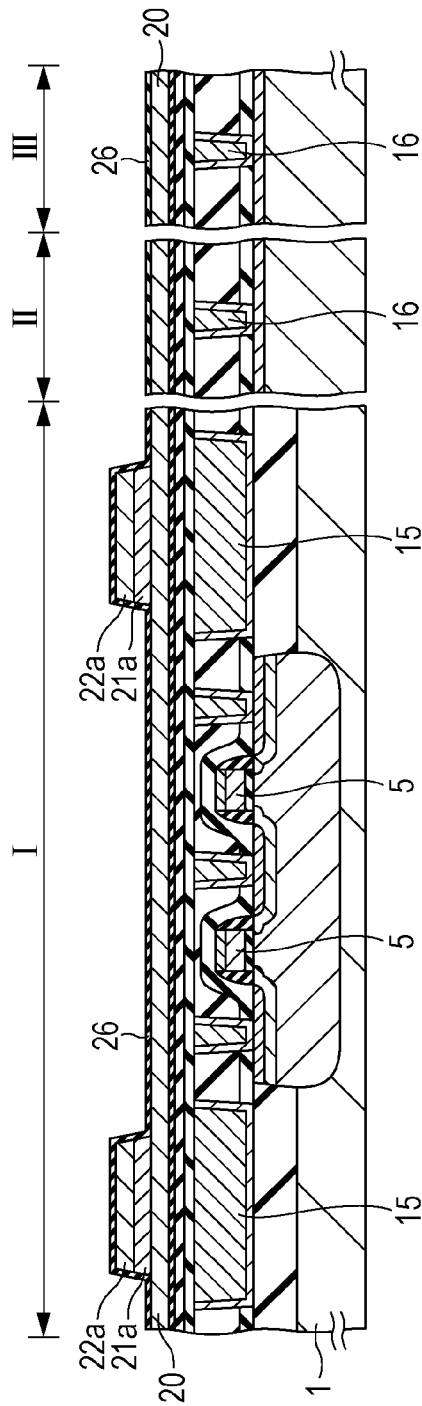
FIGS. 7A and 7B are cross-sectional views (part 6) illustrating a process of producing a semiconductor device according to the first embodiment.

As described above, semiconductor devices that are used in the medical field, nuclear power plants, or outer space are exposed to high-energy gamma rays. It is believed that when a semiconductor device withstand gamma rays having a very high energy of about 100 kGy, the semiconductor device may be used in most fields in which gamma rays are used, though it depends on the operating conditions of the semiconductor device.

A semiconductor device having such an improved resistance to high-energy radiation will now be described together with a description of a process of producing the semiconductor device.

FIG. 1 is an enlarged plan view of a silicon substrate 1 on which a semiconductor device according to a first embodiment is to be formed.

This semiconductor device is a planar FeRAM. A chip region C, which is a unit of individual separation in dicing, is defined in the silicon substrate 1. A cell region I where ferroelectric capacitors of the FeRAM are to be formed is provided inside the chip region C.

A logic region IV is provided in the chip region C located outside the cell region I. In the logic region IV, a logic circuit for controlling input data to and output data from the ferroelectric capacitors in the cell region I is to be formed.

A method for producing this semiconductor device will now be described with reference to cross-sectional views of the cell region I, a cell peripheral portion II, which is a peripheral portion of the cell region I, and a chip peripheral portion III, which is a peripheral portion of the chip region C. The cell peripheral portion II will be described with reference to a cross-sectional view taken along line A-A, and the chip peripheral portion III will be described with reference to a cross-sectional view taken along line B-B.

FIGS. 2A to 14 are cross-sectional views each illustrating a process of producing a semiconductor device according to the first embodiment.

First, a process of forming the cross-sectional structure illustrated in FIG. 2A will be described.

First, a trench for element isolation is formed on a surface of a p-type silicon substrate 1, and a silicon oxide film is embedded as an element isolation insulating film 2 in the trench. This element isolation structure is referred to as shallow trench isolation (STI). The element isolation structure is not limited to the STI, alternatively, element isolation may be performed by a local oxidation of silicon (LOCOS) method.

The silicon substrate 1 is an example of a semiconductor substrate, and the conductivity type of the silicon substrate 1 may be an n-type.

Next, a p-well 3 is formed by introducing an impurity in an active region of the silicon substrate 1. A thermally oxidized film functioning as a gate insulating film 4 is then formed by thermally oxidizing the surface of the active region.

Subsequently, an amorphous or polycrystalline silicon film is formed over the entire upper surface of the silicon substrate 1. The silicon film is patterned by photolithography to form two gate electrodes 5 on the p-well 3.

The two gate electrodes 5 each form a part of a word line, and are arranged in parallel with a space therebetween.

Next, an n-type impurity is introduced in the p-well 3 on both sides of the gate electrodes 5 by ion implantation using the gate electrodes 5 as a mask to form first to third n-type extension regions 7a to 7c.

An insulating film is then formed on the silicon substrate 1 and the gate electrodes 5. The insulating film is etched back and left as an insulating side wall 9 on the side faces of the gate electrodes 5. A silicon oxide film is formed as the insulating film by a chemical vapor deposition (CVD) method, for example.

Subsequently, an n-type impurity is introduced in the p-well 3 by ion implantation using the insulating side wall 9 and the gate electrodes 5 as a mask. As a result, an n-type source/drain region is formed, on both sides of the gate electrodes 5, as first to third n-type impurity diffusion regions 8a to 8c that respectively overlap with the first to third n-type extension regions 7a to 7c.

Through the above process, basic structures of a first NMOS transistor $T_1$ and a second NMOS transistor $T_2$ are formed. The first NMOS transistor $T_1$ includes the first and second n-type impurity diffusion regions 8a and 8b and one of the gate electrodes 5. The second NMOS transistor $T_2$ includes the second and third n-type impurity diffusion regions 8b and 8c and the other gate electrode 5.

Subsequently, a metal film such as a cobalt film is formed over the entire upper surface of the silicon substrate 1 by a sputtering method. The metal film is then heated to react with silicon to form a silicide layer 10 on the surfaces of the gate electrodes 5 and the surfaces of the first to third n-type impurity diffusion regions 8a to 8c. The metal film remaining on the element isolation insulating film 2 etc. is then removed by wet etching.

Next, as illustrated in FIG. 2B, as a cover insulating film 11 that covers the first NMOS transistor $T_1$ and the second NMOS transistor $T_2$, for example, a silicon oxynitride (SiON) film is formed by a plasma CVD method so as to have a thickness of about 200 nm.

Furthermore, a first insulating film 12 is formed on the cover insulating film 11. For example, a silicon oxide film is formed as the first insulating film 12 by a plasma CVD method using tetraethoxysilane (TEOS) gas so as to have a thickness of about 1 μm.

Subsequently, the upper surface of the first insulating film 12 is polished by a chemical mechanical polishing (CMP) method to planarize the upper surface. As a result, the thickness of the first insulating film 12 becomes about 700 nm on the planarized surface of the silicon substrate 1.

Next, the cover insulating film 11 and the first insulating film 12 are patterned by photolithography.

Consequently, in the cell region I, first to third contact holes 12a to 12c each having a diameter of about 0.25 μm are formed on the first to third n-type impurity diffusion regions 8a to 8c, respectively.

Openings 12e are formed on the element isolation insulating film 2 in the cell region I. A fourth contact hole 12d is formed in each of the cell peripheral portion II and the chip peripheral portion III.

A width W1 of each of the openings 12e is preferably larger than a width of a lower electrode of a ferroelectric capacitor described below. In the first embodiment, the width W1 is about 1.7 μm.

Next, a process of forming the cross-sectional structure illustrated in FIG. 3A will be described.

First, a titanium (Ti) film having a thickness of 30 nm and a titanium nitride (TiN) film having a thickness of 20 nm are sequentially formed as an adhesion film 13a on the inner surfaces of the first to fourth contact holes 12a to 12d and the inner surfaces of the openings 12e. Subsequently, a tungsten film 13b is formed on the adhesion film 13a by a CVD method. Thus, the first to fourth contact holes 12a to 12d and the openings 12e are filled with the tungsten film 13b.

Subsequently, unwanted portions of the tungsten film 13b and the adhesion film 13a on the upper surface of the first insulating film 12 are removed by a CMP method.

Thus, the tungsten film 13b and the adhesion film 13a that are left in each of the first to third contact holes 12a to 12c function as first to third contact plugs 14a to 14c that are electrically connected to the n-type impurity diffusion regions 8a to 8c, respectively.

The tungsten film 13b and the adhesion film 13a that are left in each of the openings 12e in the cell region I function as a conductor 15. The tungsten film 13b and the adhesion film 13a that are left in each of the fourth contact holes 12d in the cell peripheral portion II and the chip peripheral portion III function as a lower ring 16.

Figure 15:
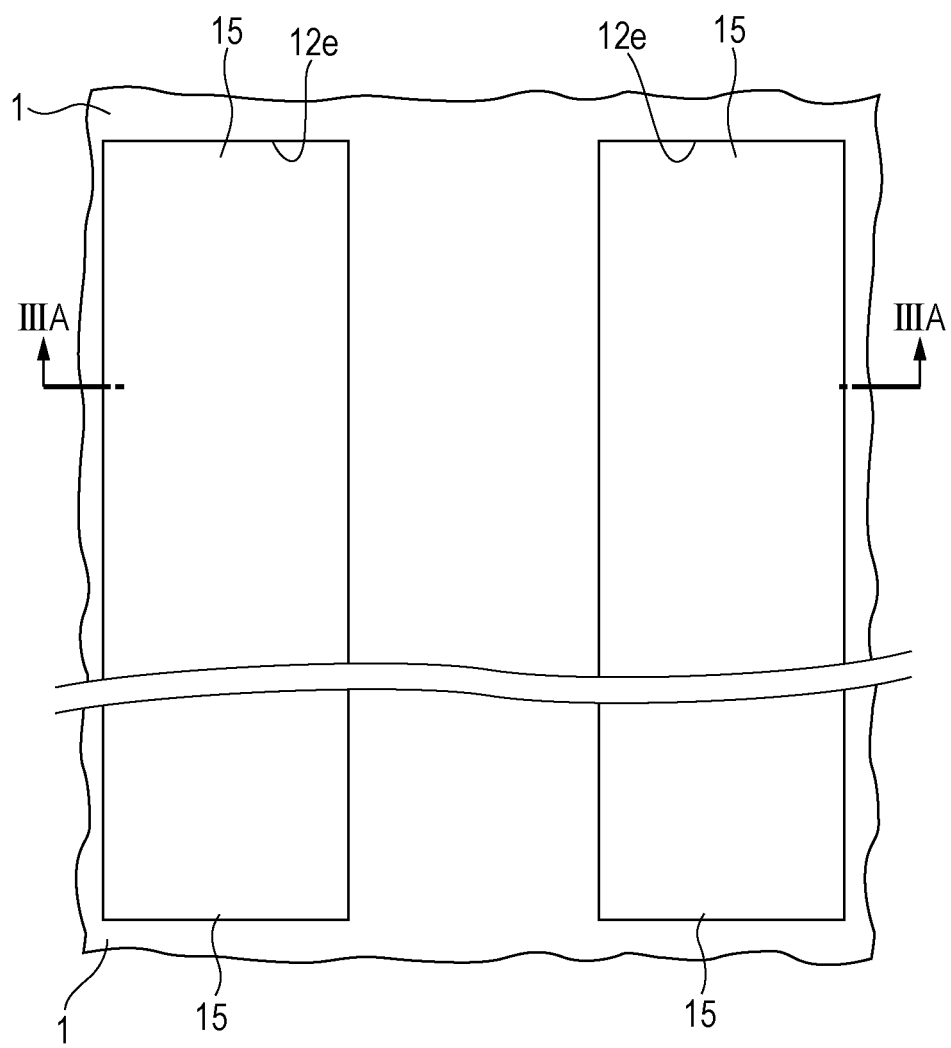
FIG. 15 is an enlarged plan view (part 1) of a cell region in a process of producing a semiconductor device according to the first embodiment.

FIG. 15 is an enlarged plan view of the cell region I after the process of forming the cross-sectional structure illustrated in FIG. 3A is completed. FIG. 3A corresponds to a cross-sectional view taken along line IIIA-IIIA in FIG. 15.

In FIG. 15, the gate electrodes 5 and the first to third contact plugs 14a to 14c are omitted. Similarly, the gate electrodes 5 and the first to third contact plugs 14a to 14c are omitted in FIGS. 16 to 18 described below.

As illustrated in FIG. 15, the conductor 15 and the opening 12e that defines the outline of the conductor 15 have a stripe shape in plan view.

Subsequently, as illustrated in FIG. 3B, a silicon oxynitride film is formed as a first antioxidation insulating film 17 on the first to third contact plugs 14a to 14c, the conductors 15, the lower rings 16, and the first insulating film 12 by a plasma CVD method so as to have a thickness of about 100 nm.

Silicon oxynitride contained in the first antioxidation insulating film 17 has a good capability of suppressing permeation of oxygen. Thus, the first antioxidation insulating film 17 has a function of suppressing oxidation of the tungsten film 13b of the conductor 15 by oxygen.

Furthermore, a silicon oxide film is formed on the first antioxidation insulating film 17. The silicon oxide film functions as a first interlayer insulating film 18. The conditions for depositing the first interlayer insulating film 18 are not particularly limited. In the first embodiment, the first interlayer insulating film 18 is formed so as to have a thickness of about 130 nm by a plasma CVD method using TEOS gas.

Subsequently, an alumina film is formed as a second antioxidation insulating film 19 on the first interlayer insulating film 18 by a sputtering method. In the sputtering method, argon gas is used as a sputtering gas, the pressure in the sputtering atmosphere is 1 Pa, and the substrate temperature is 25° C. to 35° C., for example.

In order to enhance the orientation of a lower electrode of a capacitor described below, the second antioxidation insulating film 19 may be annealed after the deposition of the second antioxidation insulating film 19. For example, this annealing is conducted in an oxygen-containing atmosphere for one minute at a substrate temperature of 642° C.

Next, a process of forming the cross-sectional structure illustrated in FIG. 4A will be described.

First, a platinum film is formed as a first conductive film 20 on the second antioxidation insulating film 19 by a sputtering method so as to have a thickness of about 100 nm.

The conditions for depositing the first conductive film 20 are not particularly limited. In the first embodiment, the first conductive film 20 is formed using argon gas as a sputtering gas, at a pressure in the sputtering atmosphere of 1 Pa, at a substrate temperature of 350° C., and a sputtering power of 0.4 kW.

The first conductive film 20 may be a single-layer film such as an iridium film, a ruthenium film, a ruthenium oxide film, or a strontium ruthenium oxide (SRO) film. Alternatively, the first conductive film 20 may be a stacked film of these films.

Subsequently, in order to improve the crystal quality of the first conductive film 20, rapid thermal anneal (RTA) is performed in an atmosphere of an inert gas such as argon gas at a substrate temperature of 650° C. to 750° C. for 60 seconds. This annealing may improve the crystal quality of platinum of the first conductive film 20 and increase the adhesion between the second antioxidation insulating film 19 and the first conductive film 20.

Next, a lead zirconate titanate (PZT) film is formed as a ferroelectric film 21 on the first conductive film 20. The PZT film is formed as two layers of a fast and a second PZT films through two step processes.

In a first step, the amorphous first PZT film is formed on the first conductive film 20 by an RF sputtering method so as to have a thickness of about 90 nm. The first PZT film is crystallized by being subjected to RTA in an oxygen-containing atmosphere at a substrate temperature of 600° C. for 90 seconds. Such annealing for the purpose of crystallization is referred to as "crystallization annealing".

A sol-gel method or a metal-organic chemical vapor deposition (MOCVD) method may also be employed as the method for forming the PZT film. In the case where the MOCVD method is employed, crystallization annealing may not be performed.

Furthermore, the second PZT film is formed on the first PZT film by an RF sputtering method so as to have a thickness of about 10 to 30 nm.

Any of calcium (Ca), strontium (Sr), lanthanum (La), niobium (Nb), tantalum (Ta), iridium (Ir), and tungsten (W) may be added to each of the first PZT film and the second PZT film. Instead of PZT, a bismuth layer-structured compound such as $SrBi_2Ta_2O_9$, $SrBi_4Ti_4O_{15}$, $(Bi,La)_4Ti_3O_{12}$, or $BiFeO_3$ may be used as the material of the ferroelectric film 21.

Next, an iridium oxide film having a two-layer structure is formed on the ferroelectric film 21. The iridium oxide film functions as a second conductive film 22. Iridium oxide has a good capability of suppressing hydrogen diffusion, and thus may suppress the degradation of the ferroelectric film 21 due to reduction by hydrogen in the outside atmosphere. Thus, iridium oxide is suitable for the material of the second conductive film 22.

In the iridium oxide film having the two-layer structure, a first iridium oxide film is formed so as to have a thickness of about 25 nm by a sputtering method in which an iridium target is used while using, as a sputtering gas, a mixed gas containing argon gas and oxygen gas. As for the conditions for depositing the first iridium oxide film, for example, a pressure of 2 Pa, a substrate temperature of 300° C., and a sputtering power of 1 to 2 kW are used. In this case, the ratio of the flow rate of argon gas to the flow rate of oxygen gas is, for example, 100:56. Under this condition, the first iridium oxide film is crystallized at the time of the deposition.

The first iridium oxide film formed as described above is subjected to RTA in an oxygen-containing atmosphere, thereby crystallizing PZT in the ferroelectric film 21 and compensating for oxygen deficiency of the PZT.

The conditions for this RTA are not particularly limited. In the first embodiment, the ratio of the flow rate of argon gas to the flow rate of oxygen gas is 100:1, and the resulting mixed gas is supplied to the annealing atmosphere. This annealing is conducted at a substrate temperature of 725° C. for 60 seconds.

This annealing is also advantageous in that the first iridium oxide film is recovered from plasma damage.

Next, a second iridium oxide film is formed on the first iridium oxide film by a sputtering method so as to have a thickness of 50 to 150 nm. As for the conditions for depositing the second iridium oxide film, for example, a pressure of 0.8 Pa, a sputtering power of 1.0 kW, and a deposition time of 45 seconds may be used.

As a sputtering gas, argon gas and oxygen gas may be used at a ratio of the flow rate of argon gas to the flow rate of oxygen gas of 100:1.

In order to suppress abnormal growth of the second iridium oxide film, it is preferable to control the substrate temperature during deposition to 100° C. or lower.

Subsequently, PZT deposited on the reverse face of the silicon substrate 1 is removed by washing.

Subsequently, as illustrated in FIG. 4B, a titanium nitride film is formed as a mask material film 23 on the second conductive film 22 by a sputtering method so as to have a thickness of about 20 to 50 nm.

Next, a photoresist is applied onto the mask material film 23. The photoresist is then exposed and developed to form a first resist pattern 24 for an upper electrode.

Next, as illustrated in FIG. 5A, portions of the mask material film 23, the portions not being covered with the first resist pattern 24, are dry-etched so that the mask material film 23 that is not etched but left forms a hard mask 23a.

A mixed gas of chlorine gas and argon gas is used as an etching gas in the dry etching, and is introduced into the etching atmosphere at a flow rate of chlorine gas of 80 sccm and a flow rate of argon gas of 80 sccm. In the dry etching, the pressure in the etching atmosphere is set to 0.7 Pa, and a high-frequency power with a source power of 800 W at a frequency of 13.56 MHz and a low-frequency power with a bias power of 100 W at a frequency of 450 kHz are applied to the etching atmosphere.

Next, as illustrated in FIG. 5B, portions of the second conductive film 22, the portions not being covered with the hard mask 23a, are dry-etched to form upper electrodes 22a.

The conditions for this dry etching are not particularly limited. In the first embodiment, the dry etching is performed using a mixed gas of chlorine gas and argon gas as an etching gas.

In this dry etching, the first resist pattern 24 is also etched and side faces of the first resist pattern 24 recede, and thus side faces of the hard mask 23a also slightly recede. Consequently, side faces of the upper electrode 22a form a tapered shape.

Subsequently, as illustrated in FIG. 6A, the first resist pattern 24 is removed, and the hard mask 23a is removed by dry etching or wet etching.

Next, as illustrated in FIG. 6B, a photoresist is applied over the entire upper surface of the silicon substrate 1. The photoresist is then exposed and developed to form a second resist pattern 25.

Next, the ferroelectric film 21 is dry-etched using the second resist pattern 25 as a mask to form a capacitor dielectric film 21a. An example of an etching gas used in this dry etching is a mixed gas of $Cl_2$ gas and $BCl_2$ gas.

In this dry etching, the second resist pattern 25 is also etched and side faces of the second resist pattern 25 recede, and thus side faces of the upper electrode 22a also slightly recede. Consequently, side faces of the capacitor dielectric film 21a form a tapered shape.

The second resist pattern 25 is then removed.

Subsequently, as illustrated in FIG. 7A, an alumina film is formed as a first protective insulating film 26 on the capacitor dielectric film 21a, the upper electrodes 22a, and the first conductive film 20 by a sputtering method so as to have a thickness of about 50 nm.

Alumina, which is the material of the first protective insulating film 26, has a good capability of suppressing permeation of hydrogen. Thus, the first protective insulating film 26 has a function of suppressing the degradation of the capacitor dielectric film 21a due to reduction by hydrogen in the outside atmosphere.

Figure 7B:
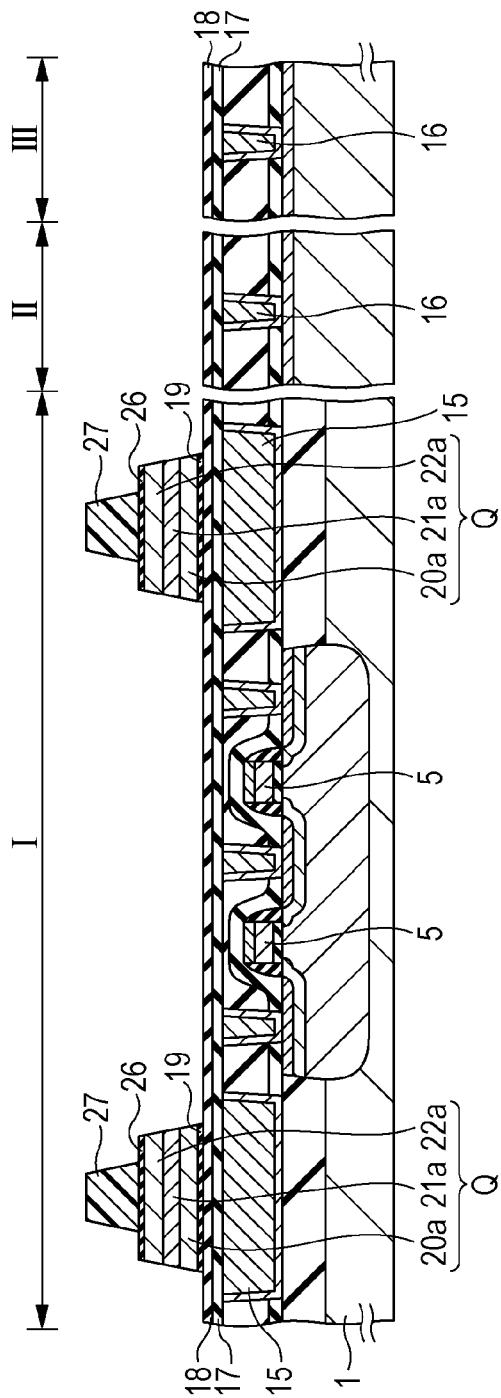

Next, as illustrated in FIG. 7B, a photoresist is applied over the entire upper surface of the silicon substrate 1. The photoresist is then exposed and developed to form a third resist pattern 27.

Subsequently, the first conductive film 20 is dry-etched using the third resist pattern 27 as a mask while using a mixed gas of $Cl_2$ gas, $BCl_3$ gas, and HBr gas as an etching gas to form lower electrodes 20a.

In this dry etching, portions of the first protective insulating film 26, the portions being located on side faces of the capacitor dielectric film 21a and the upper electrode 22a, are also removed, and portions of the second antioxidation insulating film 19, the portions not being covered with the lower electrode 20a, are also removed.

Furthermore, the third resist pattern 27 is also dry-etched and side faces of the third resist pattern 27 recede, and thus side faces of the capacitor dielectric film 21a also slightly recede. Consequently, side faces of the lower electrode 20a form a tapered shape.

Through the above process, ferroelectric capacitors Q each formed by stacking the lower electrode 20a, the capacitor dielectric film 21a, and the upper electrode 22a in that order are formed in the cell region I of the silicon substrate 1. The third resist pattern 27 is then removed.

Figure 16:
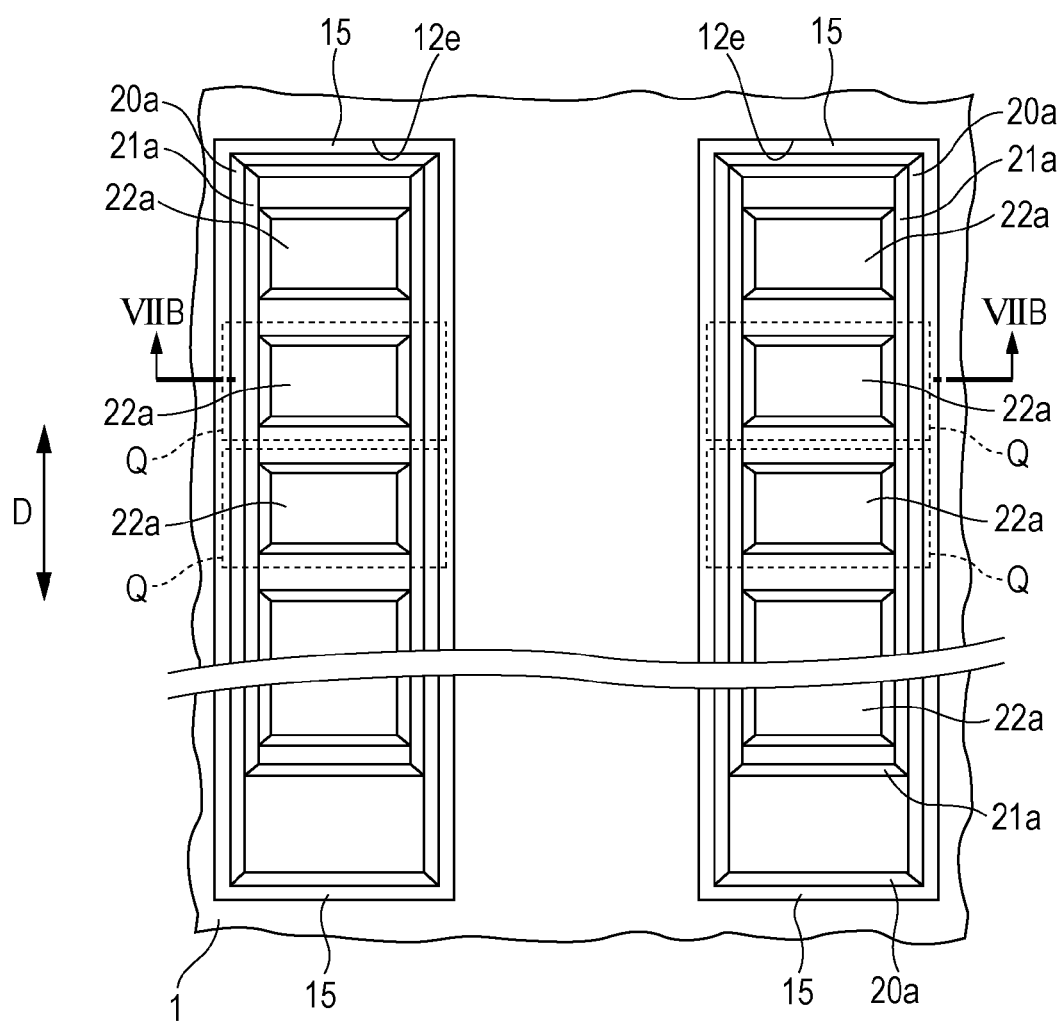
FIG. 16 is an enlarged plan view (part 2) of the cell region in a process of producing a semiconductor device according to the first embodiment.

FIG. 16 is an enlarged plan view of the cell region I after the above process is completed. FIG. 7B corresponds to a cross-sectional view taken along line VIIB-VIIB in FIG. 16.

As illustrated in FIG. 16, each of the lower electrode 20a and the capacitor dielectric film 21a has a stripe shape extending in a word line direction D in plan view.

A plurality of upper electrodes 22a are arranged on the capacitor dielectric film 21a at intervals. A plurality of ferroelectric capacitors Q are formed so as to correspond to the respective upper electrodes 22a.

The conductor 15 and the opening 12e that are located below each of the ferroelectric capacitors Q are formed so as to have a size that includes the entire region of the lower electrode 20a inside thereof in plan view.

Figure 8:
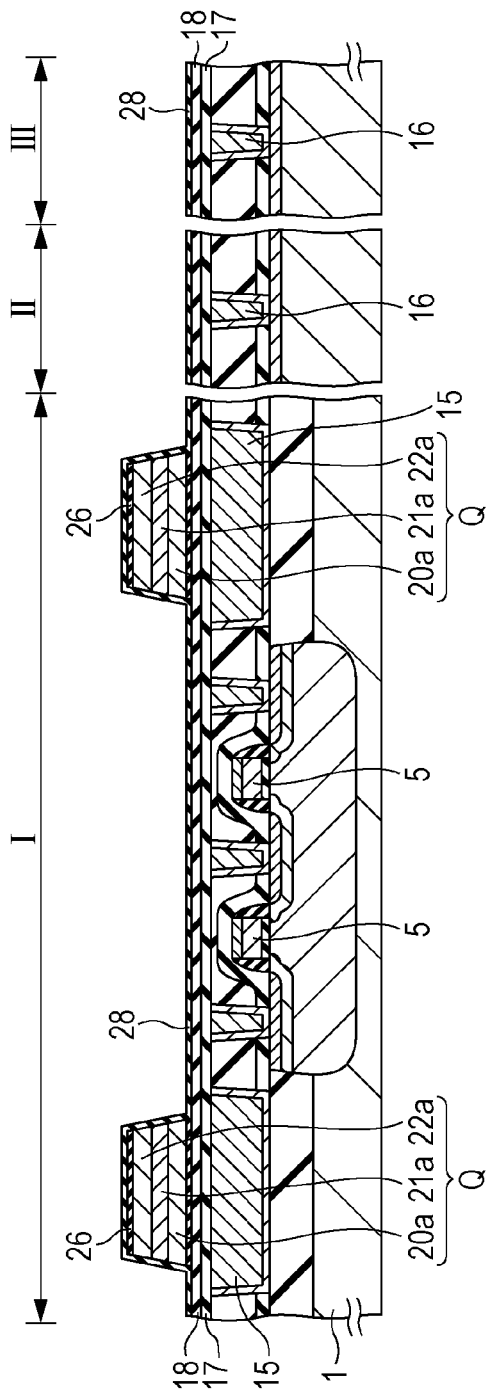
FIG. 8 is a cross-sectional view (part 7) illustrating a process of producing a semiconductor device according to the first embodiment.

Subsequently, as illustrated in FIG. 8, an alumina film is formed as a second protective insulating film 28 on the ferroelectric capacitors Q and the first interlayer insulating film 18 by a sputtering method. The second protective insulating film 28 protects the capacitor dielectric film 21a from a reducing substance such as hydrogen.

The ferroelectric capacitors Q are then annealed in an oxygen-containing atmosphere so that the capacitor dielectric film 21a recovers from damage sustained in the above process. This annealing is referred to as "recovery annealing". The conditions for the recovery annealing are not particularly limited.

In the first embodiment, the recovery annealing is conducted in a furnace (not illustrated) in an oxygen atmosphere at a substrate temperature of 550° C. to 700° C. for 60 minutes.

Figure 9:
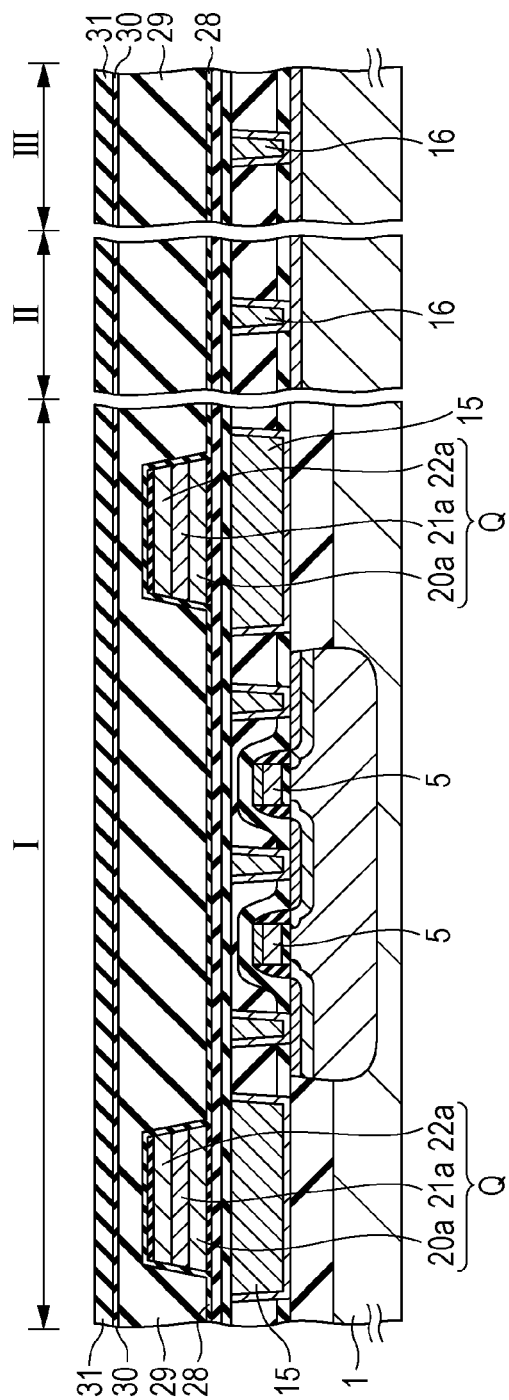
FIG. 9 is a cross-sectional view (part 8) illustrating a process of producing a semiconductor device according to the first embodiment.

Next, a process of forming the cross-sectional structure illustrated in FIG. 9 will be described.

First, a silicon oxide film is formed as a second insulating film 29 on the second protective insulating film 28 by a plasma CVD method so as to have a thickness of about 1,400 nm. For example, a mixed gas of TEOS gas, oxygen gas, and helium gas may be used as a deposition gas in the plasma CVD method.

The surface of the second insulating film 29 is planarized by a CMP method, and the second insulating film 29 is then annealed in a plasma atmosphere of nitrous oxide ($N_2O$) gas or nitrogen gas. Thus, the second insulating film 29 is dehydrated, and the surface of the second insulating film 29 is nitrided to suppress readsorption of moisture.

Next, an alumina film is formed on the second insulating film 29 by a sputtering method so as to have a thickness of about 20 to 100 nm. The alumina film functions as a third protective insulating film 30. Similarly to the second protective insulating film 28, the third protective insulating film 30 has a function of protecting the capacitor dielectric film 21a from a reducing substance such as hydrogen. The third protective insulating film 30 may be formed by a CVD method instead of the sputtering method.

A silicon oxide film is formed as a second interlayer insulating film 31 on the third protective insulating film 30 by a plasma CVD method using TEOS gas so as to have a thickness of about 300 to 500 nm.

Figure 10:
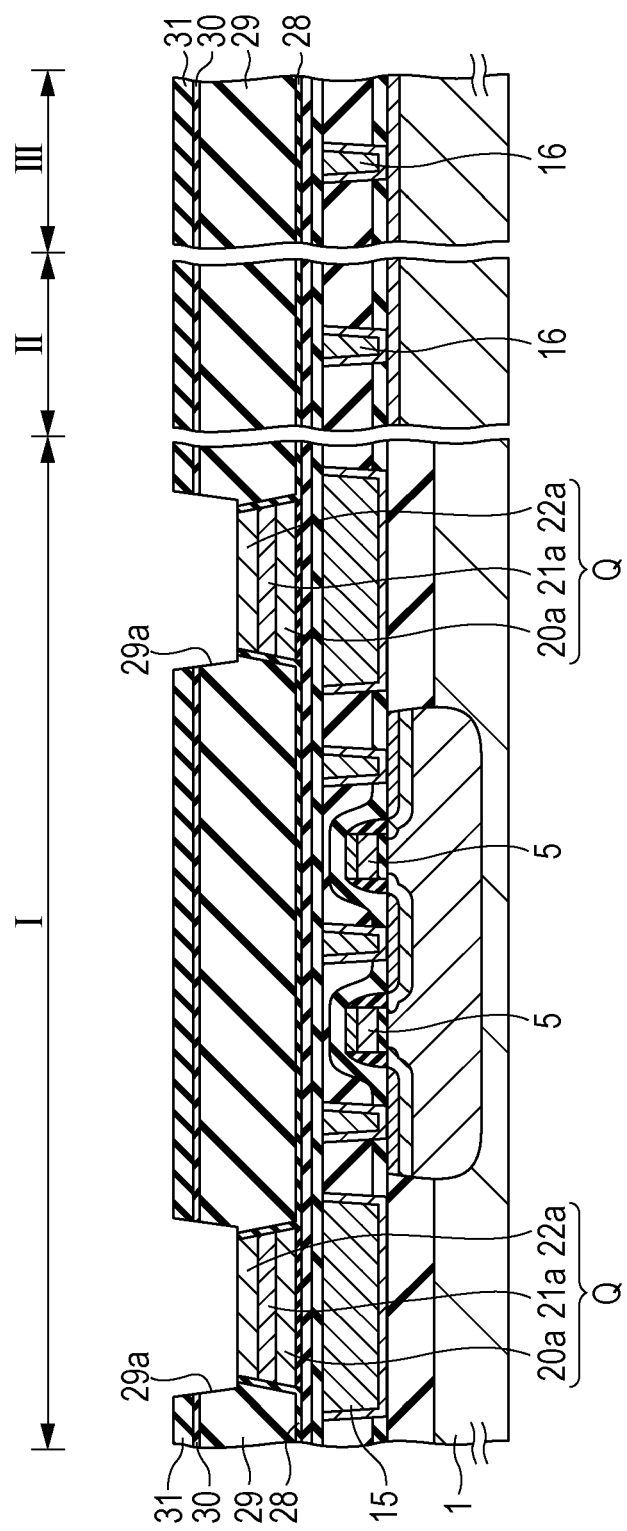
FIG. 10 is a cross-sectional view (part 9) illustrating a process of producing a semiconductor device according to the first embodiment.

Subsequently, as illustrated in FIG. 10, the second protective insulating film 28, the second insulating film 29, the third protective insulating film 30, and the second interlayer insulating film 31 are patterned by photolithography and dry etching to form a first hole 29a on each of the ferroelectric capacitors Q.

An etching gas used in this dry etching is not particularly limited. For example, a mixed gas of $C_4F_8$, Ar, $O_2$, and CO may be used as the etching gas.

Figure 17:
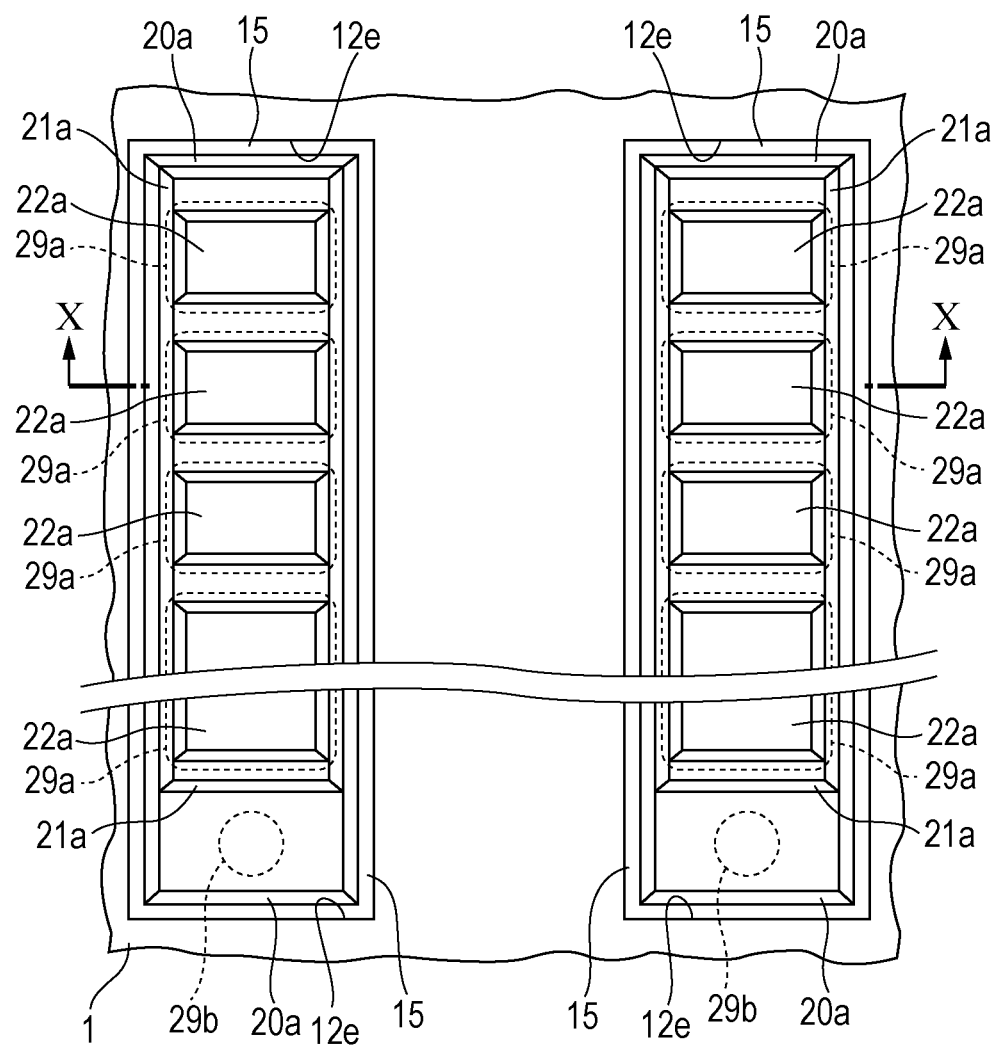
FIG. 17 is an enlarged plan view (part 3) of the cell region in a process of producing a semiconductor device according to the first embodiment.

FIG. 17 is an enlarged plan view of the cell region I after the above process is completed. FIG. 10 corresponds to a cross-sectional view taken along line X-X in FIG. 17.

As illustrated in FIG. 17, a plurality of first holes 29a are formed so as to correspond to the upper electrodes 22a. Each of the first holes 29a is formed so as to have a size that includes the entire region of the upper electrode 22a inside thereof in plan view.

As described above, the side faces of the upper electrode 22a are inclined in a tapered manner, and the upper surface of the upper electrode 22a is smaller than the lower surface thereof. The first hole 29a is preferably formed so as to include the entire region of the lower surface of the upper electrode 22a. This also applies to second to fourth embodiments described below.

In this process, a second hole 29b is formed in the second insulating film 29 on an end of the lower electrode 20a, and the lower electrode 20a is exposed from the second hole 29b.

Furthermore, the opening 12e is formed so as to have a size that includes the entire region of the lower electrode 20a inside thereof in plan view. Accordingly, the conductor 15 is formed so as to be larger than the lower electrode 20a.

Figure 11:
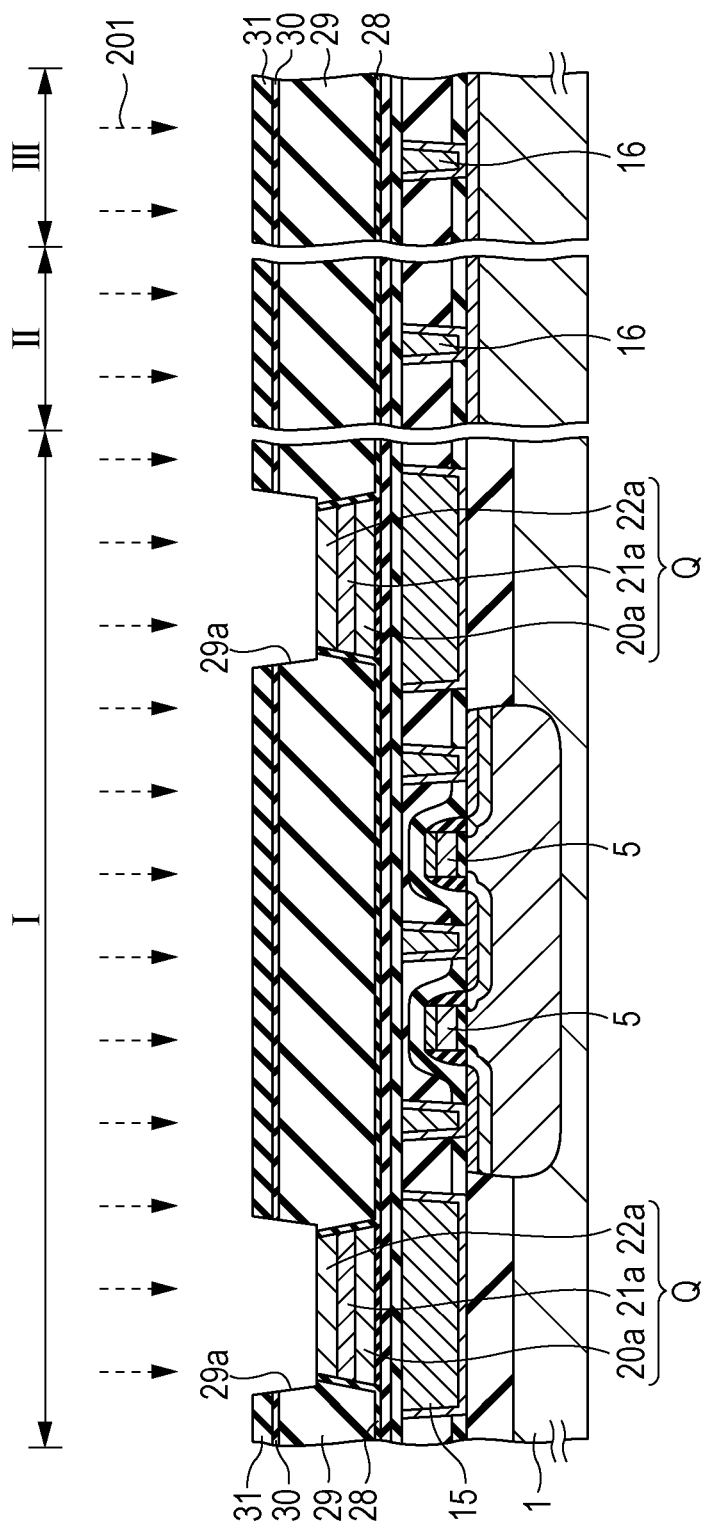
FIG. 11 is a cross-sectional view (part 10) illustrating a process of producing a semiconductor device according to the first embodiment.

Next, as illustrated in FIG. 11, annealing is performed on the second insulating film 29 in an oxygen-containing atmosphere at a substrate temperature of 450° C. for 60 minutes so that moisture contained in the second insulating film 29 is released to the outside through the first holes 29a. During this annealing, oxygen 201 diffuses into the ferroelectric capacitors Q through the first holes 29a.

In the first embodiment, since each of the first holes 29a is formed so as to be larger than the corresponding upper electrode 22a as described above, moisture in the second insulating film 29 is immediately released to the outside through the first holes 29a and thus the effect of dehydration by annealing may be increased.

Figure 12:
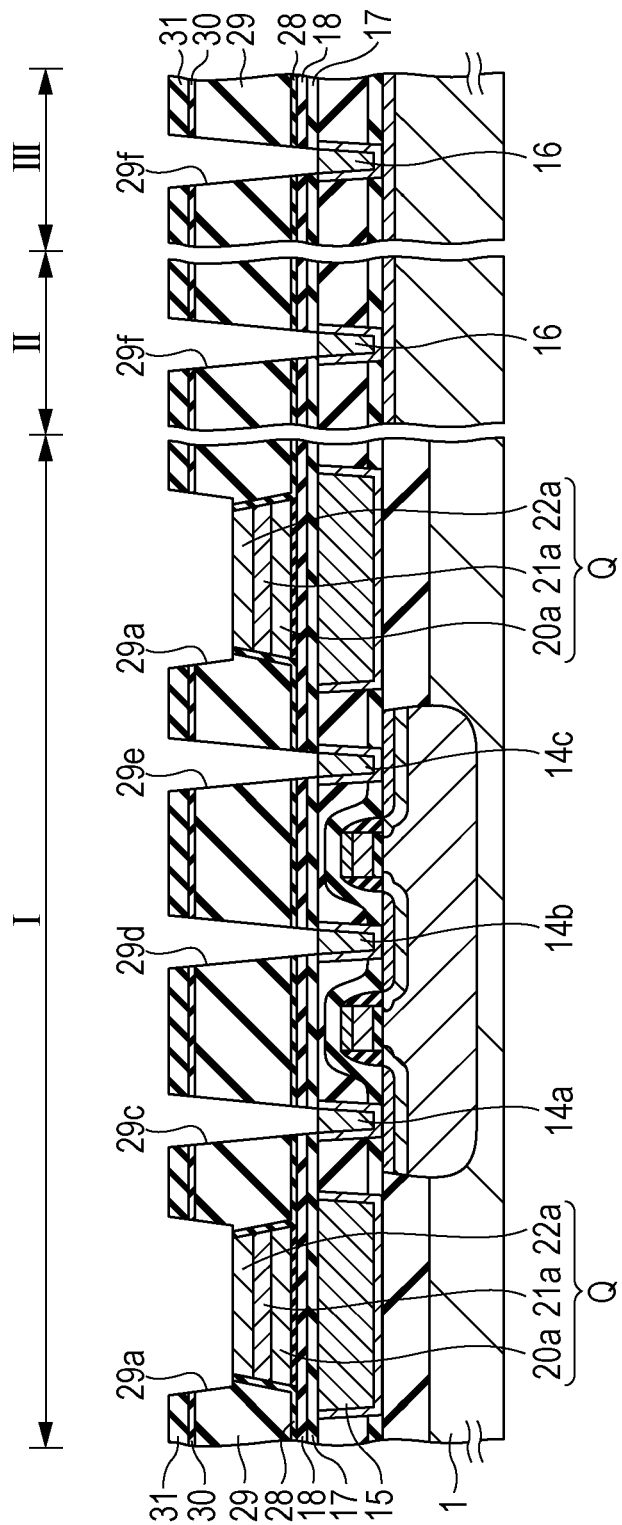
FIG. 12 is a cross-sectional view (part 11) illustrating a process of producing a semiconductor device according to the first embodiment.

Subsequently, as illustrated in FIG. 12, a multilayer insulating film ranging from the second interlayer insulating film 31 to the first antioxidation insulating film 17 is patterned by photolithography and dry etching.

By this patterning, in the cell region I, third to fifth holes 29c to 29e are respectively formed on the first to third contact plugs 14a to 14c. In each of the cell peripheral portion II and the chip peripheral portion III, a sixth hole 29f is formed on the lower ring 16.

An etching gas used in the above dry etching is not particularly limited. In the first embodiment, a mixed gas of $C_4F_8$, Ar, $O_2$, and CO is used as the etching gas of the first interlayer insulating film 18, the second protective insulating film 28, the second insulating film 29, the third protective insulating film 30, and the second interlayer insulating film 31. The first antioxidation insulating film 17 is removed by sputter etching using argon gas.

Next, a process of forming the cross-sectional structure illustrated in FIG. 13 will be described.

First, a single-layer titanium nitride film is formed as a conductive adhesion film 32a on the inner surfaces of the first holes 29a and the third to sixth holes 29c to 29f and the upper surface of the second interlayer insulating film 31 by a sputtering method so as to have a thickness of about 100 to 150 nm.

As illustrated in the dotted line circle of the cell region I, the adhesion film 32a is grown on a side face and the bottom surface of the first hole 29a in different directions, and thus a growth line 32x indicating a grain boundary due to the difference in the growth direction is formed in the adhesion film 32a.

Next, a tungsten film 32b is formed on the adhesion film 32a by a CVD method using hydrogen gas and tungsten hexafluoride gas as a deposition gas. Each of the first holes 29a and the third to sixth holes 29c to 29f is filled with the tungsten film 32b.

The substrate temperature during the formation of the tungsten film 32b is determined in accordance with the magnitude of a stress desired for the tungsten film 32b. The substrate temperature is preferably, for example, about 350° C. to 400° C.

Hydrogen in the deposition gas has a property of diffusing in an underlying layer through the growth line 32x of the adhesion film 32a. However, in the first embodiment, since the first hole 29a is formed so as to be larger than the upper electrode 22a, the growth line 32x is located on a side of the upper electrode 22a, as illustrated in the dotted line circle.

Accordingly, it is possible to reduce the risk that iridium oxide constituting the upper electrode 22a is exposed to hydrogen passing through the growth line 32x and to suppress a decrease in the volume of the upper electrode 22a, the decrease being due to reduction of iridium oxide by hydrogen.

If the volume of the upper electrode 22a decreases, cracks are formed in the upper electrode 22a, fluorine in the tungsten hexafluoride gas reaches the capacitor dielectric film 21a through the cracks, and a pore is formed in the capacitor dielectric film 21a by an etching action of fluorine. In the first embodiment, the formation of such a pore is suppressed, and the yield of the semiconductor device may be improved.

Subsequently, unwanted portions of the adhesion film 32a and the tungsten film 32b on the upper surface of the second interlayer insulating film 31 are removed by CMP.

The adhesion film 32a and the tungsten film 32b that are not polished but are left function as first conductor plug 33 in the first hole 29a and third to fifth conductor plugs 34c to 34e in the third to fifth holes 29c to 29e, respectively.

Among the first conductor plug 33 and the third to fifth conductor plugs 34c to 34e, the first conductor plug 33 is electrically connected to the upper electrode 22a, and the third to fifth conductor plugs 34c to 34e are electrically connected to the first to third contact plugs 14a to 14c, respectively.

In each of the cell peripheral portion II and the chip peripheral portion III, an upper ring 35 is formed in the sixth hole 29f. The upper ring 35 and the lower ring 16 that are formed in the cell peripheral portion II form a conductor ring 37. The upper ring 35 and the lower ring 16 that are formed in the chip peripheral portion III form a moisture-resistant ring 38.

Figure 13:
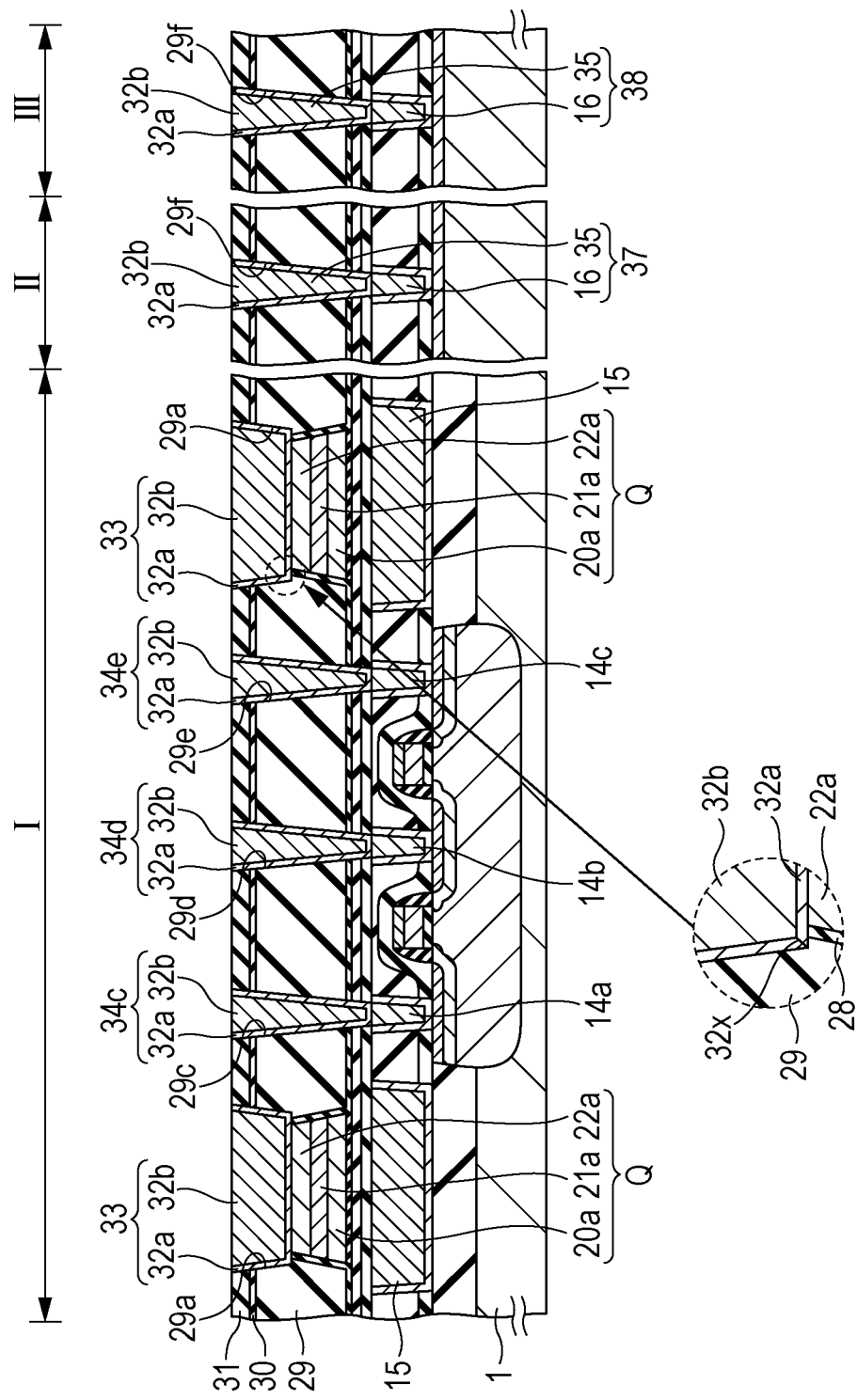
FIG. 13 is a cross-sectional view (part 12) illustrating a process of producing a semiconductor device according to the first embodiment.
Figure 18:
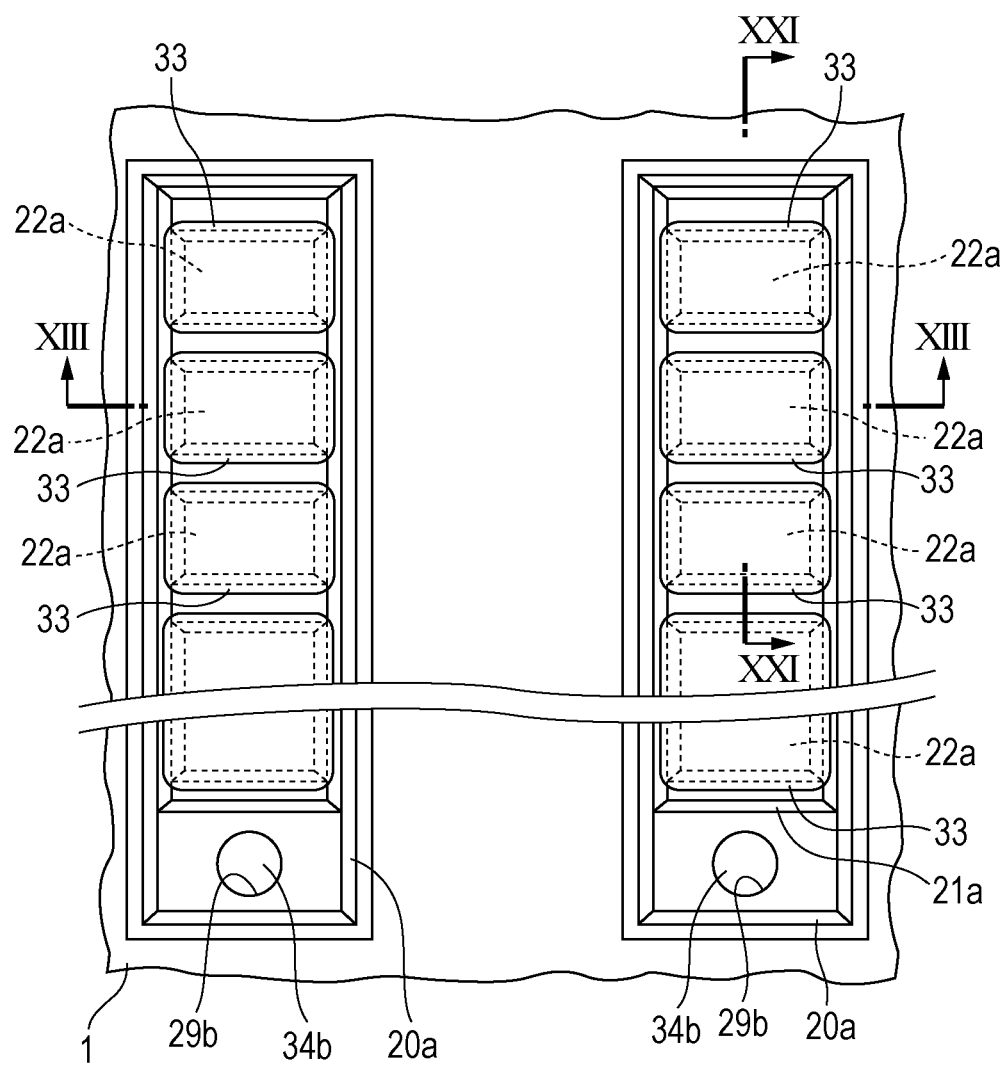
FIG. 18 is an enlarged plan view (part 4) of the cell region in a process of producing a semiconductor device according to the first embodiment.

FIG. 18 is an enlarged plan view of the cell region I after the process of forming the cross-sectional structure illustrated in FIG. 13 is completed. FIG. 13 corresponds to a cross-sectional view taken along line XIII-XIII in FIG. 18.

As illustrated in FIG. 18, the first conductor plug 33 is formed so as to have a size that covers the entire region of the upper electrode 22a in plan view.

In this process, a second conductor plug 34b in which the adhesion film 32a and the tungsten film 32b are sequentially stacked is formed in the second hole 29b on an end of the lower electrode 20a.

Figure 19:
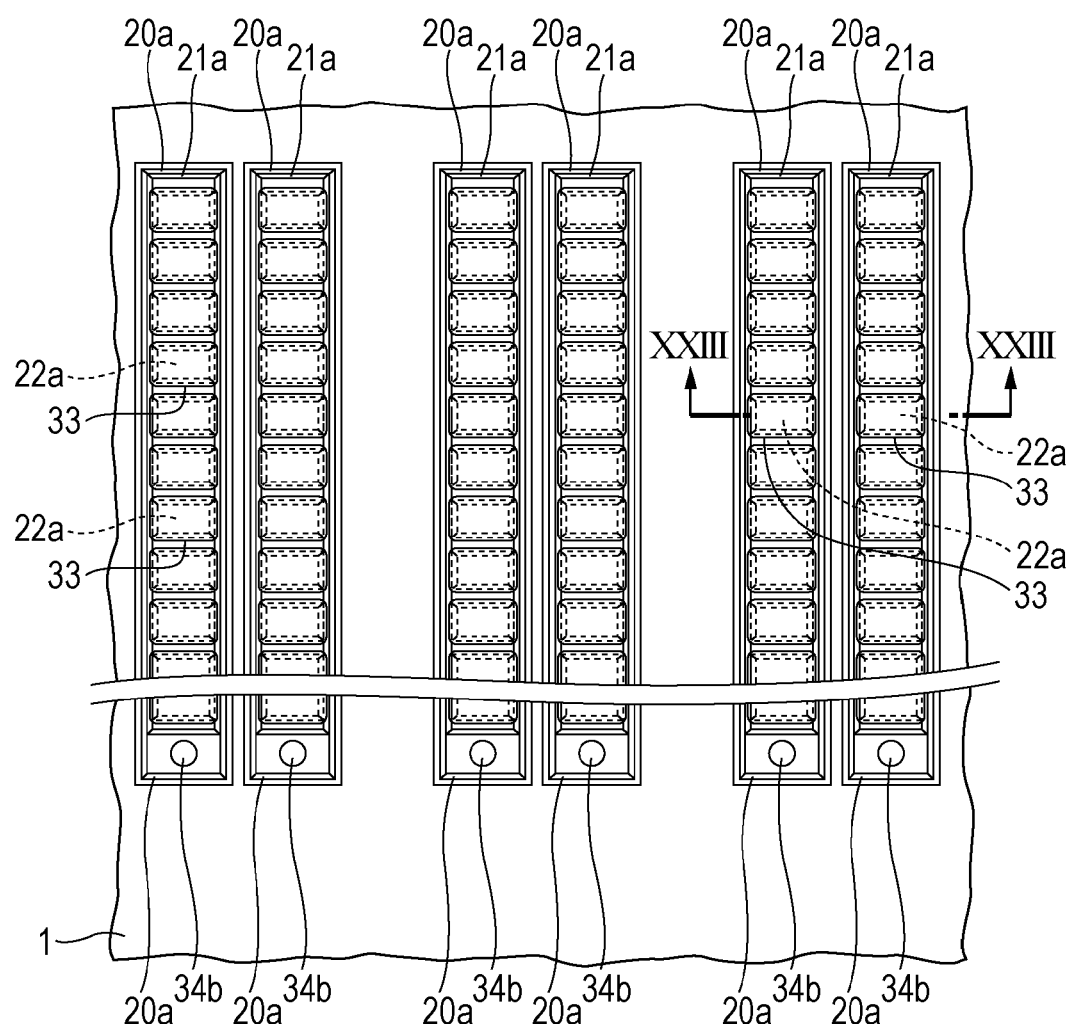
FIG. 19 is an enlarged plan view of an area wider than the area illustrated in FIG. 18.

FIG. 19 is an enlarged plan view of the cell region I in an area wider than the area illustrated in FIG. 18.

As illustrated in FIG. 19, two stripe-shaped lower electrodes 20a form a pair, and a plurality of the pairs of lower electrodes 20a extend on the silicon substrate 1.

Figure 20:
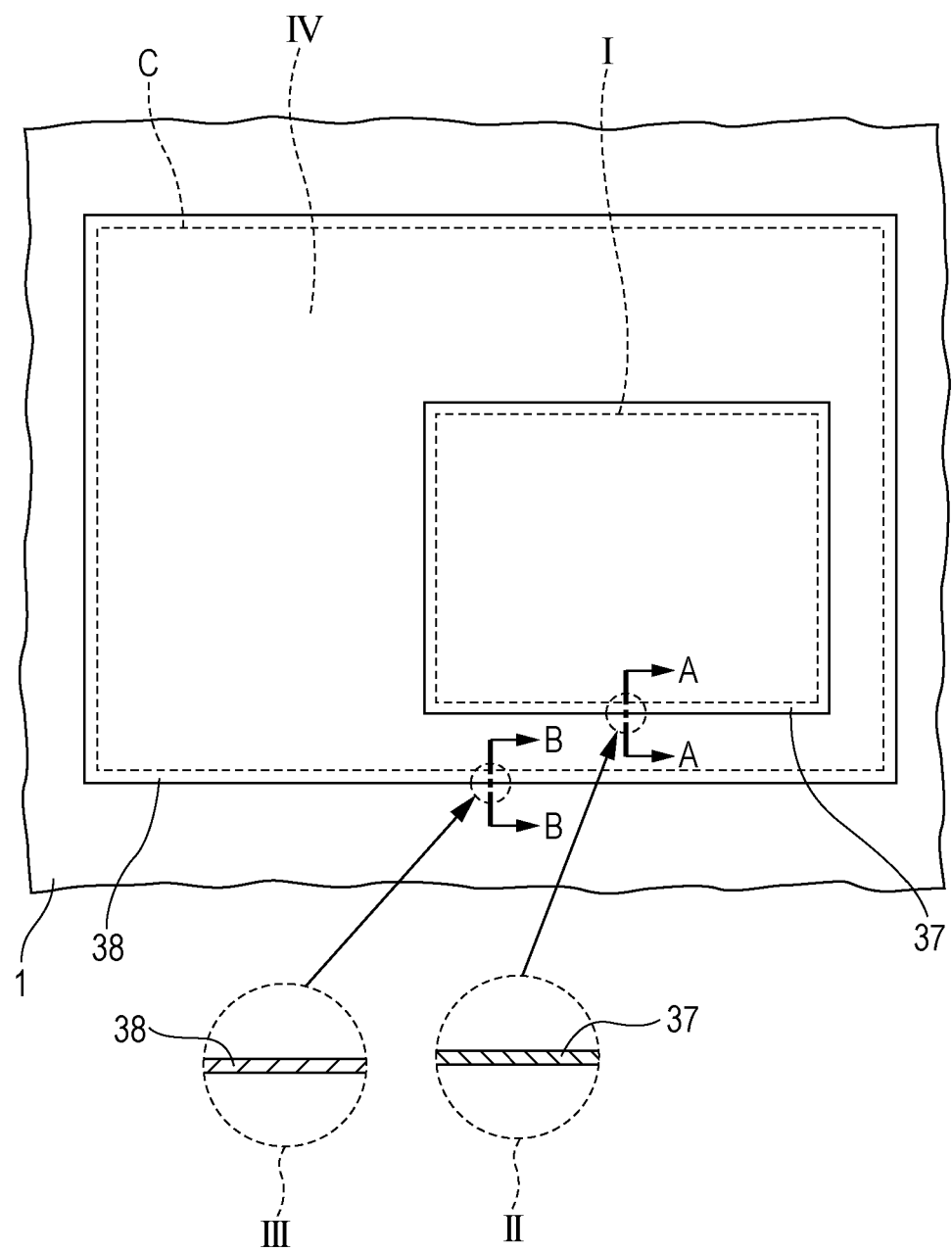
FIG. 20 is an enlarged plan view of a chip region in a process of producing a semiconductor device according to the first embodiment.

FIG. 20 is an enlarged plan view of the chip region C after the above process is completed.

As illustrated in FIG. 20, the conductor ring 37 is formed so as to have a ring shape surrounding the cell region I in plan view, and the moisture-resistant ring 38 is formed so as to have a ring shape surrounding the entire part of the chip region C in plan view.

By surrounding the chip region C with the moisture-resistant ring 38 in this manner, the entry of moisture in the outside atmosphere into the chip region C from a lateral direction of the substrate may be blocked by the moisture-resistant ring 38. Thus, the degradation of the capacitor dielectric film 21a due to moisture nay be suppressed.

Figure 14:
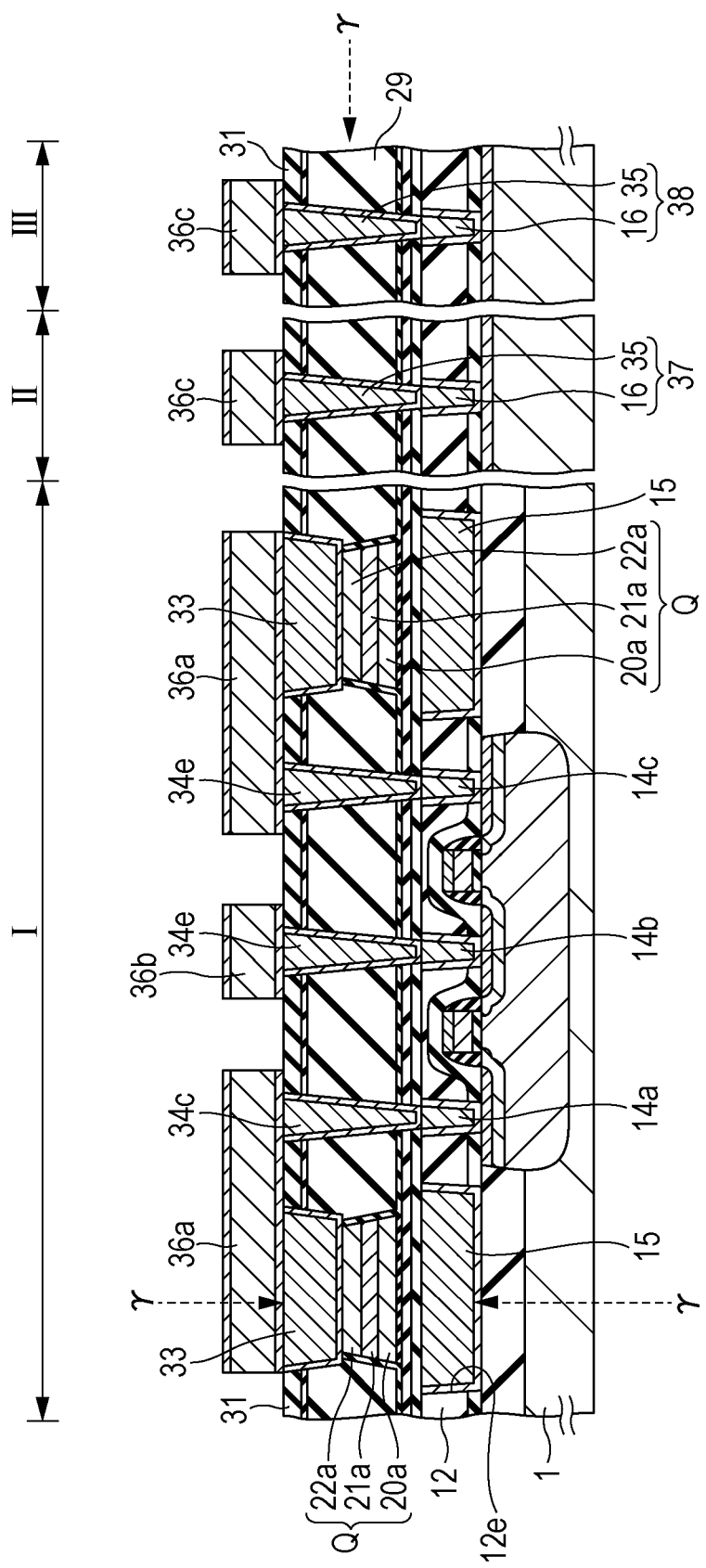
FIG. 14 is a cross-sectional view (part 13) illustrating a process of producing a semiconductor device according to the first embodiment.

Next, as illustrated in FIG. 14, a multilayer metal film is formed over the entire upper surface of the silicon substrate 1. The multilayer metal film is then patterned to form a first metal wiring 36a, a first conductive pad 36b, and a second conductive pad 36c.

For example, the multilayer metal film is formed by depositing a titanium film having a thickness of 60 nm, a titanium nitride film having a thickness of 30 nm, a copper-containing aluminum film having a thickness of 360 nm, a titanium film having a thickness of 5 nm, and a titanium nitride film having a thickness of 70 nm in that order by a sputtering method.

Through the above process, a basic structure of the semiconductor device according to the first embodiment is formed.

According to the first embodiment described above, as illustrated in FIG. 14, the first conductor plug 33 and the conductor 15 that contain tungsten are respectively provided above and below each ferroelectric capacitor Q.

Tungsten has an atomic radius larger than that of aluminum or copper, which is used as a wiring material, and thus has a good capability of blocking radiation such as gamma rays. Accordingly, tungsten may block gamma rays γ coming toward the ferroelectric capacitor Q.

The ferroelectric capacitor Q itself also has a capability of blocking radiation to a certain degree because PZT in the capacitor dielectric film 21a contains lead. The blocking capability is reinforced by the conductor 15 and the first conductor plug 33 to enhance the radiation resistance of the semiconductor device.

In particular, since the conductor 15 is formed so as to be larger than the lower electrode 20a in plan view, most of the gamma rays γ coming from below the silicon substrate 1 to the capacitor dielectric film 21a may be blocked by the conductor 15.

Similarly, since the first conductor plug 33 is formed so as to be larger than the upper electrode 22a in plan view, most of the gamma rays γ coming from above the silicon substrate 1 to the capacitor dielectric film 21a may be blocked by the first conductor plug 33.

According to the disclosure described above, since a hole is formed so as to include the entire region of an upper electrode in plan view, most of the radiation coming toward a capacitor dielectric film may be blocked by a conductor plug formed in the hole. Thus, the radiation resistance of a semiconductor device is enhanced In the first embodiment, the side faces of the upper electrode 22a are inclined in a tapered manner, and the upper surface of the upper electrode 22a is smaller than the lower surface of the upper electrode 22a. In this case, the incidence of the gamma rays γ from above may be effectively suppressed by forming the first hole 29a so as to be larger than the lower surface of the upper electrode 22a in plan view and embedding the first conductor plug 33 in the first hole 29a.

The gamma rays γ coming from a lateral direction of the substrate toward the ferroelectric capacitor Q may be blocked by the conductor ring 37 containing tungsten. In particular, by forming the conductor ring 37 so as to have a height reaching the upper surface of the second insulating film 29, the capability of blocking the gamma rays γ by the conductor ring 37 may be increased.

In order to enhance the radiation resistance of the semiconductor device regardless of the incident angle of gamma rays, the semiconductor device preferably has the following structure.

Figure 21:
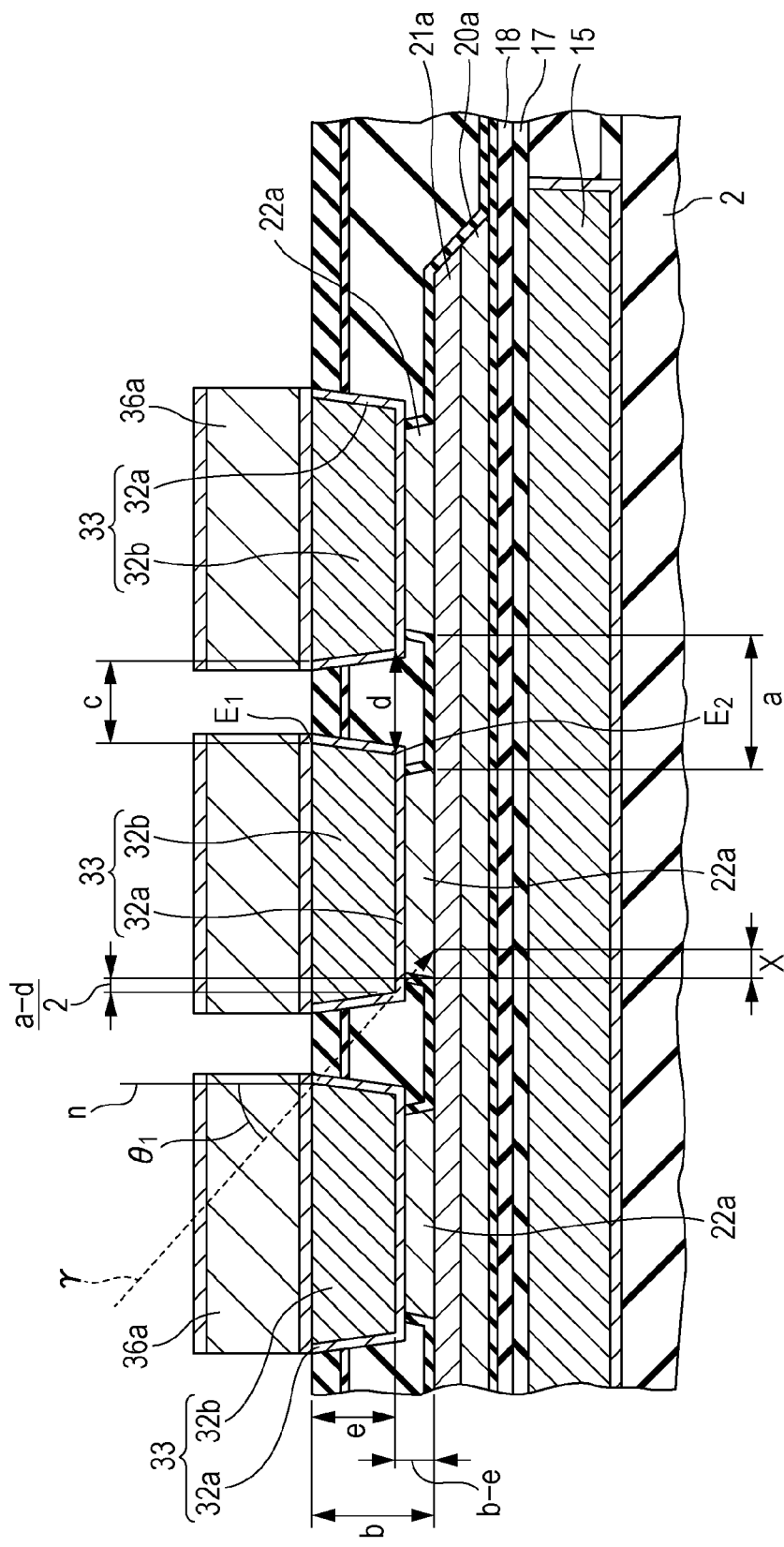
FIG. 21 is a cross-sectional view of a semiconductor device of the first embodiment in a direction in which a lower electrode extends.

FIG. 21 is a cross-sectional view of the above-described semiconductor device in a direction in which the lower electrode 20a extends and corresponds to a cross-sectional view taken along line XXI-XXI in FIG. 18.

In this example, it is assumed that gamma rays γ are incident on the capacitor dielectric film 21a at an incident angle of $\theta_1$. Note that the incident angle $\theta_1$ is an angle formed between a normal line direction n of the silicon substrate 1 and a direction in which the gamma rays γ are incident.

The term "gamma rays γ" represents gamma rays having the maximum incident angle $\theta_1$ among gamma rays γ that may be incident on the capacitor dielectric film 21a of one of the capacitors Q without being blocked by the first conductor plug 33 of the other of the capacitors Q.

The gamma rays γ are negligibly blocked by the adhesion film 32a of the first conductor plug 33. Accordingly, in FIG. 21, the gamma rays γ are illustrated as penetrating through the adhesion film 32a.

In FIG. 21, symbol X denotes a width of a portion of the capacitor dielectric film 21a right under the upper electrode 22a, the portion being irradiated with the gamma rays γ.

The capacitor dielectric film 21a right under the upper electrode 22a contributes to ensuring of the amount of switching charge of the ferroelectric capacitor Q etc. Therefore, if the capacitor dielectric film 21a right under the upper electrode 22a is irradiated with the gamma rays γ, the amount of switching charge may be decreased. Accordingly, ideally, the width X is preferably zero.

A discussion will be made regarding a design of the semiconductor device in which the dimensions of the semiconductor device are such that a width X of zero is realized.

In FIG. 21, the dimensions are denoted as follows. a: distance between lower surfaces of adjacent upper electrodes 22a, b: distance between lower surface of upper electrode 22a and upper surface of first conductor plug 33, c: distance between upper surfaces of adjacent tungsten films 32b, d: distance between lower surfaces of adjacent tungsten films 32b, e: distance between lower surface and upper surface of tungsten film 32b In FIG. 21, the dimension a is illustrated only in a portion of the semiconductor device. However, each portion of the semiconductor device is regularly arranged in accordance with a design rule, and thus, in any position of the semiconductor device, the dimension a is the same value. This also applies to the other dimensions b to e.

Figure 22A:
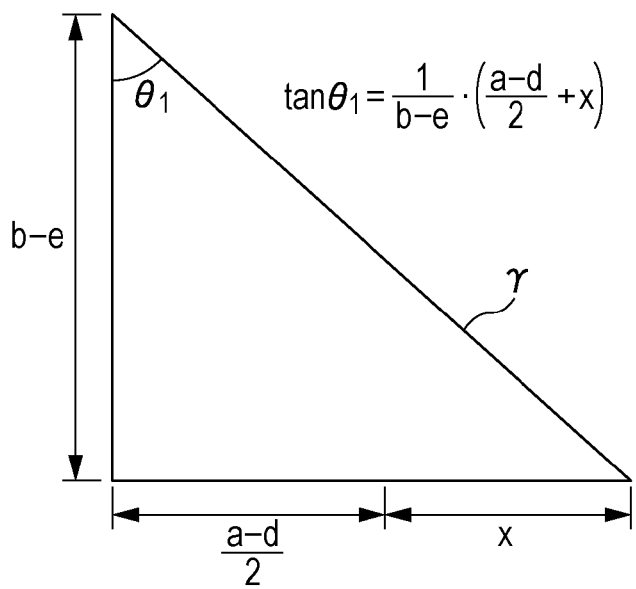
FIGS. 22A and 22B are views each illustrating a geometric relationship between a semiconductor device according to the first embodiment and gamma rays.

FIG. 22A illustrates a right triangle whose hypotenuse represents the gamma rays γ immediately before the incidence on the capacitor dielectric film 21a. In this case, the following formula (1) is geometrically satisfied.

$$\tan \theta_1 = ((a-d)2+X)/(b-e) \tag{1}$$

In deriving formula (1), it is assumed that the center of gravity of the upper electrode 22a and the center of gravity of the first conductor plug 33 coincide with each other, and that the tungsten film 32b of the first conductor plug 33 protrudes from an end of the upper electrode 22a in the lateral direction by $(a-d)/2$.

As described above, X is preferably zero. Accordingly, when X in formula (1) is zero, the following formula (2) is obtained.

$$(a-d)/2 = (b-e) \times \tan \theta_1 \tag{2}$$

Figure 22B:
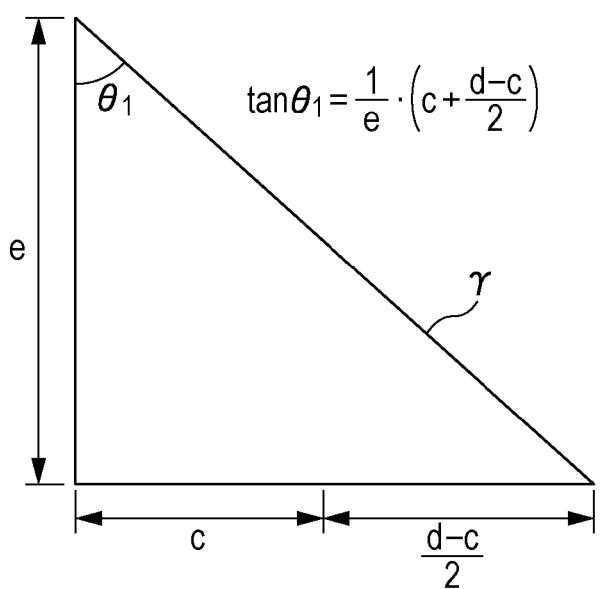

In order to calculate $\theta_1$ of formula (2), a right triangle illustrated in FIG. 22B is considered. FIG. 22B illustrates a right triangle having a height equal to the above-described distance e and a hypotenuse corresponding to the gamma rays γ.

The length of the base of this right triangle includes not only the distance c between the upper surfaces of adjacent tungsten films 32b but also a value $(d-c)/2$. This is based on the assumption that the center of gravity of the upper electrode 22a and the center of gravity of the first conductor plug 33 coincide with each other as described above, and that an end $E_1$ of the upper surface of the tungsten film 32b protrudes from an end $E_2$ of the lower surface of the tungsten film 32b in the lateral direction of the substrate by $(d-c)/2$.

The following formula (3) is geometrically obtained from FIG. 22B.

$$\tan \theta_1 = (c+(d-c)/2)/e = (c+d)/(2e) \tag{3}$$

By substituting formula (3) for formula (2), the following formula (4) is obtained.

$$(a-d)/2 = (b-e) \times (c+d)/(2e) = b(c+d)/(2e) - (c+d)/2 \tag{4}$$

That is, in order that the capacitor dielectric film 21a right under the upper electrode 22a is not exposed to the gamma rays γ, the semiconductor device is designed so as to satisfy formula (4).

Figure 23:
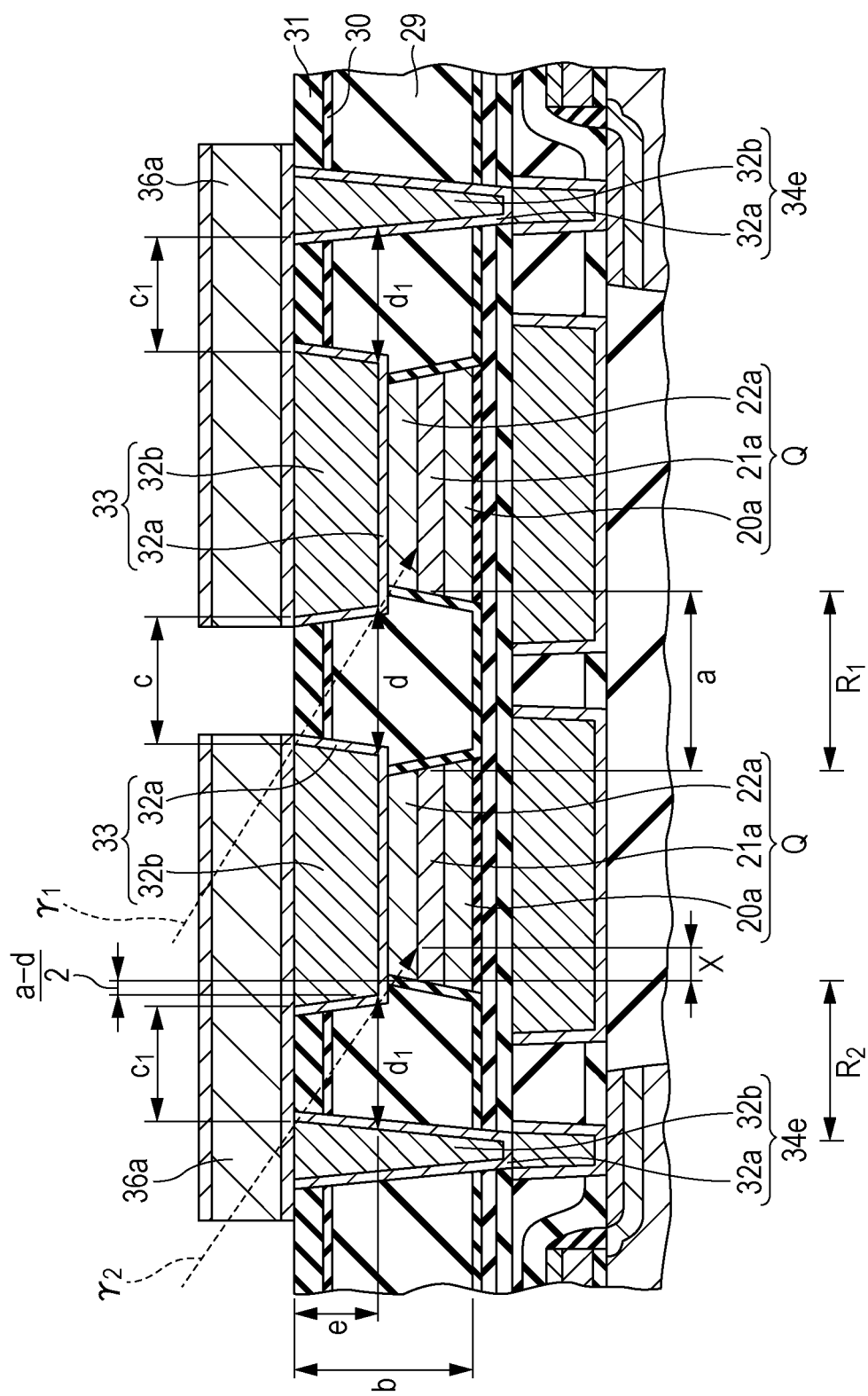
FIG. 23 is a cross-sectional view of a semiconductor device of the first embodiment in a direction orthogonal to the direction in which a lower electrode extends.

FIG. 23 is a cross-sectional view of the semiconductor device according to the first embodiment in a direction orthogonal to a direction in which the lower electrode 20a extends and corresponds to a cross-sectional view taken along line XXIII-XXIII in FIG. 19.

In FIG. 23, the dimensions a to e each denote the same as those in FIG. 21.

Symbol $c_1$ denotes the distance between the upper surface of the tungsten film 32b of the fifth conductor plug 34e and the upper surface of the tungsten film 32b of the first conductor plug 33.

Symbol $d_1$ denotes the distance between the tungsten film 32b of the fifth conductor plug 34e and the lower surface of the tungsten film 32b of the first conductor plug 33.

When viewed from the cross section of FIG. 23, in this semiconductor device, side faces of two ferroelectric capacitors Q face each other in a first region R1, and a side face of the fifth conductor plug 34e and a side face of a ferroelectric capacitor Q face each other in a second region R2.

In order that the capacitor dielectric film 21a right under the upper electrode 22a is not exposed to gamma rays $\gamma_1$ incident on the first region R1, formula (4) is satisfied because of the same reason as the reason that has been described with reference to FIGS. 22A and 22B.

That is, in the case where formula (4) is satisfied, the gamma rays $\gamma_1$ coming toward the capacitor dielectric film 21a right under the upper electrode 22a of one of adjacent ferroelectric capacitors Q may be blocked by a tungsten film 32b on the other ferroelectric capacitor Q.

In the second region R2, the tungsten film 32b of the fifth conductor plug 34e blocks gamma rays $\gamma_2$, and dimensions related to the tungsten film 32b are $c_1$ and $d_1$. Accordingly, in the second region R2, when the following formula (5), which is obtained by respectively changing c and d in formula (4) to $c_1$ and $d_1$, is satisfied, X becomes zero and the capacitor dielectric film 21a right under the upper electrode 22a is not exposed to the gamma rays $\gamma_2$.

$$(a-d_1)/2 = (b-e) \times (c_1+d_1)/(2e) = b(c_1+d_1)/(2e) - (c_1+d_1)/2 \tag{5}$$

In order to block gamma rays more effectively, it is effective to provide a blocking body containing tungsten over a wide area above the first conductor plug 33.

Figure 24:
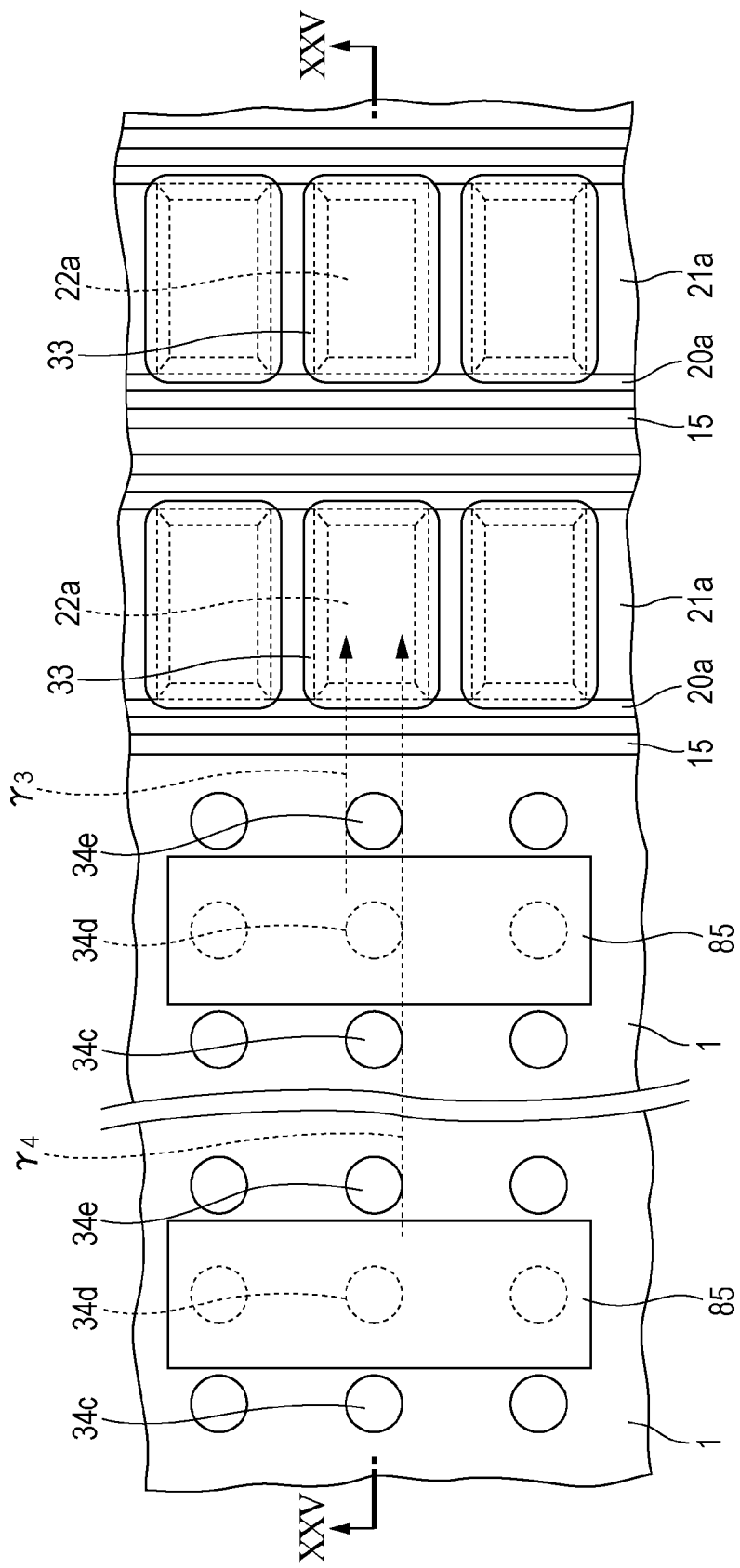
FIG. 24 is an enlarged plan view of a semiconductor device in the case where a blocking body is provided in the first embodiment.

FIG. 24 is an enlarged plan view of a semiconductor device according to the first embodiment, the semiconductor device including such a blocking body.

In this example, a plurality of blocking bodies 85 are provided above the third to fifth conductor plugs 34c to 34e at intervals. Gamma rays coming toward a ferroelectric capacitor Q may be effectively blocked by the blocking bodies 85, thereby suppressing a decrease in the amount of switching charge of the capacitor dielectric film 21a due to the gamma rays.

However, since gaps are present around the blocking bodies 85, gamma rays coming from the gaps toward the ferroelectric capacitor Q are present.

Two types of gamma rays $\gamma_3$ and $\gamma_4$ coming toward a ferroelectric capacitor Q through the blocking body 85 and the third to fifth conductor plugs 34c to 34e will now be discussed.

Figure 25:
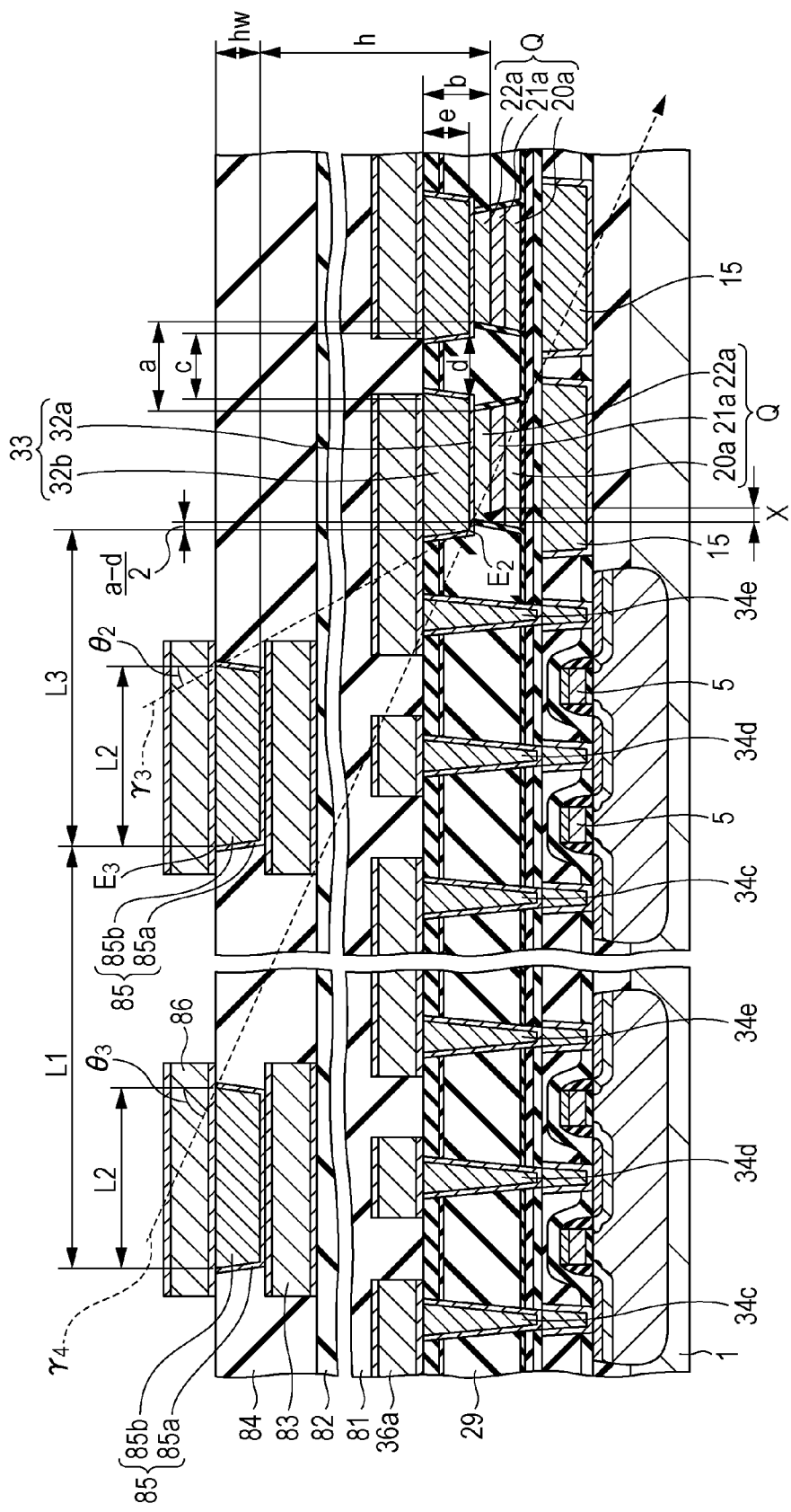
FIG. 25 is a cross-sectional view taken along line XXV-XXV in FIG. 24.

FIG. 25 is a cross-sectional view taken along line XXV-XXV in FIG. 24.

In FIG. 25, the dimensions a to e each denote the same as those in FIG. 21.

As illustrated in FIG. 25, in this example, a third insulating film 81 and 82, a fourth metal wiring 83, and a fourth insulating film 84 are formed on the first metal wiring 36a in that order.

The third insulating film 81 and the fourth insulating film 84 may each be a silicon oxide film formed by a CVD method. The fourth metal wiring 83 may be a multilayer metal film having the same structure as the first metal wiring 36a.

Furthermore, a blocking body 85 formed by stacking an adhesion film 85a and a tungsten film 85b in that order is provided on the fourth metal wiring 83. A fifth metal wiring

86 having the same layer structure as the first metal wiring 36a is formed on the blocking body 85.

In FIG. 25, symbols L1 to L3 etc. denote the following. L1: arrangement pitch of two adjacent tungsten films 85b, L2: width of upper surface of tungsten film 85b, L3: distance between end $E_3$ of upper surface of tungsten film 85b and end $E_2$ of lower surface of tungsten film 32b in lateral direction of substrate, h: distance between lower surface of upper electrode 22a and lower surface of tungsten film 85b in normal line direction of substrate, hw: distance between lower surface and upper surface of tungsten film 85b

In a semiconductor device having this cross-sectional structure, the above-described two types of gamma rays $\gamma_3$ and $\gamma_4$ are incident on the capacitor dielectric film 21a.

The gamma rays $\gamma_3$ pass through an edge of, among the plurality of blocking bodies 85, the blocking body 85 that is the closest to the ferroelectric capacitor Q and are incident on the capacitor dielectric film 21a at an incident angle of $\theta_2$.

Regarding the incident angle $\theta_2$, the following formula (6) is geometrically satisfied.

$$\tan \theta_2 = (L3 - L2 + (a-d)/2)/(h+hw) \quad (6)$$

In order to satisfy X=0, the following formula (7) is satisfied because of the same reason as the reason regarding formula (2).

$$(a-d)/2 = (b-e) \times \tan \theta_2 \quad (7)$$

By substituting formula (6) for formula (7), the following formula (8) is obtained.

$$(a-d)/2 = (b-e) \times (L3 - L2 + (a-d)/2)/(h+hw) \quad (8)$$

That is, in order that the gamma rays $\gamma_3$ are not incident on the capacitor dielectric film 21a right under the upper electrode 22a, formula (8) is satisfied.

Next, the case of gamma rays $\gamma_4$ will be discussed.

The gamma rays $\gamma_4$ pass through an edge of, among the plurality of blocking bodies 85, the blocking body 85 the farthest to the ferroelectric capacitor Q and are incident on the capacitor dielectric film 21a at an incident angle of $\theta_3$.

Regarding the incident angle $\theta_3$, the following formula (9) is geometrically satisfied.

$$\tan \theta_3 = (L1 + L3 - L2 + (a-d)/2)/(h+hw) \quad (9)$$

In order to satisfy X=0, the following formula (10) is satisfied because of the same reason as the reason regarding formula (2).

$$(a-d)/2 = (b-e) \times \tan \theta_3 \quad (10)$$

By substituting formula (9) for formula (10), the following formula is obtained.

$$(a-d)/2 = (b-e) \times (L1 + L3 - L2 + (a-d)/2)/(h+hw) \quad (11)$$

That is, in order that the gamma rays $\gamma_4$ are not incident on the capacitor dielectric film 21a right under the upper electrode 22a, formula (11) is satisfied.

In formulae (2), (7), and (10), angles $\theta_1$ to $\theta_3$ are each an incident angle of gamma rays that may be incident on the capacitor dielectric film 21a without being blocked by tungsten in the first conductor plug 33 and the blocking body 85.

According to formulae (2), (7), and (10), when the tangent of the maximum incident angle among such incident angles of gamma rays is equal to (a−d)/(2(b−e)), the width X of a portion of the capacitor dielectric film 21a right under the upper electrode 22a, the portion being irradiated with the gamma rays, may be made zero.

Second Embodiment

In the first embodiment, the effect of blocking radiation such as gamma rays by the first conductor plug 33 has been described. The first conductor plug 33 larger than the upper electrode 22a has not only such a function of blocking radiation but also a function of making a stress applied to the capacitor dielectric film 21a uniform. The latter effect will be described in a second embodiment.

Figure 26:
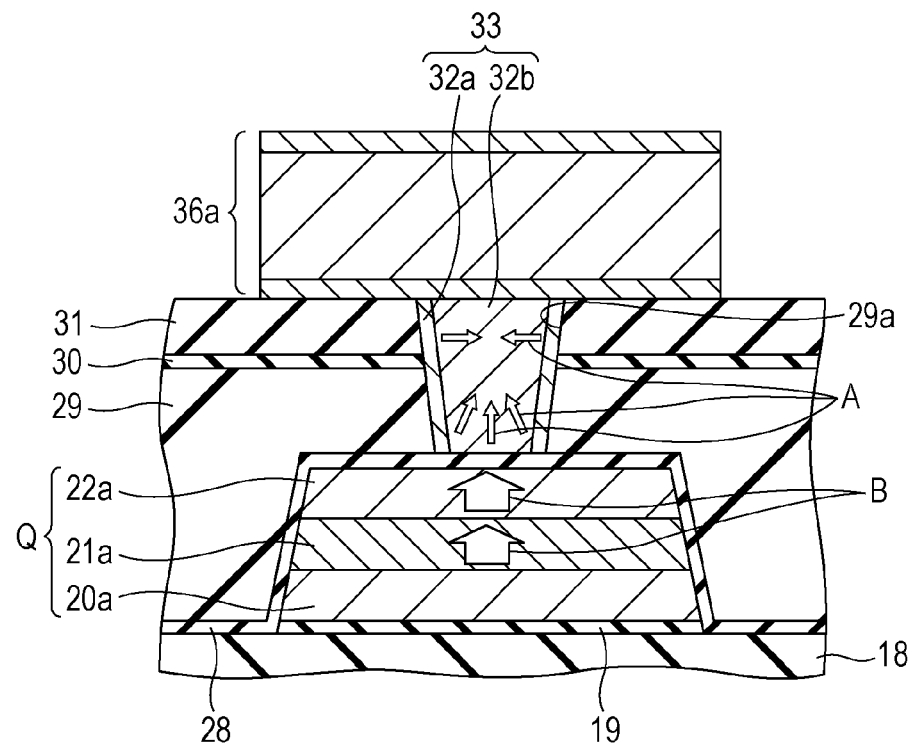
FIG. 26 is an enlarged cross-sectional view of a ferroelectric capacitor and the periphery of the ferroelectric capacitor according to a comparative example.

FIG. 26 is an enlarged cross-sectional view of a ferroelectric capacitor Q in which, unlike the first embodiment, a first conductor plug 33 is formed so as to be smaller than an upper electrode 22a and the periphery of the ferroelectric capacitor Q according to a comparative example.

In FIG. 26, the same components as those described in the first embodiment are assigned the same reference numerals as those in the first embodiment, and a description of the components is omitted below. This also applies to FIGS. 27 to 31 described below.

A tungsten film 32b has a tensile stress, and thus the tungsten film 32b itself tends to shrink as illustrated by arrows A of FIG. 26. When the tungsten film 32b shrinks in this manner, a stress B that pulls a capacitor dielectric film 21a upward is generated.

The stress B strongly acts on a portion of the capacitor dielectric film 21a, the portion being located right under the first conductor plug 33, and negligibly acts on the other portion of the capacitor dielectric film 21a. Thus, the stress acting on the capacitor dielectric film 21a becomes nonuniform in the plane.

As a result, the amount of charge induced in the capacitor dielectric film 21a by the piezoelectric effect due to the stress B also varies depending on the position of the capacitor dielectric film 21a, and it becomes difficult to distinguish between data "0" and "1" stored in the ferroelectric capacitor Q. It is believed that this problem becomes significant particularly when the shift between the position of the first conductor plug 33 and the position of the ferroelectric capacitor Q is increased by a reduction in size of the ferroelectric capacitor Q.

Figure 27:
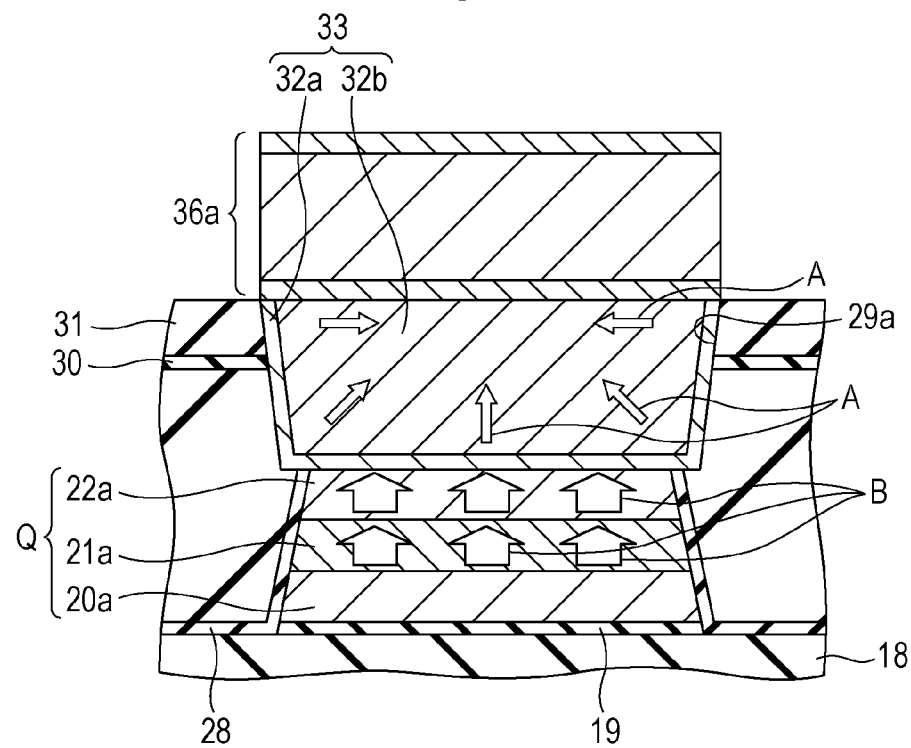
FIG. 27 is an enlarged cross-sectional view of a ferroelectric capacitor and the periphery of the ferroelectric capacitor according to a second embodiment.

FIG. 27 is an enlarged cross-sectional view of a ferroelectric capacitor Q of a semiconductor device and the periphery of the ferroelectric capacitor Q according to the second embodiment. Each of the arrows A and B in FIG. 27 denotes the same meaning as that of arrows A and B in FIG. 26.

As illustrated in FIG. 27, in the second embodiment, a first conductor plug 33 is larger than an upper electrode 22a. Accordingly, the first conductor plug 33 is in contact with the entire surface of the upper electrode 22a, and a stress B acting from a tungsten film 32b to a capacitor dielectric film 21a is easily uniformly applied over the entire surface of the capacitor dielectric film 21a.

With this structure, since the amount of charge induced by the piezoelectric effect becomes uniform in the capacitor dielectric film 21a, data of "0" and "1" stored in the ferroelectric capacitor Q may be easily distinguished from each other in the second embodiment.

One of factors that control the uniformity of the amount of charge induced in the capacitor dielectric film 21a is the position of the first conductor plug 33.

A description will be made of the position of the first conductor plug 33 suitable for making the charge of the capacitor dielectric film 21a uniform.

Figure 28A:
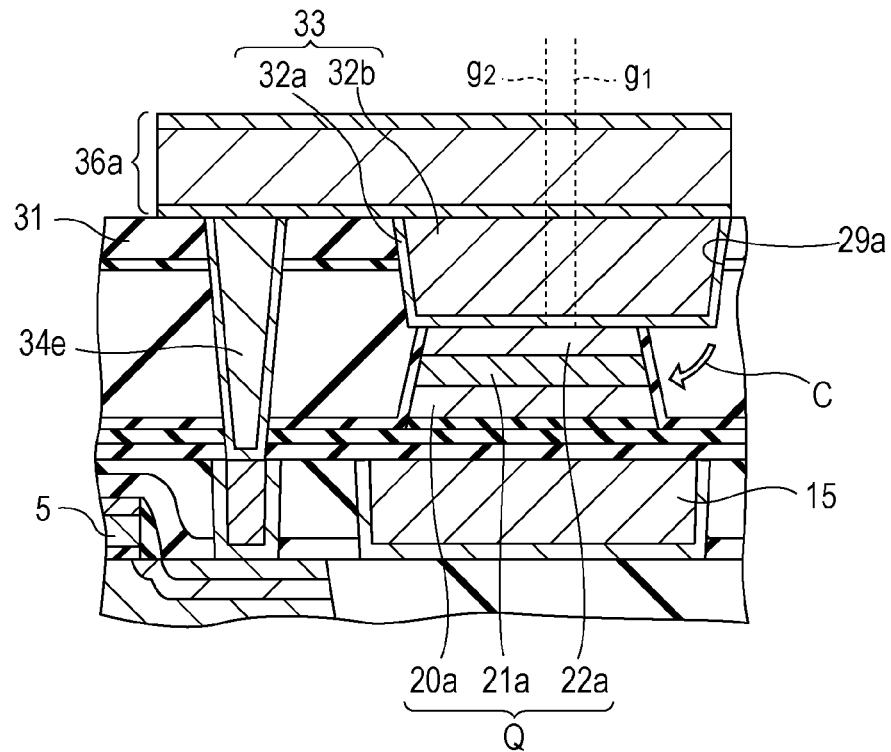
FIGS. 28A and 28B are cross-sectional views each illustrating a preferable position of a first conductor plug in the second embodiment.
Figure 28B:
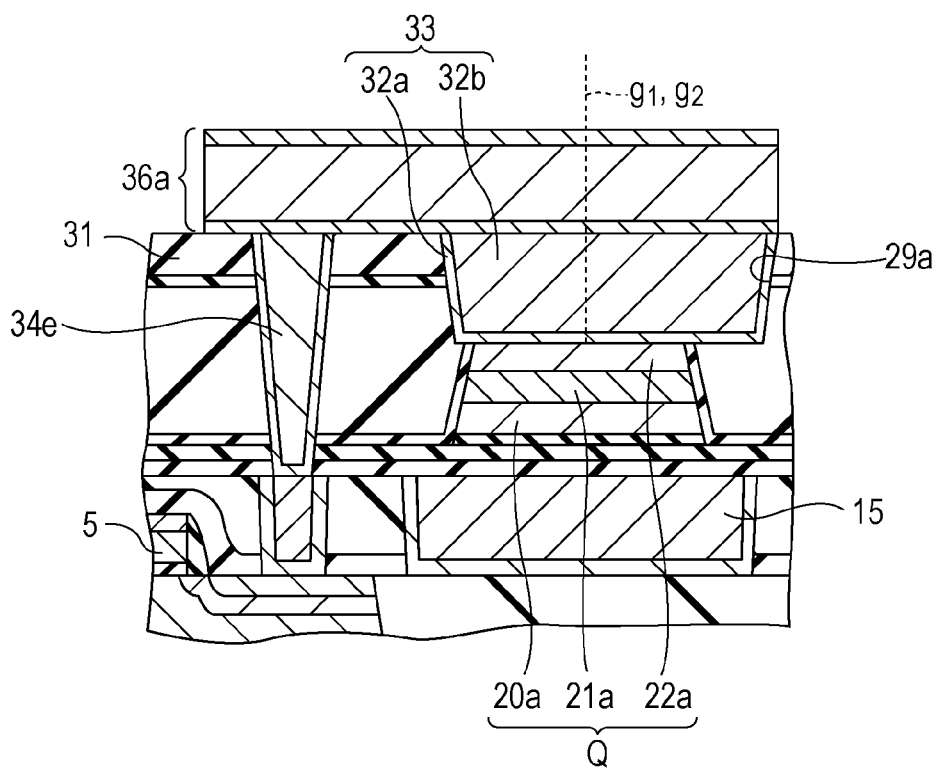
Figure 29A:
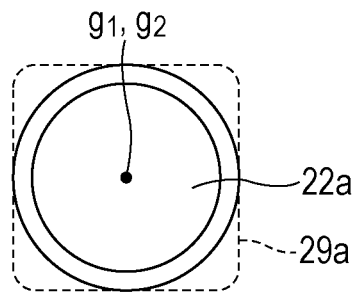
FIGS. 29A to 29D are plan views in the case where the center of gravity of a first hole and the center of gravity of an upper electrode are made coincide with each other in the second embodiment.
Figure 29B:
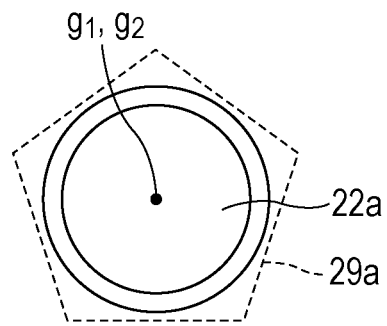
Figure 29C:
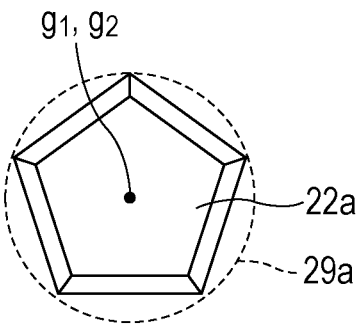
Figure 29D:
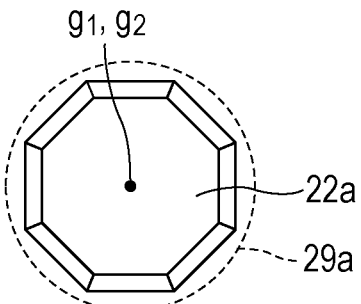

FIGS. 28A and 28B are cross-sectional views for explaining a suitable position of a first conductor plug 33.

In each of FIGS. 28A and 28B, the first conductor plug 33 is in contact with the entire surface of an upper electrode 22a, and thus the semiconductor device has a structure suitable for blocking gamma rays by the first conductor plug 33.

However, in the example illustrated in FIG. 28A, a center $g_1$ of gravity of a first hole 29a and a center $g_2$ of gravity of the upper electrode 22a do not coincide with each other. With this deviation of the center of gravity, the first conductor plug 33 unevenly protrudes either on the left side or on the right side of the upper electrode 22a. Consequently, a stress C applied from a tungsten film 32b to a capacitor dielectric film 21a becomes asymmetric between the left side and the right side.

As a result, the amount of charge induced by the piezoelectric effect due to the stress C varies in the plane of the capacitor dielectric film 21a, and it becomes difficult to distinguish data of "0" and "1" stored in a ferroelectric capacitor Q from each other.

In contrast, in the example illustrated in FIG. 28B, a center $g_1$ of gravity of a first hole 29a and a center $g_2$ of gravity of the upper electrode 22a coincide with each other. With this structure, the asymmetry of the stress C is removed. Accordingly, the amount of charge induced in a capacitor dielectric film 21a becomes uniform in the plane of the capacitor dielectric film 21a, and data "0" and "1" stored in a ferroelectric capacitor Q may be easily distinguished from each other.

From the standpoint of improving the distinguishability of data in the ferroelectric capacitor Q, it is preferable to make the center $g_1$ of gravity of the first hole 29a and the center $g_2$ of gravity of the upper electrode 22a coincide with each other.

Next, a description will be made of examples of a planar layout of an upper electrode 22a and a first hole 29a whose centers $g_1$ and $g_2$ of gravity coincide with each other.

FIGS. 29A to 29D are plan views of a planar layout of an upper electrode 22a and a first hole 29a whose centers $g_1$ and $g_2$ of gravity coincide with each other.

In each of the examples illustrated in FIGS. 29A to 29D, one of the upper electrode 22a and the first hole 29a has a circular shape and the other has a polygonal shape, and the upper electrode 22a and the first hole 29a are not similar to each other.

Figure 30A:
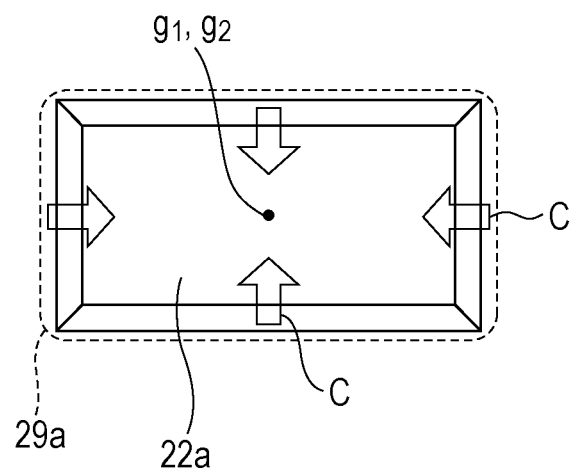
FIGS. 30A and 30B are plan views in the case where the center of gravity of a first hole and the center of gravity of an upper electrode are made coincide with each other and the planar shape of the upper electrode and the planar shape of the first hole are similar to each other in the second embodiment.
Figure 30B:
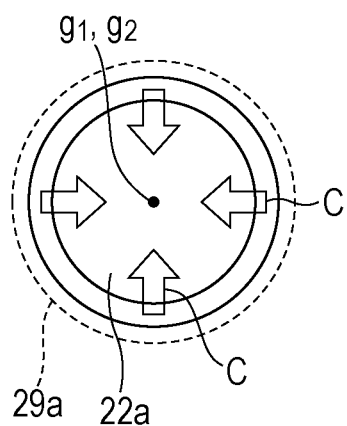

In contrast, FIGS. 30A and 30B are plan views in the case where the center $g_1$ of gravity of a first hole 29a and the center $g_2$ of gravity of an upper electrode 22a coincide with each other and the planar shape of the upper electrode 22a and the planar shape of the first hole 29a are similar to each other.

In the example illustrated in FIG. 30A, the upper electrode 22a and the first hole 29a each have a rectangular shape.

In the example illustrated in FIG. 30B, the upper electrode 22a and the first hole 29a each have a circular shape.

When the planar shape of the upper electrode 22a and the planar shape of the first hole 29a are similar to each other as illustrated in FIGS. 30A and 30B, a stress C generated by the first conductor plug 33 (refer to FIG. 14) in the first hole 29a becomes uniform on the edge of the upper electrode 22a. Accordingly, the amount of charge induced by the piezoelectric effect due to the stress C may be made more uniform in the plane of the capacitor dielectric film 21a.

Figure 31A:
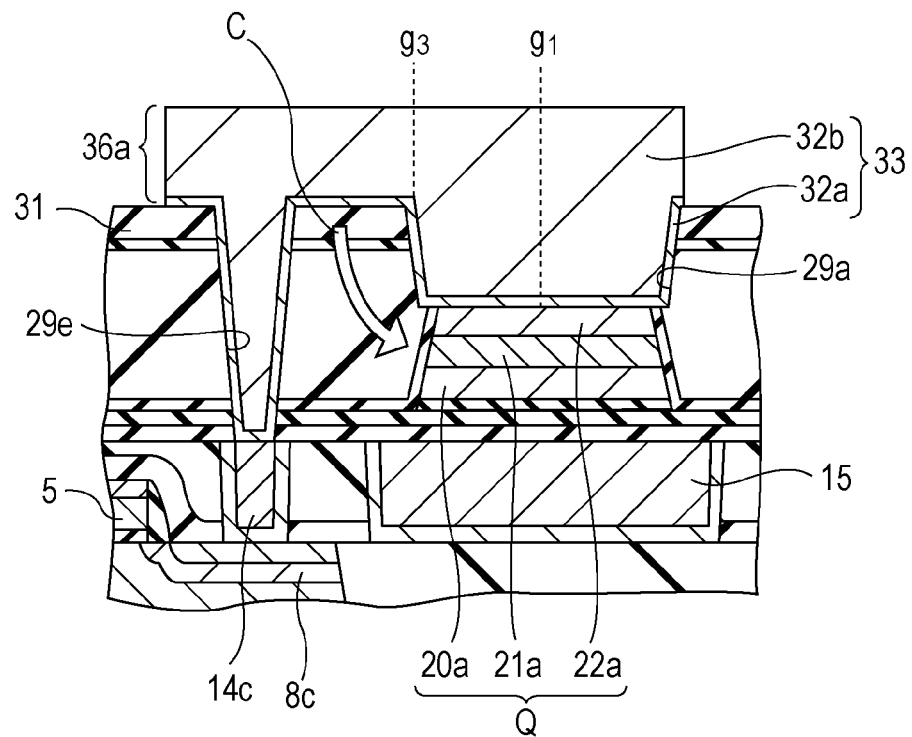
FIGS. 31A and 31B are cross-sectional views each illustrating another example of the first conductor plug in the second embodiment.
Figure 31B:
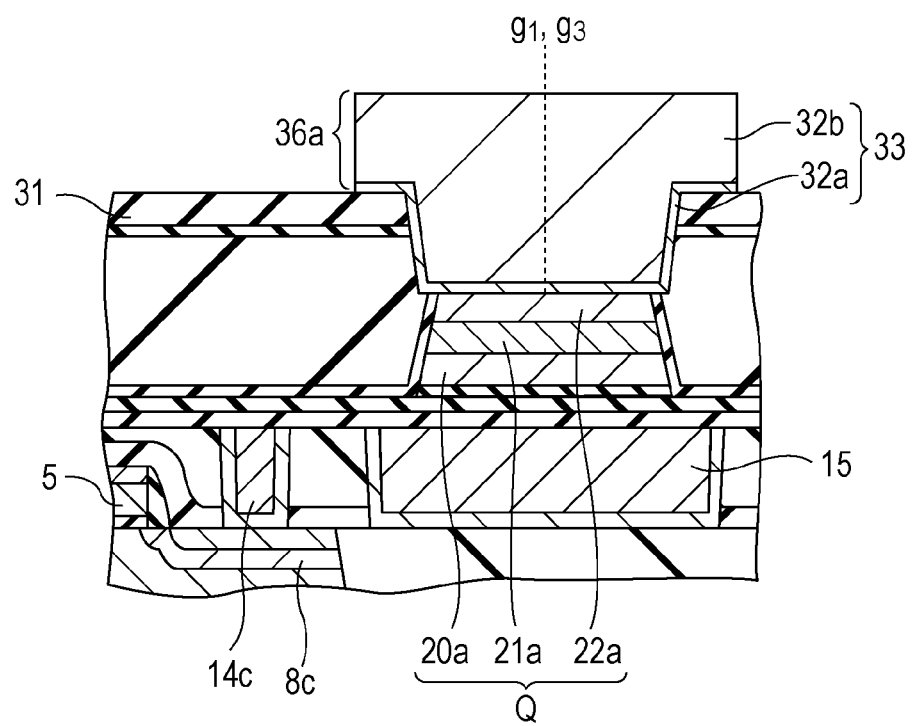

FIGS. 31A and 31B are cross-sectional views illustrating other examples of the first conductor plug 33.

In these examples, a part of a tungsten film 32b of a first conductor plug 33 is led on a second interlayer insulating film 31, and a first metal wiring 36a is formed by the tungsten film 32b.

However, in the example illustrated in FIG. 31A, the tungsten film 32b is embedded in a fifth hole 29e, and thus a center $g_3$ of gravity of the tungsten film 32b does not coincide with a center $g_1$ of gravity of a first hole 29a. Consequently, as in the case illustrated in FIG. 28A, the stress C that acts from the tungsten film 32b to a capacitor dielectric film 21a becomes asymmetric.

In contrast, in the example illustrated in FIG. 31B, a center $g_3$ of gravity of the tungsten film 32b coincides with a center $g_1$ of gravity of a first hole 29a. Consequently, as in the case illustrated in FIG. 28B, the asymmetry of the stress C is removed, and the amount of charge induced in a capacitor dielectric film 21a may be made uniform in the plane of the capacitor dielectric film 21a.

Third Embodiment

In the first embodiment, a planar FeRAM is produced as a semiconductor device. In a third embodiment, a stacked FeRAM, which is advantageous in miniaturization as compared with the planar FeRAM, is produced as a semiconductor device.

FIGS. 32A to 54 are cross-sectional views each illustrating a process of producing a semiconductor device according to the third embodiment. In FIGS. 32A to 54, the same components as those described in the first embodiment are assigned the same reference numerals as those in the first embodiment, and a description of the components is omitted.

In order to produce this semiconductor device, first, the process illustrated in FIGS. 2A to 3A of the first embodiment is performed. Thus, a structure including first to third contact plugs 14a to 14c and lower rings 16 is formed as illustrated in FIG. 32A.

However, in this process, the conductor 15 (refer to FIG. 3A) of the first embodiment is not formed.

Next, as illustrated in FIG. 32B, a first antioxidation insulating film 17 having a thickness of about 100 nm and a first interlayer insulating film 18 having a thickness of about 200 nm are formed in that order, and the first antioxidation insulating film 17 and the first interlayer insulating film 18 are then patterned to form openings 18a.

A width W2 of each of the openings 18a is larger than a width of each of the first to third contact plugs 14a to 14c, and is, for example, about 1.0 µm.

An etching gas used in this patterning is also not particularly limited. In the third embodiment, a mixed gas of $CF_4$ gas and $C_4F_8$ gas is used as the etching gas.

Next, a process of forming the cross-sectional structure illustrated in FIG. 33 will be described.

First, a titanium film having a thickness of 30 nm and a titanium nitride film having a thickness of 20 nm are formed in that order as an adhesion film 40a on the inner surfaces of the openings 18a and on the first interlayer insulating film 18 by a sputtering method.

Next, a tungsten film 40b is formed on the adhesion film 40a by a CVD method using hydrogen gas and tungsten hexafluoride gas as a deposition gas. Each of the openings 18a is completely filled with the tungsten film 40b. The thickness of the tungsten film 40b in this state is, for example, about 300 nm on the first interlayer insulating film 18.

Subsequently, unwanted portions of the adhesion film 40a and the tungsten film 40b on the first interlayer insulating film 18 are removed by CMP. The adhesion film 40a and the tungsten film 40b are left as a conductor 41 in only each of the openings 18a.

In the CMP, over-polishing is performed so that polishing residue is not generated on the first interlayer insulating film 18. Therefore, the conductor 41 is formed in the opening 18a up to a halfway position in the depth direction of the opening 18a, and thus an upper portion of the opening 18a is not filled with the conductor 41.

The conductor 41 is electrically connected to the first contact plug 14a or a second contact plug 14c provided under the conductor 41.

Figure 34:
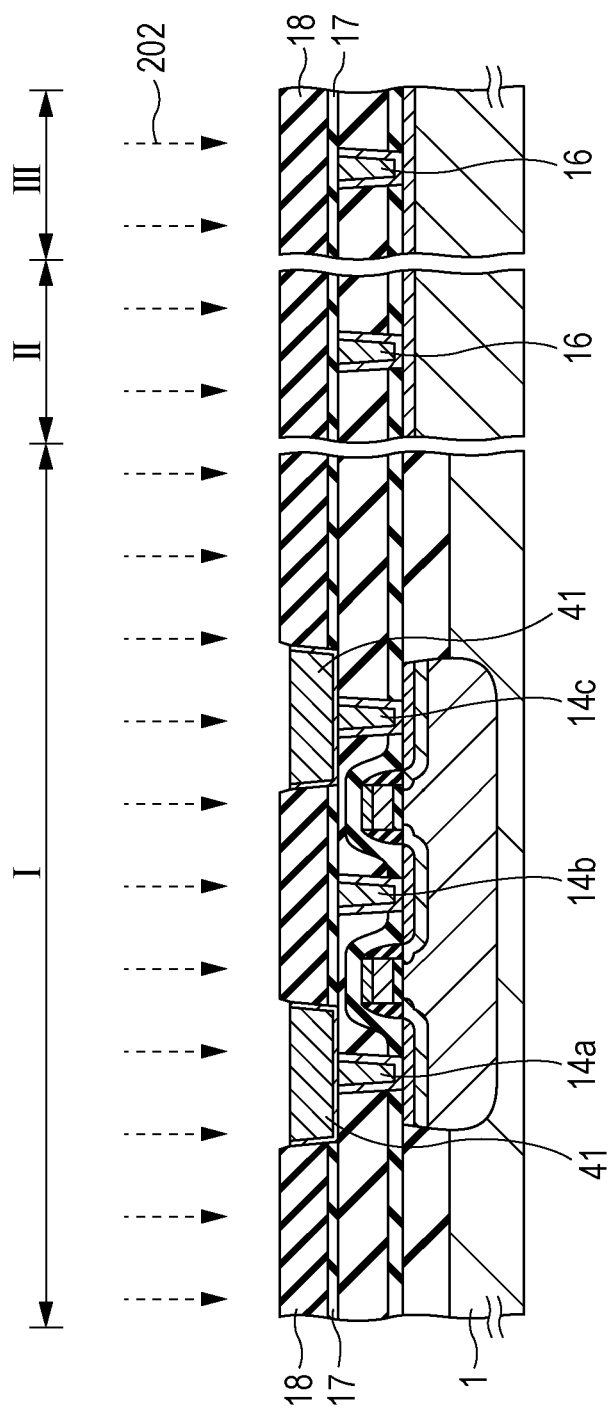
FIG. 34 is a cross-sectional view (part 3) illustrating a process of producing a semiconductor device according to the third embodiment.

Subsequently, as illustrated in FIG. 34, the upper surface of the first interlayer insulating film 18 is exposed to NH$_3$ plasma 202 so that NH groups are bonded to the surface of the first interlayer insulating film 18.

The conditions for generating the NH$_3$ plasma are not particularly limited. In the third embodiment, in a parallel plate plasma processing chamber, a high-frequency power with a power of 55 W at a frequency of 350 kHz is applied to a counter electrode facing a silicon substrate 1 and a high-frequency power with a power of 100 W at a frequency of 13.56 MHz is applied to the silicon substrate 1. For example, the pressure in the chamber is 266 Pa, the substrate temperature is 400° C., and the flow rate of NH$_3$ gas is 350 sccm.

In order to facilitate bonding of NH groups, prior to the exposure to NH$_3$ plasma, the upper surface of the first interlayer insulating film 18 may be cleaned by being exposed to Ar plasma.

Figure 35:
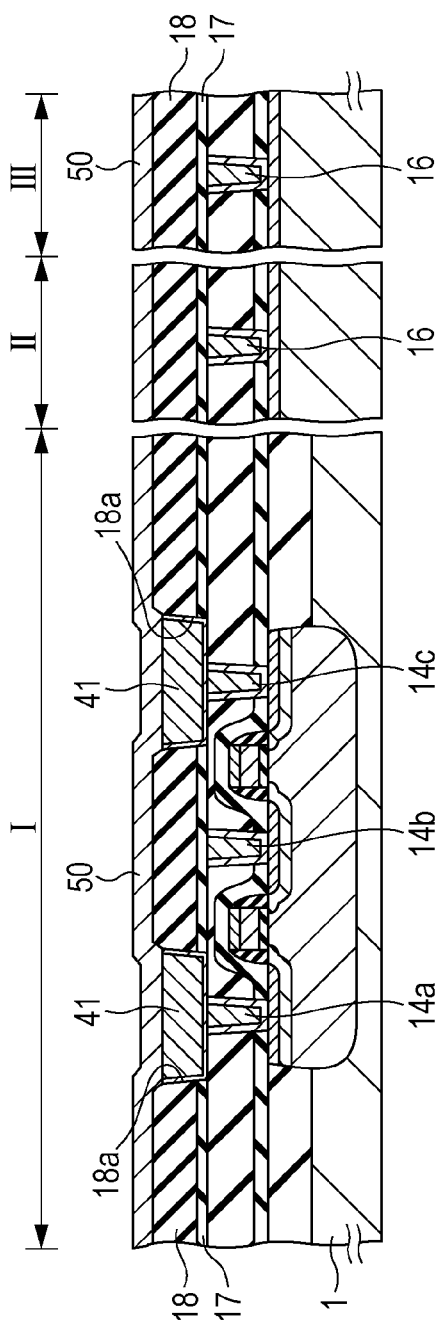
FIG. 35 is a cross-sectional view (part 4) illustrating a process of producing a semiconductor device according to the third embodiment.

Next, as illustrated in FIG. 35, a titanium film is formed as an underlying conductive film 50 on the conductor 41 and the first interlayer insulating film 18 so as to have a thickness of about 20 nm by a sputtering method. Thus, the openings 18a are completely filled with the underlying conductive film 50.

In the process illustrated in FIG. 34, NH groups are bonded to the surface of the first interlayer insulating film 18 in advance. Consequently, titanium, which is the material of the underlying conductive film 50 may freely move on the first interlayer insulating film 18, and the high-quality underlying conductive film 50 oriented in the (002) direction may be formed.

Figure 36:
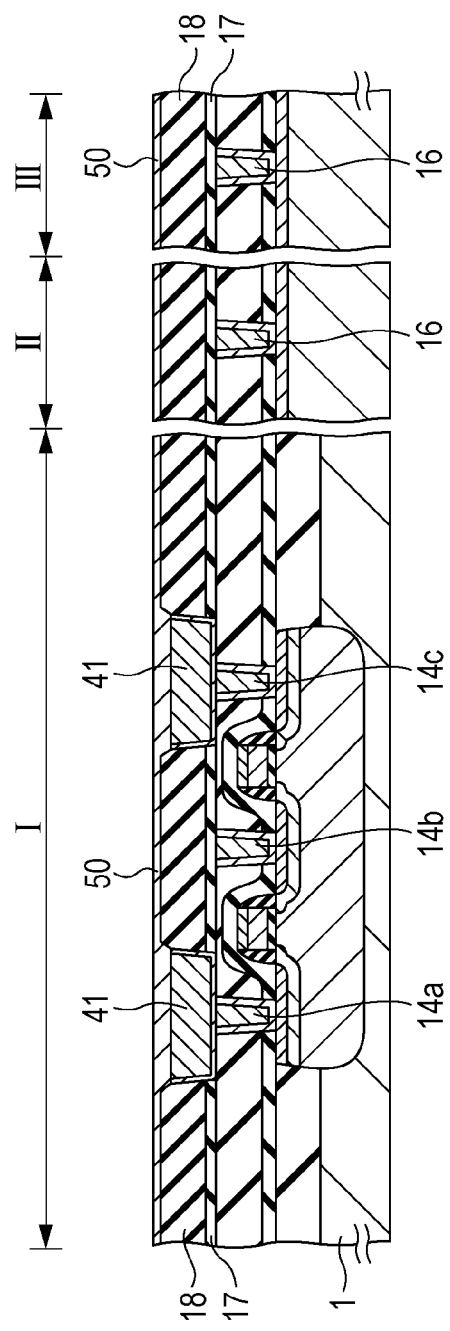
FIG. 36 is a cross-sectional view (part 5) illustrating a process of producing a semiconductor device according to the third embodiment.

Subsequently, as illustrated in FIG. 36, the upper surface of the underlying conductive film 50 is polished by a CMP method to be planarized.

Subsequently, the underlying conductive film 50 is subjected to RTA in a nitrogen atmosphere at a substrate temperature of 650° C. for 60 seconds. Consequently, titanium, which is the material of the underlying conductive film 50, is nitrided to form titanium nitride oriented in the (111) direction. This RTA may be conducted in a nitrogen atmosphere containing a rare gas.

Figure 37:
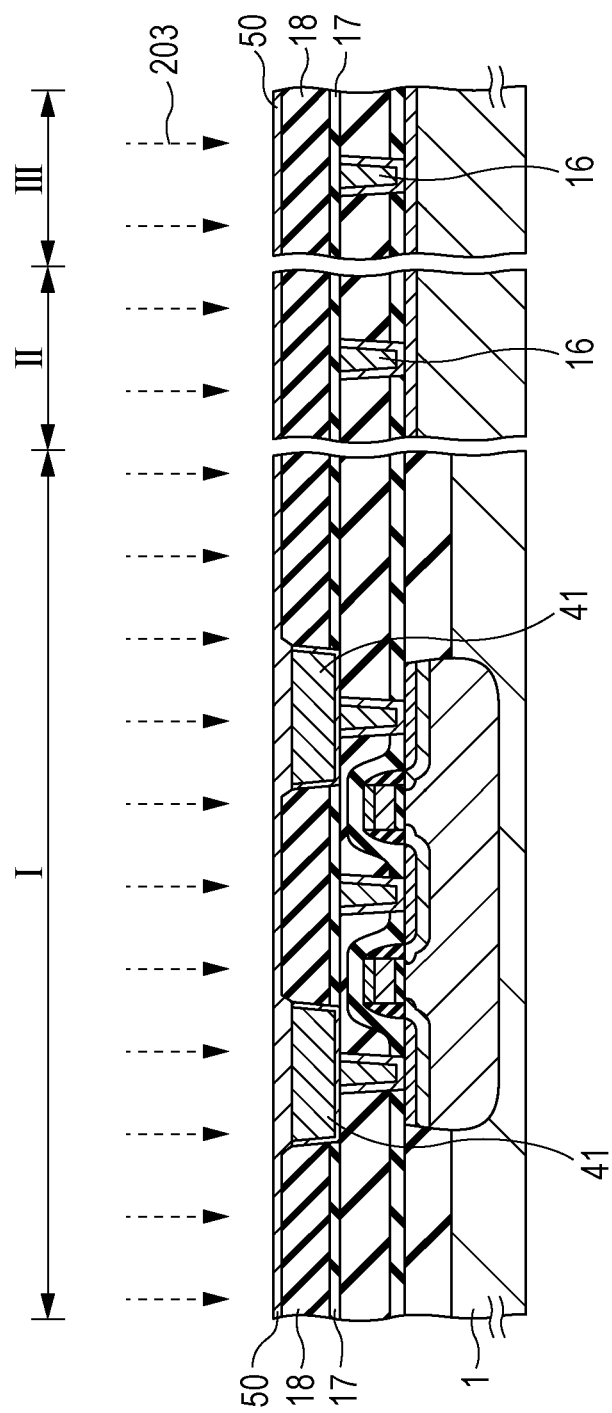
FIG. 37 is a cross-sectional view (part 6) illustrating a process of producing a semiconductor device according to the third embodiment.

Next, as illustrated in FIG. 37, the surface of the underlying conductive film 50 is exposed to NH$_3$ plasma 203, thereby bonding NH groups on the surface of the underlying conductive film 50. As for the conditions for generating the NH$_3$ plasma, for example, the same conditions as those described with reference to FIG. 34 may be used.

Figure 38:
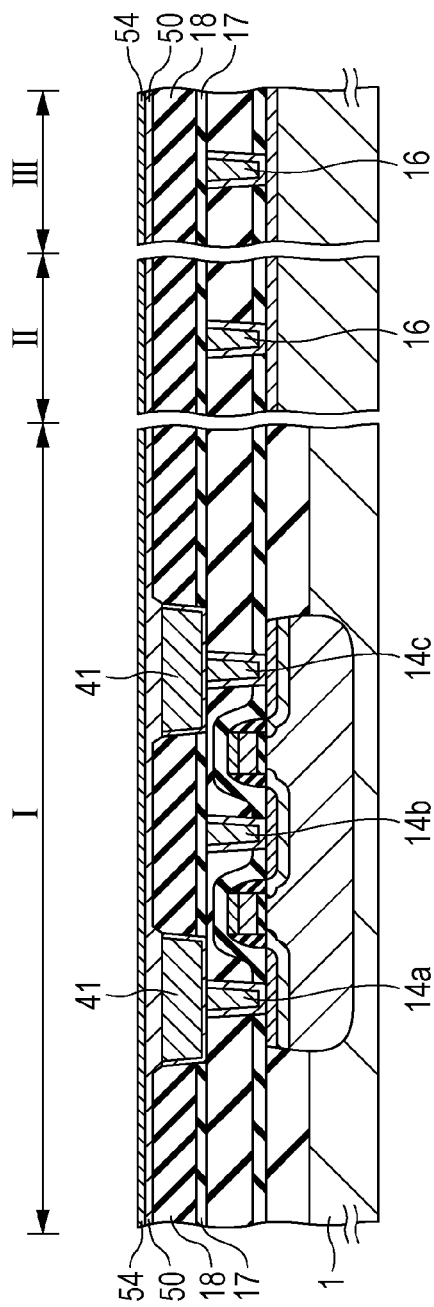
FIG. 38 is a cross-sectional view (part 7) illustrating a process of producing a semiconductor device according to the third embodiment.

Subsequently, as illustrated in FIG. 38, a titanium film is formed as a metal film 54 on the underlying conductive film 50 by a sputtering method so as to have a thickness of about 20 nm.

Since NH groups are bonded to the surface of the underlying conductive film 50 prior to this process, the titanium film becomes a high-quality film that is self-oriented in the (002) direction.

Subsequently, the metal film 54 is subjected to RTA in a nitrogen atmosphere at a substrate temperature of 650° C. for 60 seconds. Consequently, titanium, which is the material of the metal film 54, is nitrided to obtain the metal film 54 composed of titanium nitride oriented in the (111) direction.

This RTA may be conducted in a nitrogen atmosphere containing a rare gas.

Figure 39:
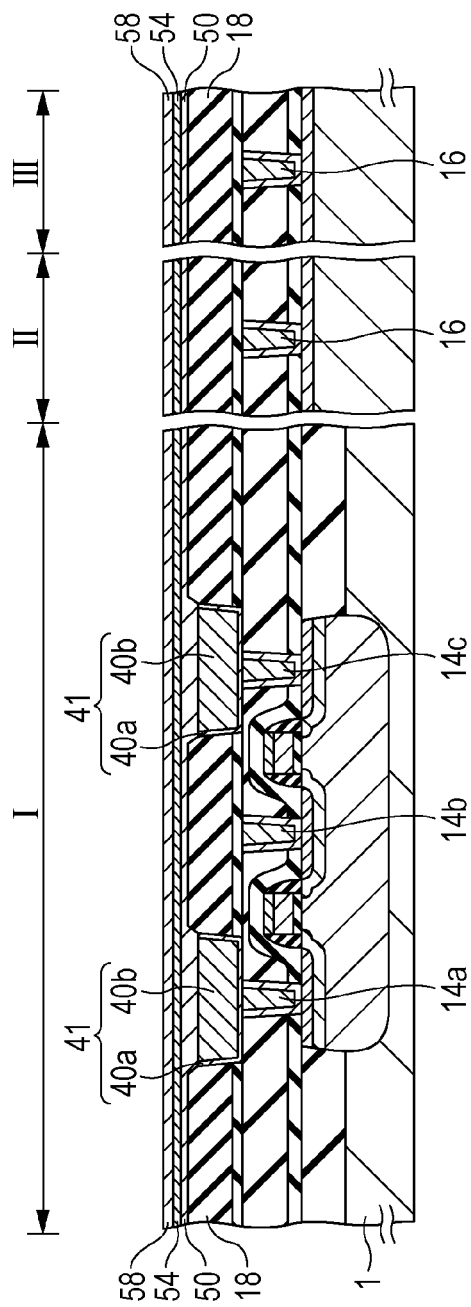
FIG. 39 is a cross-sectional view (part 8) illustrating a process of producing a semiconductor device according to the third embodiment.

Next, as illustrated in FIG. 39, a titanium aluminum nitride (TiAlN) film is formed as a conductive oxygen barrier film 58 on the metal film 54 by a reactive sputtering method so as to have a thickness of about 100 nm.

The tungsten film 40b of the conductor 41 is easily oxidized when the tungsten film 40b contacts an oxygen-containing atmosphere. However, since the conductive oxygen barrier film 58 protects the conductor 41 from oxygen in the outside atmosphere, the occurrence of contact failure due to oxidation of the conductor 41 may be suppressed.

Furthermore, since the metal film 54 under the conductive oxygen barrier film 58 is composed of titanium nitride oriented in the (111) direction, the conductive oxygen barrier film 58 exhibits a good crystal quality that conforms to the orientation.

Figure 40:
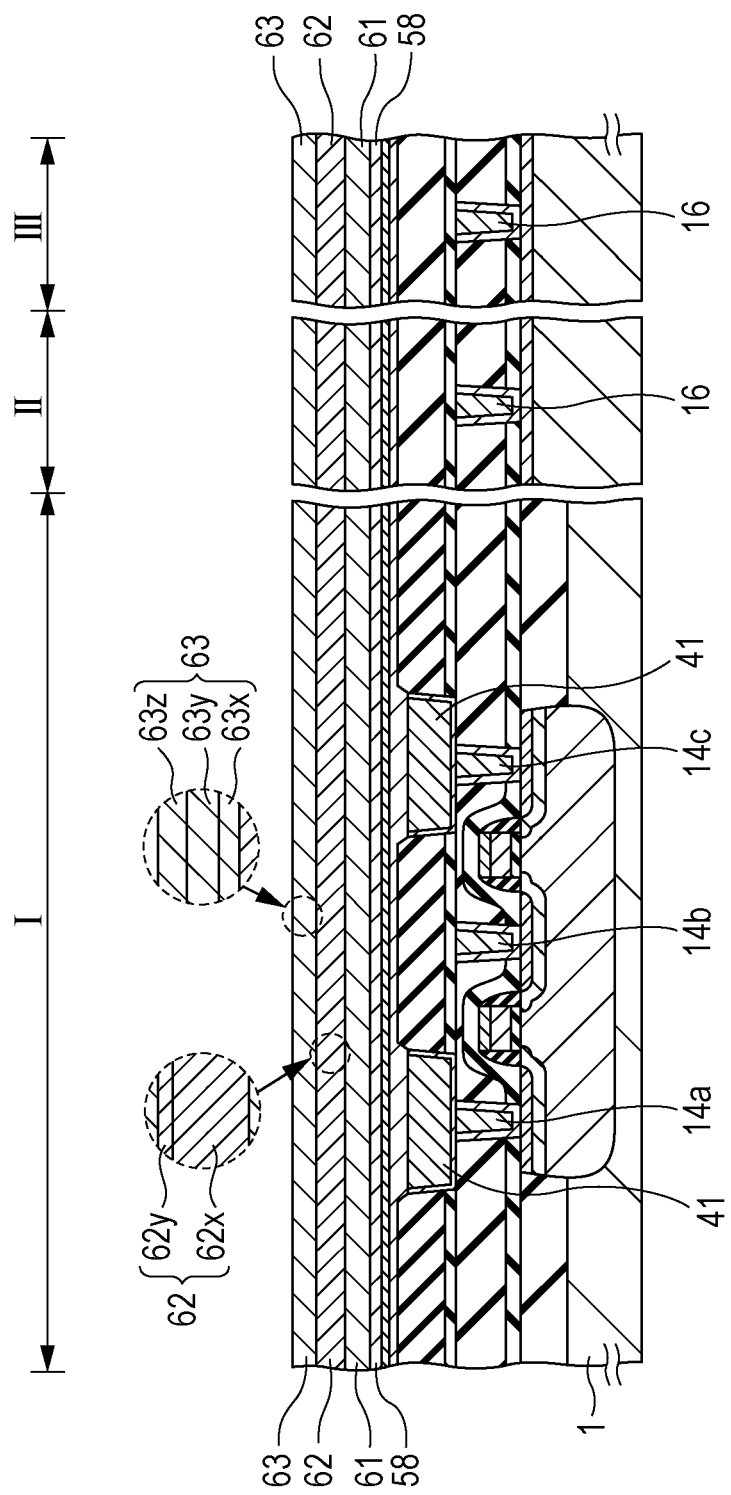
FIG. 40 is a cross-sectional view (part 9) illustrating a process of producing a semiconductor device according to the third embodiment.

Next, a process of forming the cross-sectional structure illustrated in FIG. 40 will be described.

First, an iridium film having a thickness of about 60 to 100 nm is formed on the conductive oxygen barrier film 58 by a sputtering method. The iridium film functions as a first conductive film 61. Instead of the iridium film, a SrRuO$_3$ film may be formed as the first conductive film 61.

Next, a first PZT film 62x is formed on the first conductive film 61 by an MOCVD method so as to have a thickness of 100 nm. A second PZT film 62y is then formed on the first PZT film 62x by a sputtering method so as to have a thickness of 10 nm. The first and second PZT films 62x and 62y having a multilayer structure function as a ferroelectric film 62.

In the MOCVD method in forming the first PZT film 62x, lead bis(dimethylheptanedionate) (Pb(DMHD)$_2$) is used as a liquid material of lead, and zirconium tetrakis(dimethylheptanedionate) (Zr(DMHD)$_4$) is used as a liquid material of zirconium. Titanium bis(isopropoxy) bis(dipivaloylmethanate) (Ti(O-iPr)$_2$(DPM)$_2$) may be used as a liquid material of titanium.

A first iridium oxide film 63x is formed on the ferroelectric film 62 by a sputtering method so as to have a thickness of about 25 nm, and annealing is then conducted in an oxygen-containing atmosphere so as to sufficiently crystallize the ferroelectric film 62 and to compensate for oxygen deficiency in the ferroelectric film 62. This annealing is conducted at a substrate temperature of 725° C. for 60 seconds while supplying argon gas and oxygen gas at flow rates of 2,000 sccm and 20 sccm, respectively, to the annealing atmosphere.

Furthermore, a second iridium oxide film 63y having a thickness of about 50 to 150 nm is formed on the first iridium oxide film 63x by a sputtering method.

Instead of the first iridium oxide film 63x and the second iridium oxide film 63y, a single-layer film composed of any one of iridium, ruthenium, rhodium, rhenium, osmium, and palladium or an oxide film thereof may be formed.

Furthermore, an iridium film 63z having a thickness of about 50 nm to 150 nm is formed on the second iridium oxide film 63y by a sputtering method. The first iridium oxide film 63x, the second iridium oxide film 63y, and the iridium film 63z function as a second conductive film 63.

Subsequently, PZT deposited on the reverse face of the silicon substrate 1 is removed by washing.

Figure 41:
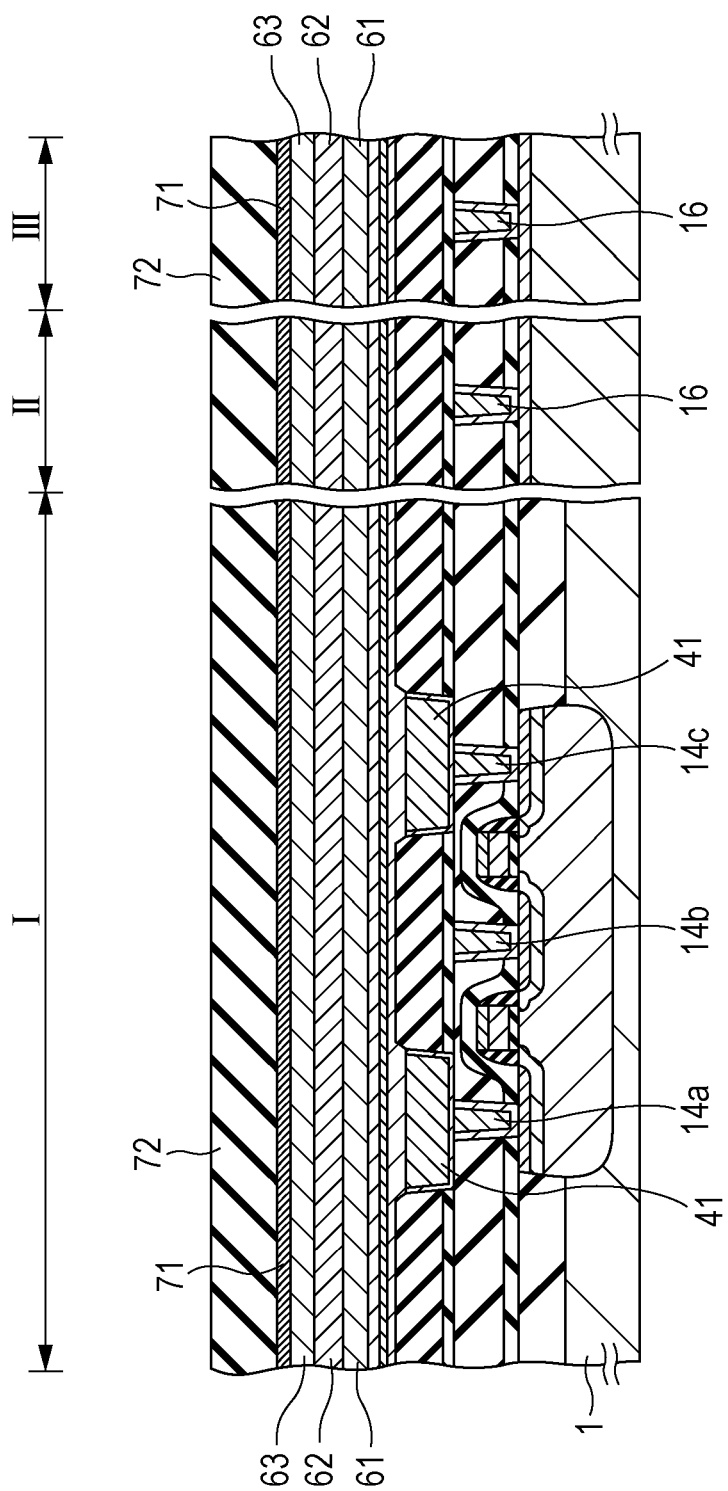
FIG. 41 is a cross-sectional view (part 10) illustrating a process of producing a semiconductor device according to the third embodiment.

Subsequently, as illustrated in FIG. 41, a titanium nitride film is formed as a first mask material film 71 on the second conductive film 63 by a sputtering method so as to have a thickness of about 200 nm. A titanium aluminum nitride film may be formed instead of the titanium nitride film.

A silicon oxide film is then formed on the first mask material film 71 by a plasma CVD method using TEOS gas so as to have a thickness of about 700 nm. This silicon oxide film functions as a second mask material film 72.

Figure 42:
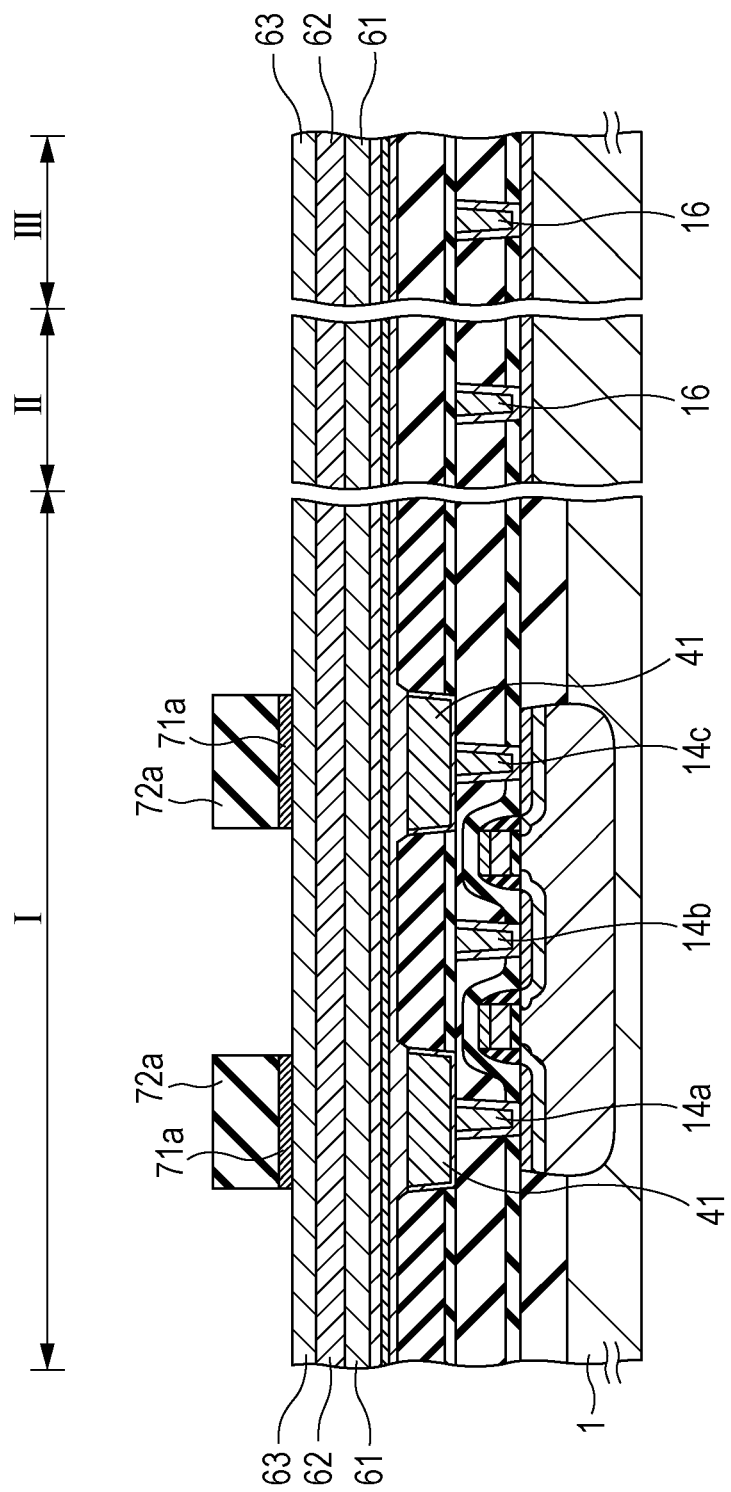
FIG. 42 is a cross-sectional view (part 11) illustrating a process of producing a semiconductor device according to the third embodiment.

Subsequently, as illustrated in FIG. 42, the second mask material film 72 is patterned to form an island-shaped upper hard mask 72a. The first mask material film 71 is then etched using the upper hard mask 72a as a mask to form a lower hard mask 71a.

Figure 43:
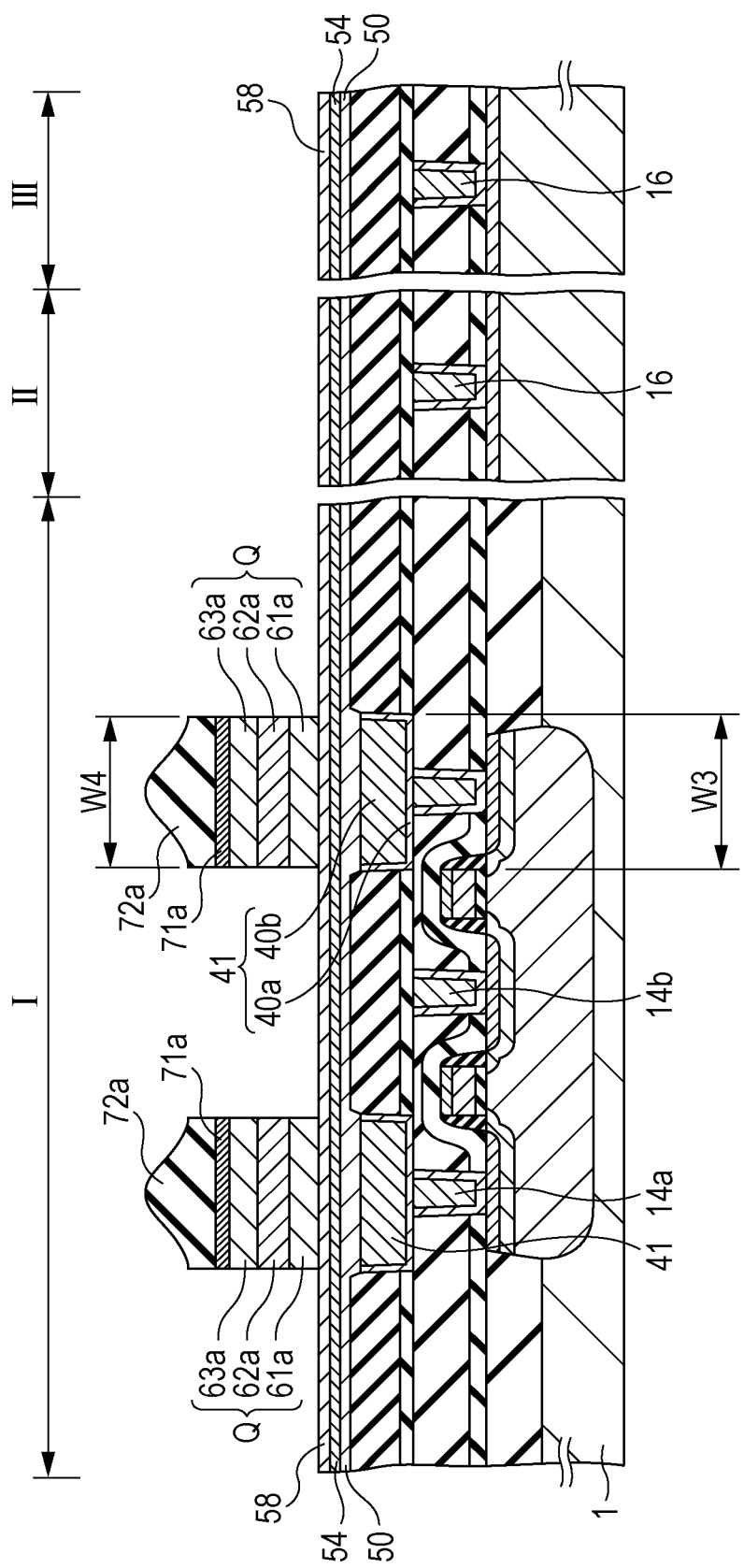
FIG. 43 is a cross-sectional view (part 12) illustrating a process of producing a semiconductor device according to the third embodiment.

Subsequently, as illustrated in FIG. 43, the first conductive film 61, the ferroelectric film 62, and the second conductive film 63 are dry-etched using the lower hard mask 71a and the upper hard mask 72a as a mask.

Consequently, a basic structure of ferroelectric capacitors Q each formed by sequentially stacking a lower electrode 61a, a capacitor dielectric film 62a, and an upper electrode 63a is obtained.

An etching gas used in the dry etching is not particularly limited. In the third embodiment, a mixed gas of HBr gas, $O_2$ gas, $C_4F_8$ gas, and Ar gas is used as the etching gas.

The conductive oxygen barrier film 58 has etching resistance to the etching gas. Accordingly, this etching is automatically stopped on the conductive oxygen barrier film 58, and the entire surface of the silicon substrate 1 is covered with the conductive oxygen barrier film 58 even after the etching.

Although the thickness of the upper hard mask 72a is somewhat reduced by this etching, the lower hard mask 71a provided under the upper hard mask 72a is not etched and the shape of the lower hard mask 71a is maintained. Accordingly, the side faces of the ferroelectric capacitors Q may be precisely finished so as to have designed dimensions.

The tungsten film 40b of the conductor 41 has a function of suppressing the incidence of gamma rays from below the substrate on the ferroelectric capacitors Q that are formed as described above. Therefore, in the patterning in this process, it is preferable that the gamma rays coming from below the substrate be effectively blocked by the tungsten film 40b by making a width W4 of the lower electrode 61a smaller than a width W3 of the tungsten film 40b of the conductor 41.

Figure 44:
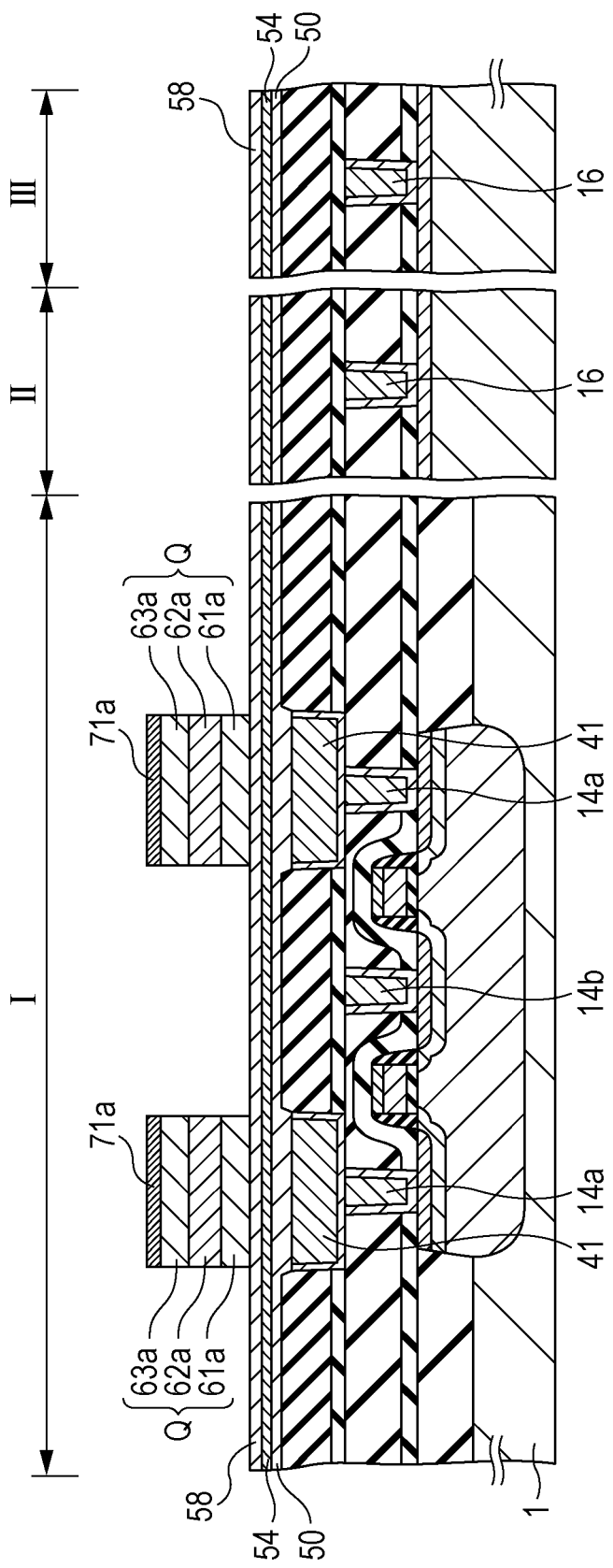
FIG. 44 is a cross-sectional view (part 13) illustrating a process of producing a semiconductor device according to the third embodiment.

Subsequently, as illustrated in FIG. 44, the upper hard mask 72a is removed by dry etching or wet etching.

Figure 45:
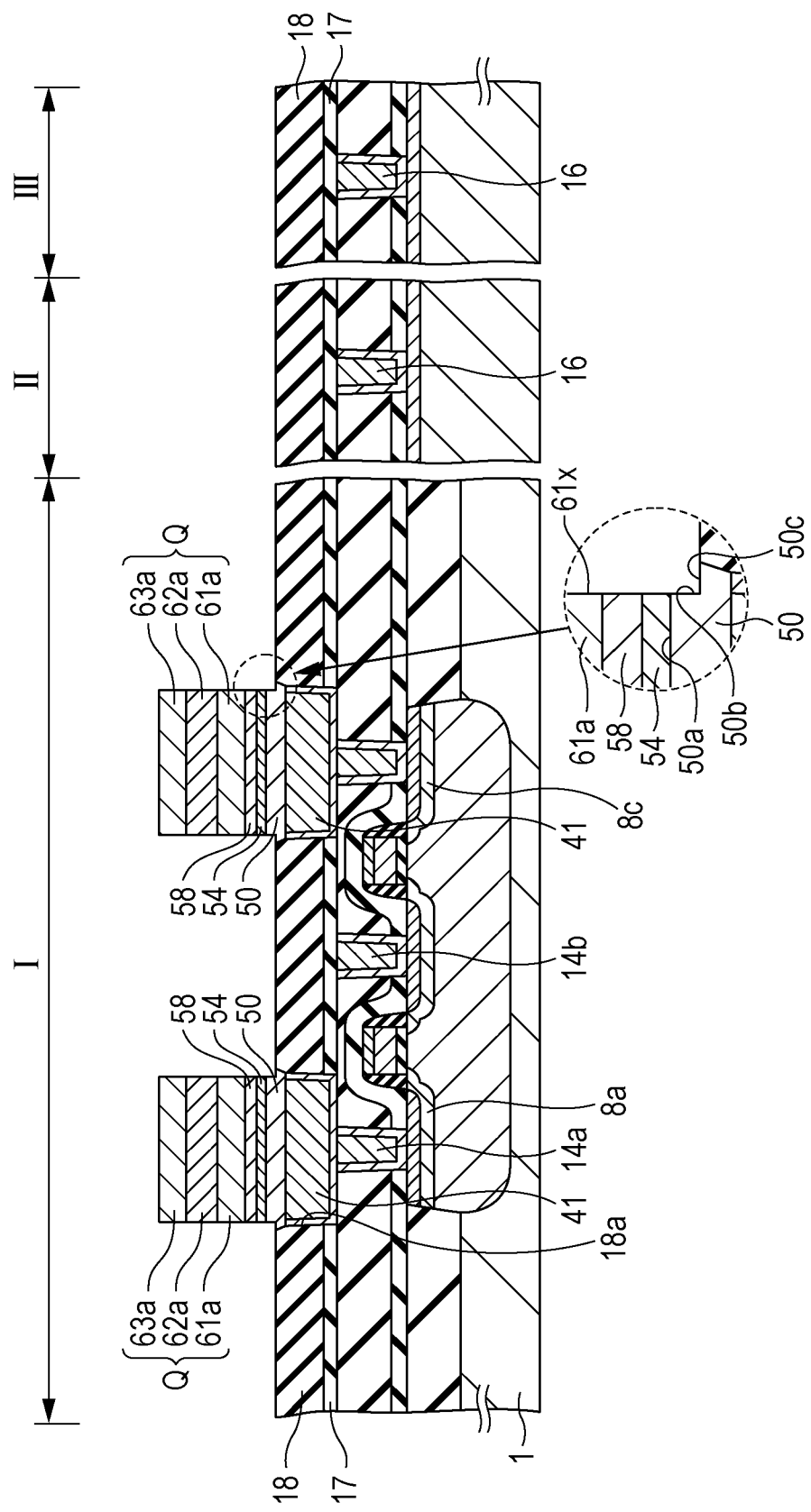
FIG. 45 is a cross-sectional view (part 14) illustrating a process of producing a semiconductor device according to the third embodiment.

Next, as illustrated in FIG. 45, portions of the underlying conductive film 50, the metal film 54, and the conductive oxygen barrier film 58, the portions not being covered with the ferroelectric capacitors Q, are removed by dry etching to electrically separate the plurality of ferroelectric capacitors Q to each other.

The lower hard mask 71a is also removed by this dry etching, and the upper surface of the upper electrode 63a is exposed.

The lower electrode 61a is electrically connected to the conductor 41 through the underlying conductive film 50, the metal film 54, and the conductive oxygen barrier film 58, all of which are left under the lower electrode 61a.

In the third embodiment, as illustrated in FIG. 43, the width W4 of the lower electrode 61a is smaller than the width W3 of the tungsten film 40b. In a reflection of this difference in the width, a difference in level is formed in the underlying conductive film 50, as illustrated in the dotted line circle in FIG. 45.

As a result, the surface of the underlying conductive film 50 has a structure in which a first upper surface 50a right under the ferroelectric capacitor Q and a second upper surface 50c extending in a horizontal direction of the substrate are connected to each other through a side face 50b. Since the dry etching in this process proceeds in a direction perpendicular to the surface of the substrate, the side face 50b of the underlying conductive film 50 is flush with a side face 61x of the lower electrode 61a, the side face 61x being located above the side face 50b.

Even after the above dry etching, the underlying conductive film 50 is left over the entire upper surface of the conductor 41. Accordingly, oxidation of tungsten of the conductor 41 due to contact with oxygen may be suppressed by the presence of the underlying conductive film 50.

A stress of the first interlayer insulating film 18 is weaker than a strong tensile stress of the tungsten of the conductor 41. Therefore, if the ferroelectric capacitor Q is formed over the conductor 41 and the first interlayer insulating film 18, a stress applied to the capacitor dielectric film 62a becomes nonuniform. In the third embodiment, since the ferroelectric capacitor Q is formed only on the conductor 41, such a problem of nonuniformity of the stress may be solved, the amount of charge induced by the stress may be made uniform in the plane of the capacitor dielectric film 62a, and distinguishability of data in the ferroelectric capacitor Q may be improved.

FIG. 55 is an enlarged plan view of the cell region I after the above-described process is performed. FIG. 45 corresponds to a cross-sectional view taken along line XLV-XLV in FIG. 55.

As illustrated in FIG. 55, the conductor 41 and the opening 18a that defines the outline of the conductor 41 are formed so as to have a size that includes the entire region of the lower electrode 61a inside thereof in plan view.

Figure 46:
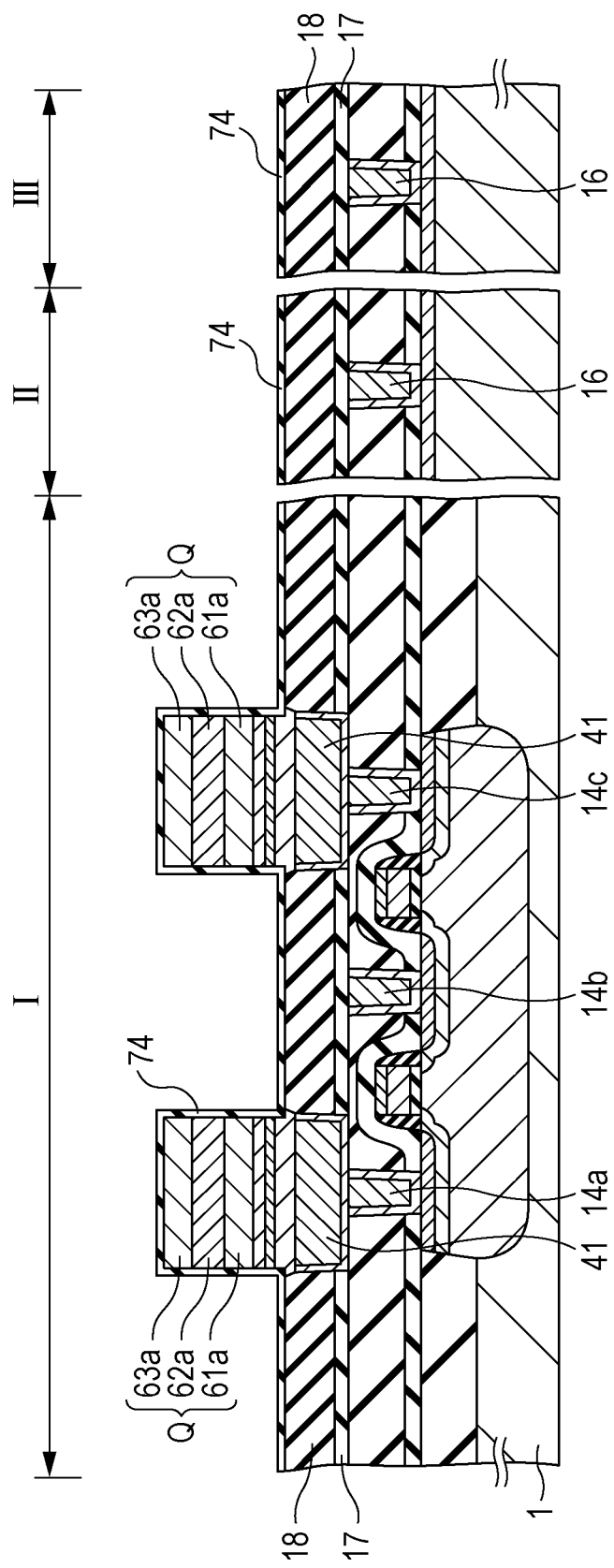
FIG. 46 is a cross-sectional view (part 15) illustrating a process of producing a semiconductor device according to the third embodiment.

Next, as illustrated in FIG. 46, an alumina film is formed as a first protective insulating film 74 on the upper surface of the first interlayer insulating film 18 and the surfaces of the ferroelectric capacitors Q by a sputtering method. The first protective insulating film 74 protects the capacitor dielectric film 62a from a reducing substance such as hydrogen.

Figure 47:
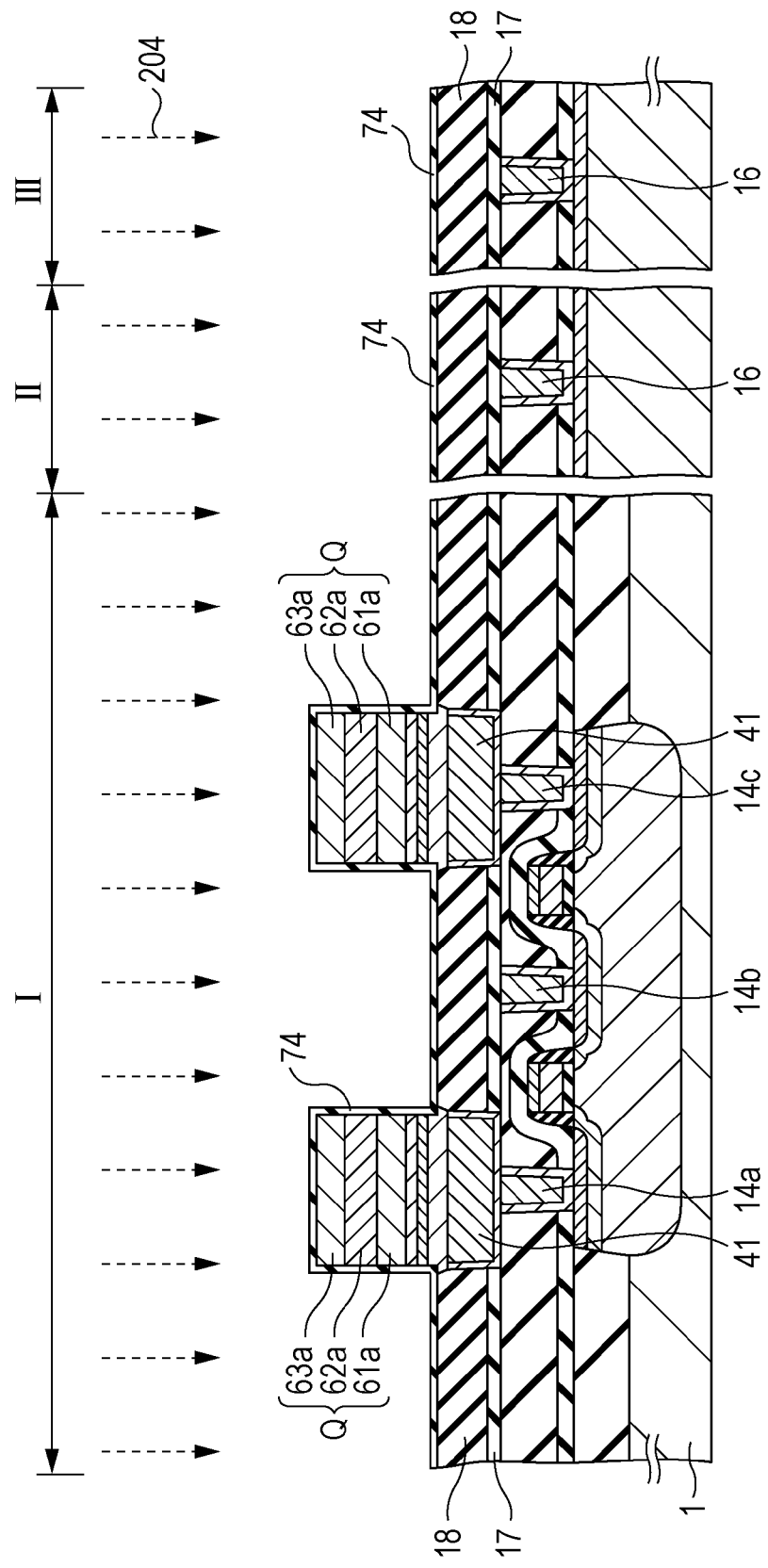
FIG. 47 is a cross-sectional view (part 16) illustrating a process of producing a semiconductor device according to the third embodiment.

Subsequently, as illustrated in FIG. 47, the capacitor dielectric film 62a is subjected to recovery annealing at a substrate temperature of 550° C. to 700° C. in an oxygen-containing atmosphere so that the capacitor dielectric film 62a recovers from damage sustained in the above process. Oxygen 204 diffuses in the capacitor dielectric film 62a during this recovery annealing.

Figure 48:
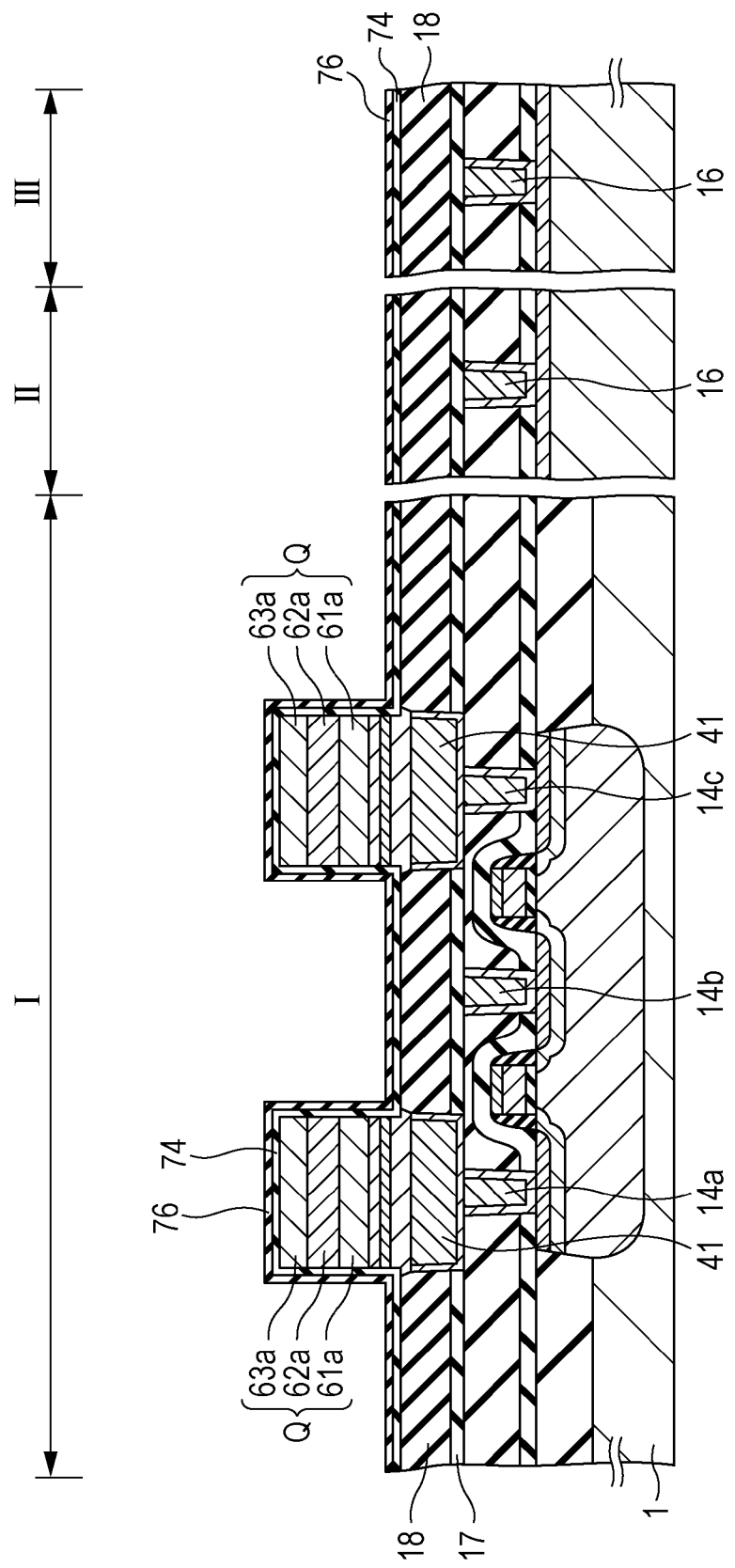
FIG. 48 is a cross-sectional view (part 17) illustrating a process of producing a semiconductor device according to the third embodiment.

Subsequently, as illustrated in FIG. 48, an alumina film having a thickness of about 38 nm is formed as a second protective insulating film 76 on the first protective insulating film 74 by an MOCVD method. The second protective insulating film 76 reinforces a barrier capability for hydrogen, which tends to be insufficient in the case where only the first protective insulating film 74 is provided, and thus may reliably protect the capacitor dielectric film 62a from hydrogen.

Figure 49:
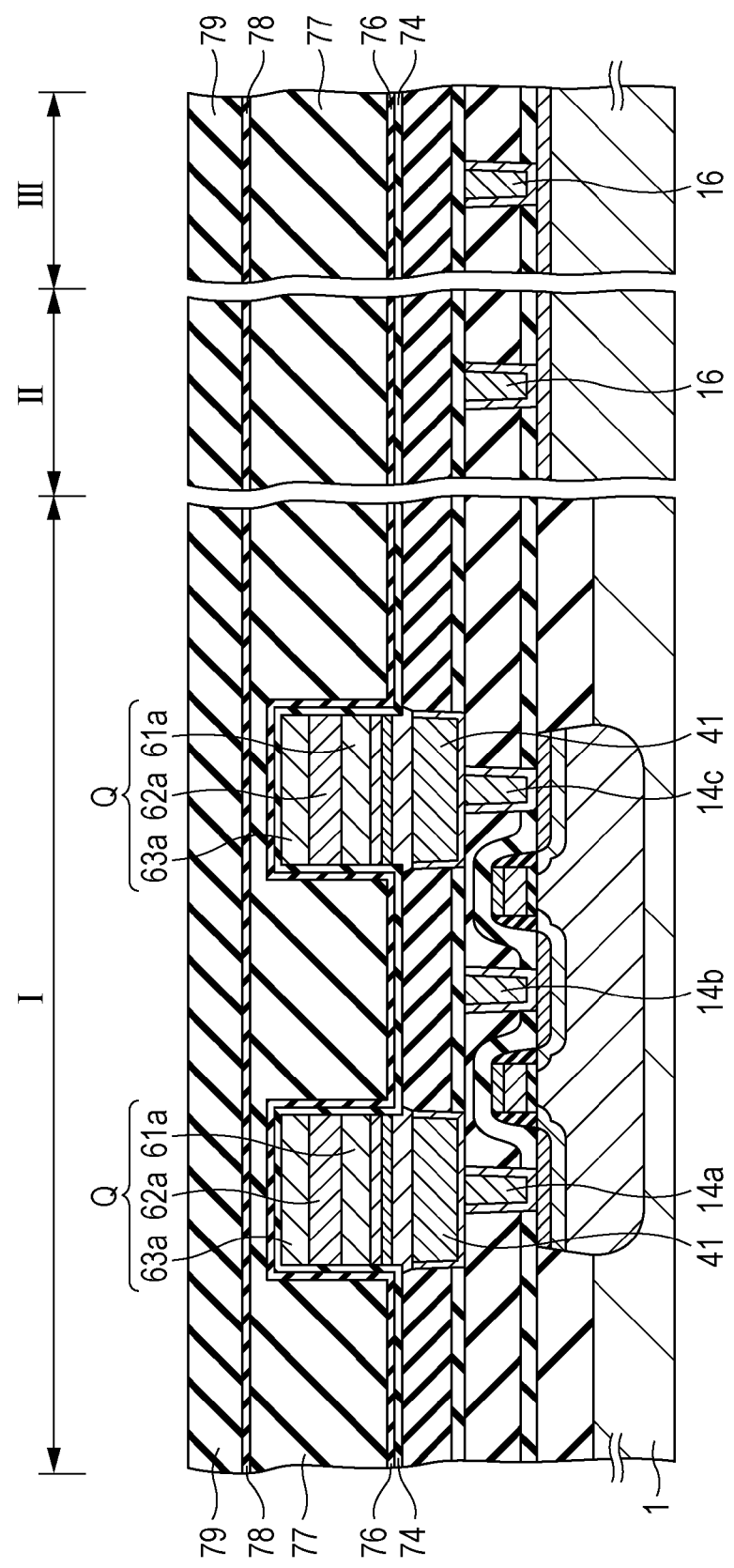
FIG. 49 is a cross-sectional view (part 18) illustrating a process of producing a semiconductor device according to the third embodiment.

Next, a process of forming the cross-sectional structure illustrated in FIG. 49 will be described.

First, a silicon oxide film is formed as a second insulating film 77 on the second protective insulating film 76 by a plasma CVD method so as to have a thickness of about 1,500 nm. For example, a mixed gas of TEOS gas, oxygen gas, and helium gas may be used as a deposition gas in the plasma CVD method.

The surface of the second insulating film 77 is planarized by a CMP method, and the second insulating film 77 is then annealed in a plasma atmosphere of nitrous oxide ($N_2O$) gas or nitrogen gas. Thus, the second insulating film 77 is dehydrated, and the surface of the second insulating film 77 is nitrided to suppress readsorption of moisture.

Next, an alumina film is formed on the second insulating film 77 by a sputtering method so as to have a thickness of about 20 to 100 nm. This alumina film functions as a third protective insulating film 78. Similarly to the first protective insulating film 74 and the second protective insulating film 76, the third protective insulating film 78 has a function of protecting the capacitor dielectric film 62a from a reducing substance such as hydrogen.

The third protective insulating film 78 may be formed by a CVD method instead of the sputtering method.

A silicon oxide film is formed as a second interlayer insulating film 79 on the third protective insulating film 78 by a plasma CVD method using TEOS gas so as to have a thickness of about 250 nm.

Figure 50:
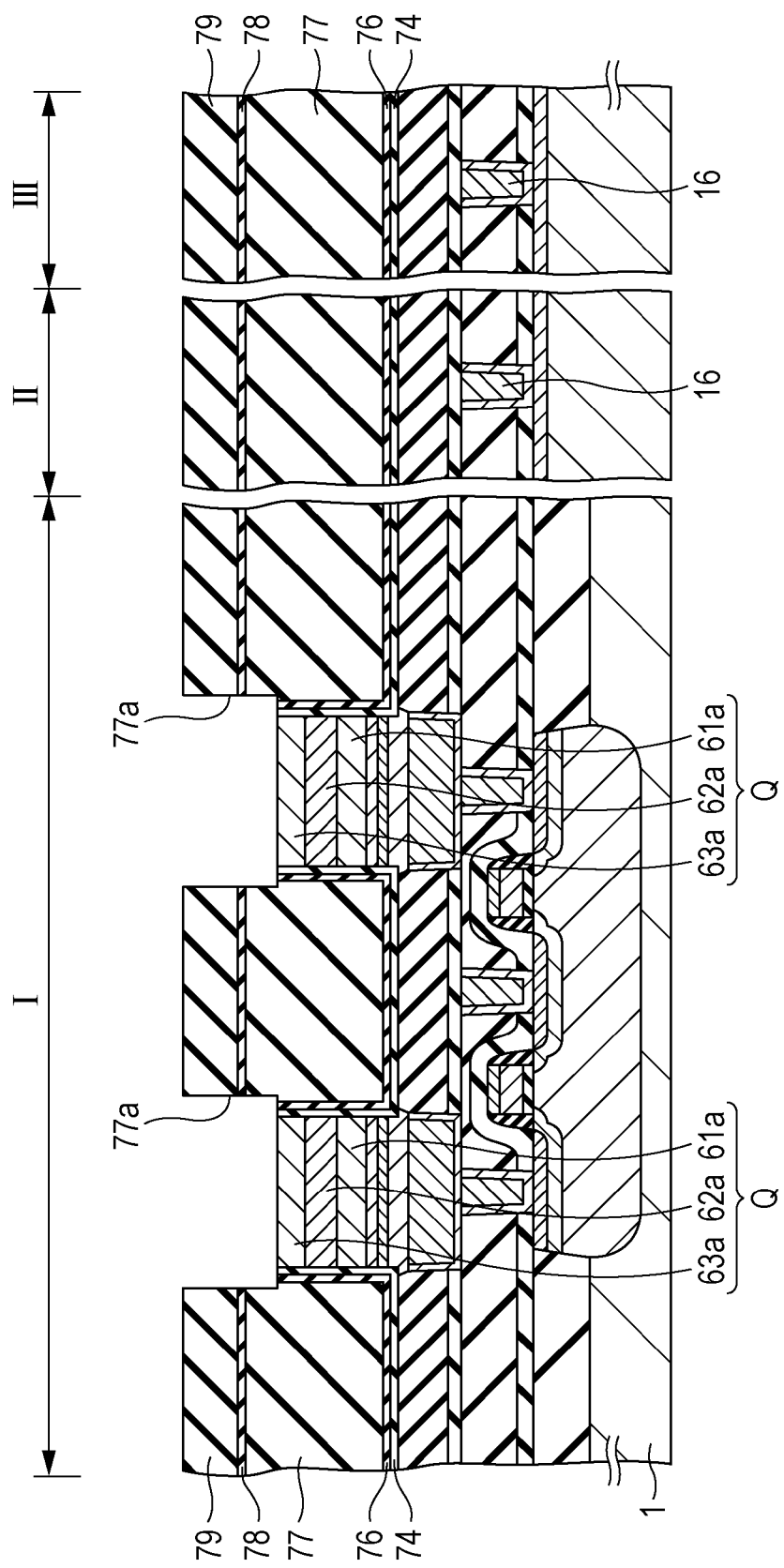
FIG. 50 is a cross-sectional view (part 19) illustrating a process of producing a semiconductor device according to the third embodiment.

Subsequently, as illustrated in FIG. 50, films ranging from the second interlayer insulating film 79 to the first protective insulating film 74 are patterned by photolithography and dry etching to form first holes 77a on the ferroelectric capacitors Q.

An etching gas used in this dry etching is not particularly limited. For example, a mixed gas of $C_4F_8$, Ar, $O_2$, and CO may be used as the etching gas.

Figure 51:
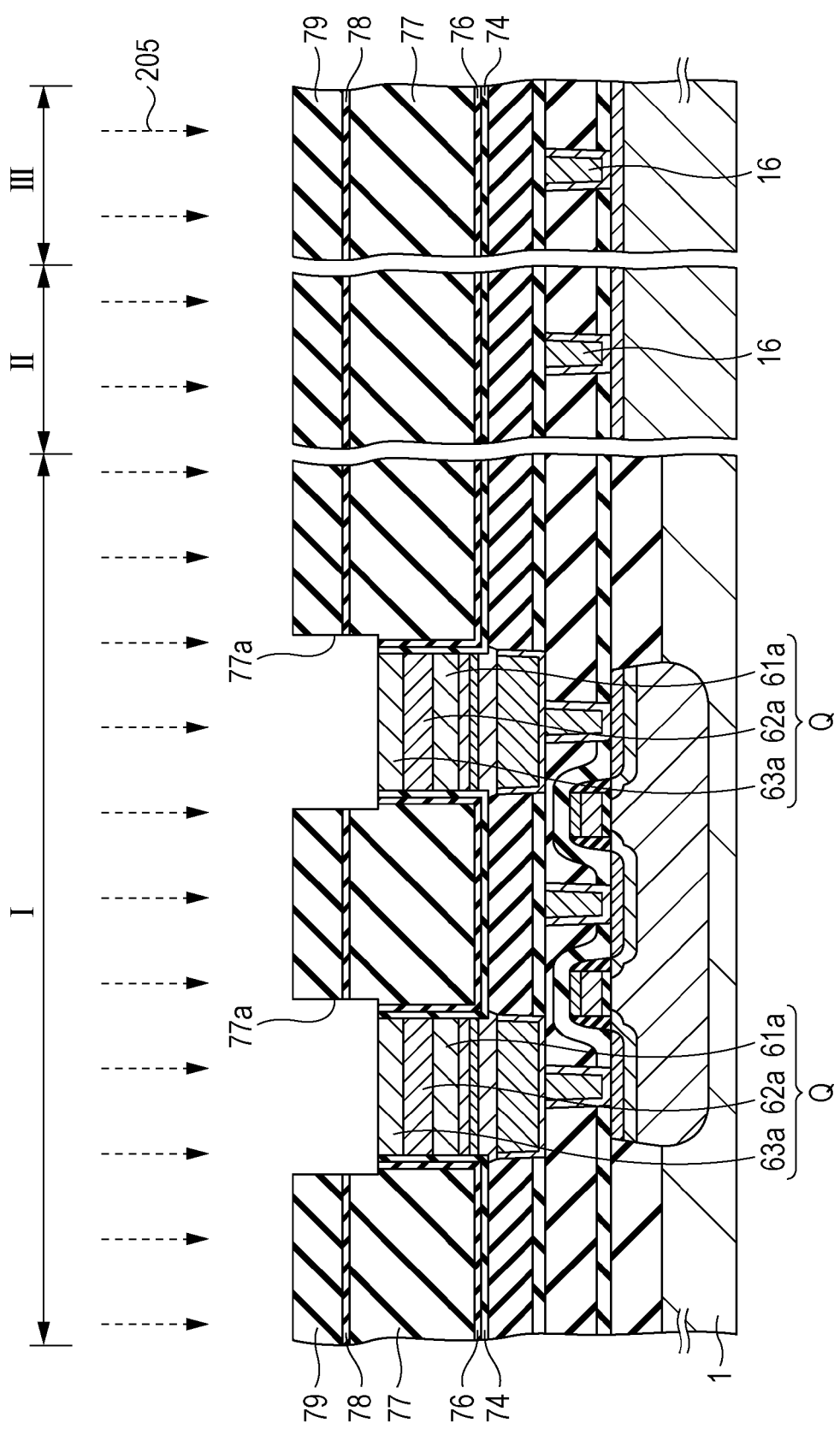
FIG. 51 is a cross-sectional view (part 20) illustrating a process of producing a semiconductor device according to the third embodiment.

Next, as illustrated in FIG. 51, annealing is performed on the second insulating film 77 in an oxygen-containing atmosphere at a substrate temperature of 500° C. for 60 minutes so that moisture contained in the second insulating film 77 is released to the outside through the first holes 77a. During this annealing, oxygen 205 diffuses into the ferroelectric capacitors Q through the first holes 77a.

In the third embodiment, since each of the first holes 77a is formed so as to be larger than the corresponding upper electrode 63a as in the first embodiment, moisture in the second insulating film 77 is immediately released to the outside through the first holes 77a and thus the effect of dehydration by annealing may be increased.

Figure 52:
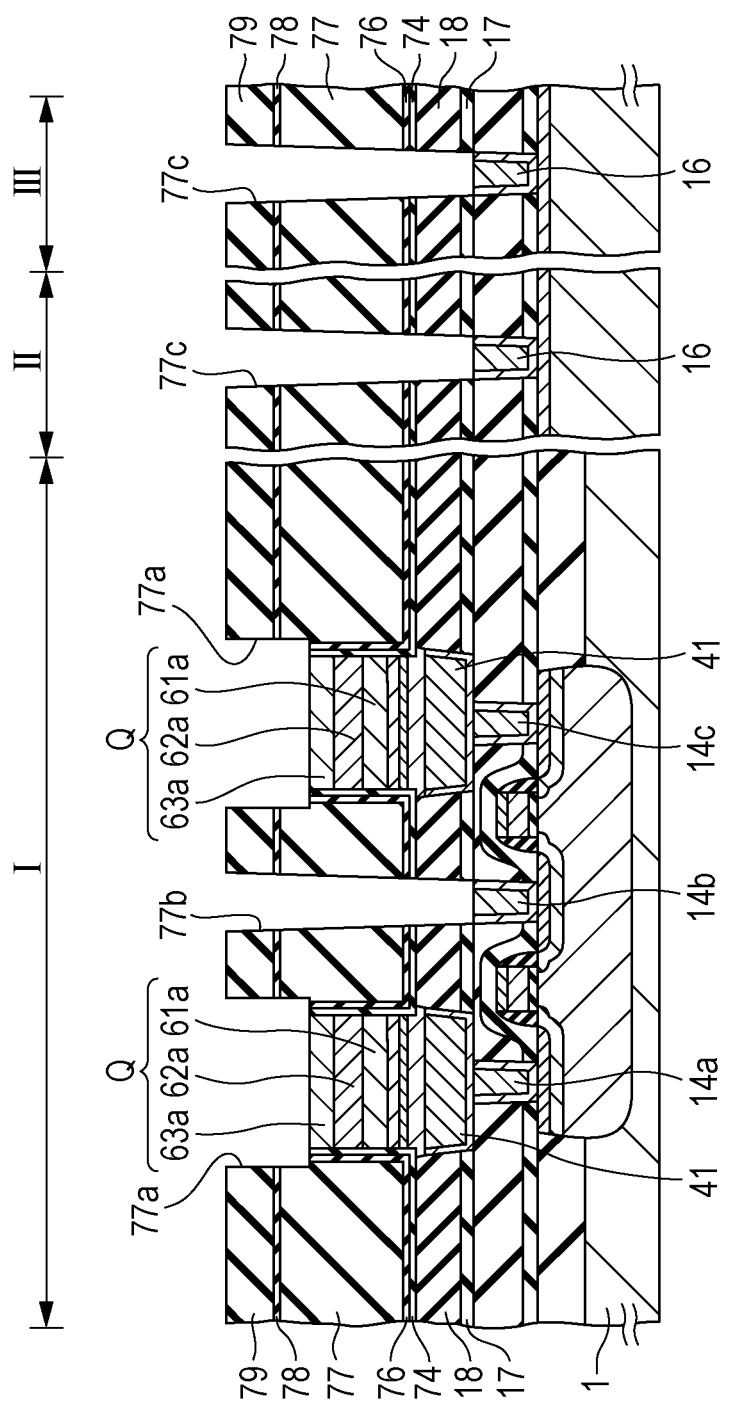
FIG. 52 is a cross-sectional view (part 21) illustrating a process of producing a semiconductor device according to the third embodiment.

Subsequently, as illustrated in FIG. 52, a multilayer insulating film ranging from the second interlayer insulating film 79 to the first antioxidation insulating film 17 is patterned by photolithography and dry etching.

By this patterning, in the cell region I, a second hole 77b is formed on the second contact plug 14b. In each of the cell peripheral portion II and the chip peripheral portion III, a third hole 77c is formed on the lower ring 16.

An etching gas used in the above dry etching is not particularly limited. In the third embodiment, a mixed gas of $C_4F_8$, Ar, $O_2$, and CO is used as the etching gas of the first interlayer insulating film 18, the first protective insulating film 74, the second protective insulating film 76, the second insulating film 77, the third protective insulating film 78, and the second interlayer insulating film 79. The first antioxidation insulating film 17 is removed by sputter etching using argon gas.

Next, a process of forming the cross-sectional structure illustrated in FIG. 53 will be described.

First, a single-layer titanium nitride film is formed as a conductive adhesion film 91a on the inner surfaces of the first to third holes 77a to 77c and the upper surface of the second interlayer insulating film 79 by a sputtering method so as to have a thickness of about 50 to 100 nm.

Next, a tungsten film 91b is formed on the adhesion film 91a by a CVD method using hydrogen gas and tungsten hexafluoride gas as a deposition gas. Each of the first to third holes 77a to 77c is filled with the tungsten film 91b.

In this case, since the first hole 77a is formed so as to be larger than the upper electrode 63a, a growth line 91x of the adhesion film 91a is located on a side of the upper electrode 63a, as illustrated in the dotted line circle.

Accordingly, as in the first embodiment, it is possible to reduce the risk that hydrogen gas used in the deposition of the tungsten film 91b passes through the growth line 91x and reaches the upper electrode 63a and to suppress a decrease in the volume of the upper electrode 63a, the decrease being due to reduction of iridium oxide of the upper electrode 63a by hydrogen.

The substrate temperature during the formation of the tungsten film 91b is determined in accordance with the magnitude of a stress desired for the tungsten film 91b. The substrate temperature is preferably, for example, about 350° C. to 400° C.

Subsequently, unwanted portions of the adhesion film 91a and the tungsten film 91b on the second interlayer insulating film 79 are removed by a CMP method so that the adhesion film 91a and the tungsten film 91b are left only in the first to third holes 77a to 77c.

The adhesion film 91a and the tungsten film 91b that are left in the first holes 77a function as a first conductor plug 92. The adhesion film 91a and the tungsten film 91b that are left in the second hole 77b functions as a second conductor plug 93.

The adhesion film 91a and the tungsten film 91b that are left in the third holes 77c in the cell peripheral portion II and the chip peripheral portion III function as upper rings 94.

The upper ring 94 and the lower ring 16 that are formed in the cell peripheral portion II form a conductor ring 37.

The upper ring 94 and the lower ring 16 that are formed in the chip peripheral portion III form a moisture-resistant ring 38.

Figure 53:
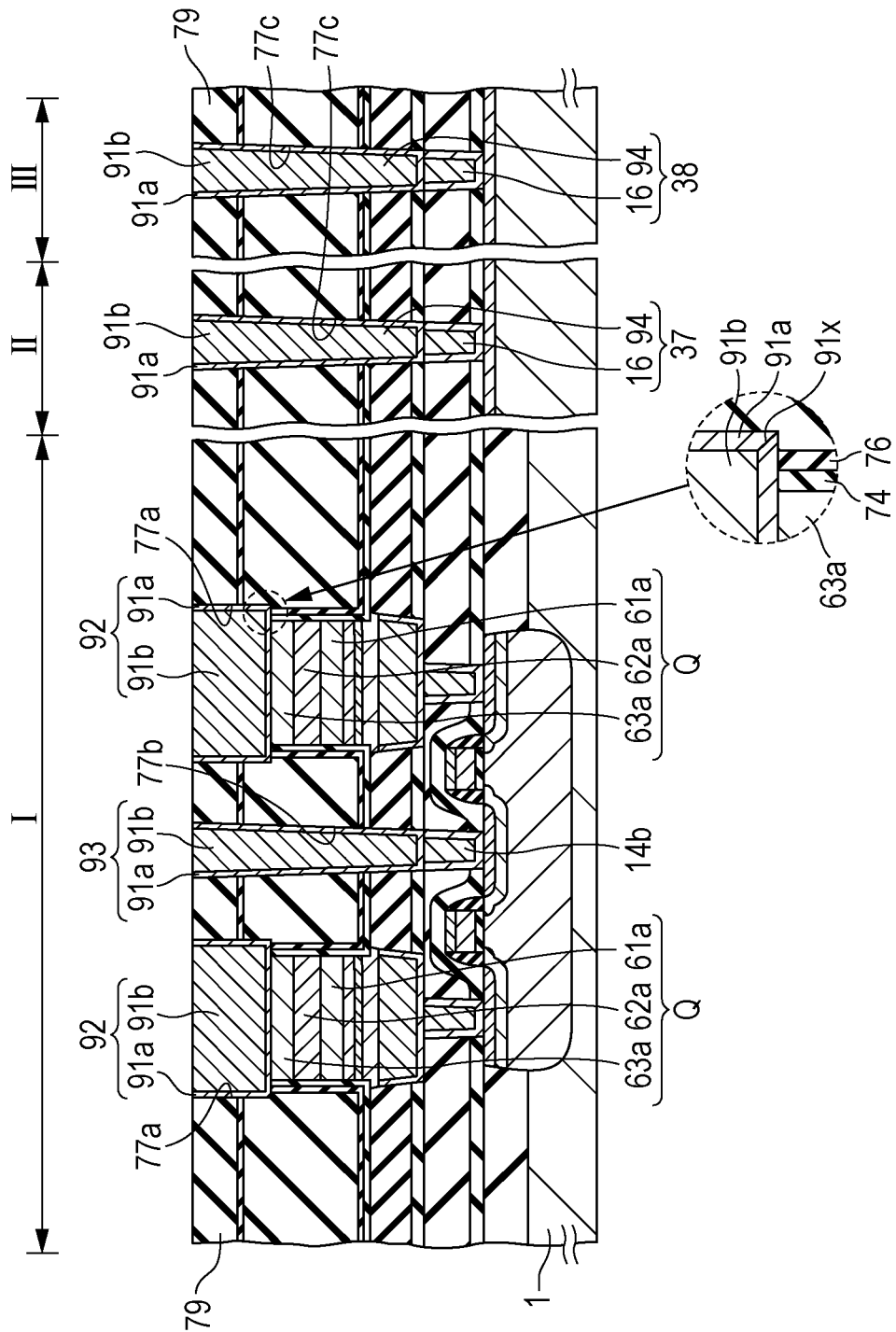
FIG. 53 is a cross-sectional view (part 22) illustrating a process of producing a semiconductor device according to the third embodiment.

FIG. 56 is an enlarged plan view of the cell region I after the process of forming the cross-sectional structure illustrated in FIG. 53 is completed. FIG. 53 corresponds to a cross-sectional view taken along line LIII-LIII in FIG. 56.

As illustrated in FIG. 56, a plurality of first conductor plugs 92 are formed so as to correspond to the upper electrodes 63a. Each of the first conductor plugs 92 and the corresponding first hole 77a that defines the outline of the first conductor plug 92 are formed so as to have a size that includes the entire region of the upper electrode 63a inside thereof in plan view.

Figure 54:
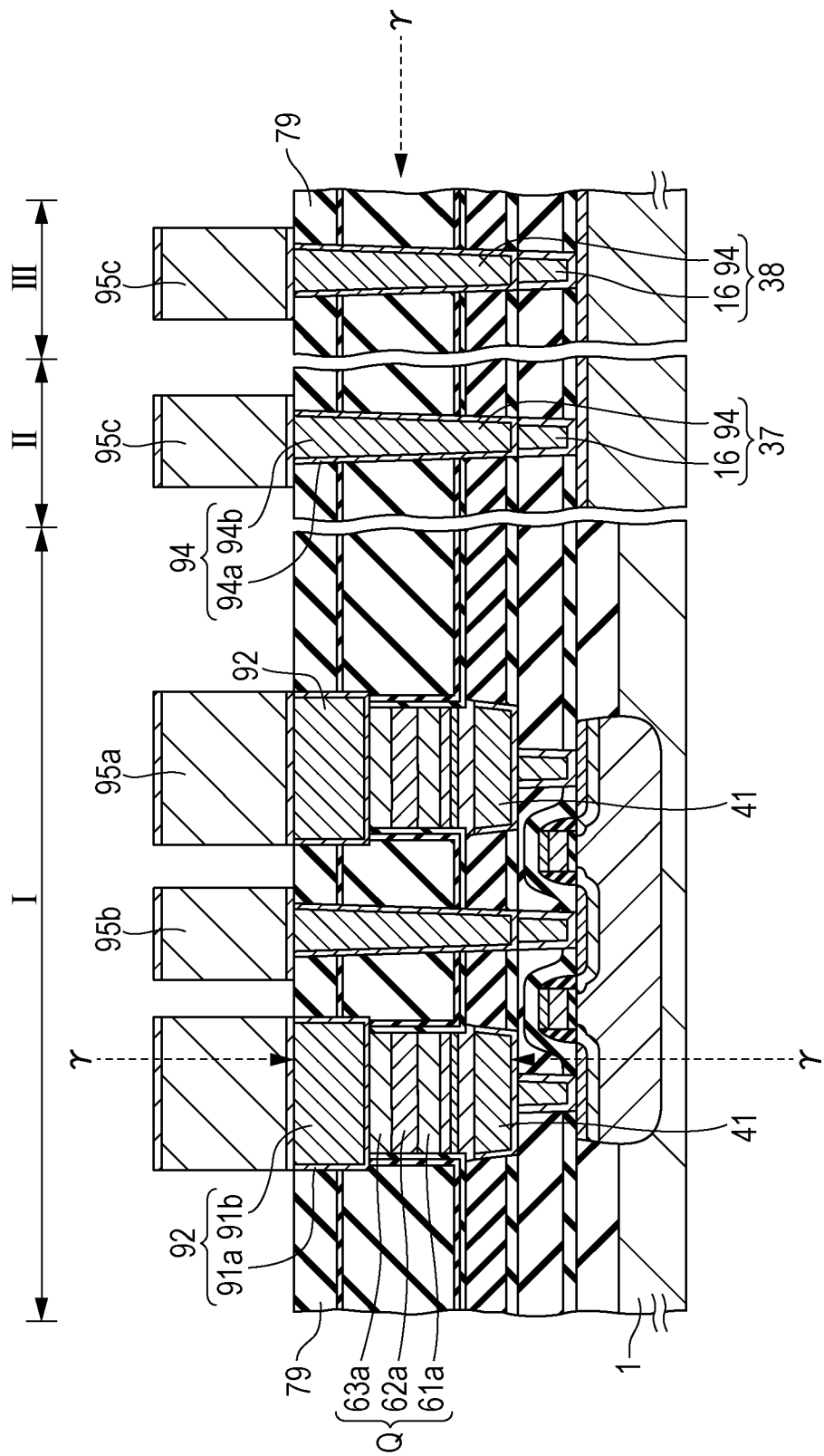
FIG. 54 is a cross-sectional view (part 23) illustrating a process of producing a semiconductor device according to the third embodiment.

Next, as illustrated in FIG. 54, after a multilayer metal film is formed over the upper surface of the silicon substrate 1, then the multilayer metal film is patterned to form a first metal wiring 95a, a first conductive pad 95b, and a second conductive pad 95c.

For example, the multilayer metal film is formed by depositing a titanium film having a thickness of 60 nm, a titanium nitride film having a thickness of 30 nm, a copper-containing aluminum film having a thickness of 360 nm, a titanium film having a thickness of 5 nm, and a titanium nitride film having a thickness of 70 nm in that order by a sputtering method.

Through the above process, a basic structure of the semiconductor device according to the third embodiment is formed.

According to the semiconductor device of the third embodiment, as illustrated in FIG. 56, the first conductor plug 92 is formed so as to cover the entire region of the upper electrode 63a in plan view. Accordingly, most of the radiation such as gamma rays γ coming from above the silicon substrate 1 toward the capacitor dielectric film 62a may be blocked by the tungsten film 91b of the first conductor plug 92. Thus, the radiation resistance of the semiconductor device may be improved.

In addition, since the conductor 41 is larger than the lower electrode 61a in plan view, most of the gamma rays γ coming from below the silicon substrate 1 toward the capacitor dielectric film 62a may be blocked by the tungsten film 40b of the conductor 41. Thus, the radiation resistance of the semiconductor device may be further improved.

The gamma rays γ coming from a lateral direction of the substrate toward the ferroelectric capacitor Q may be blocked by the tungsten film 91b of the conductor ring 37.

Fourth Embodiment

In the third embodiment, the first metal wiring 95a is formed using the multilayer metal film including an aluminum film.

In contrast, in a fourth embodiment, wiring is formed using a damascene process, which is useful for forming copper wiring.

FIGS. 57 to 65 are cross-sectional views each illustrating a process of producing a semiconductor device according to the fourth embodiment. In FIGS. 57 to 65, the same components as those described in the third embodiment are assigned the same reference numerals as those in the third embodiment, and a description of the components is omitted.

Figure 57:
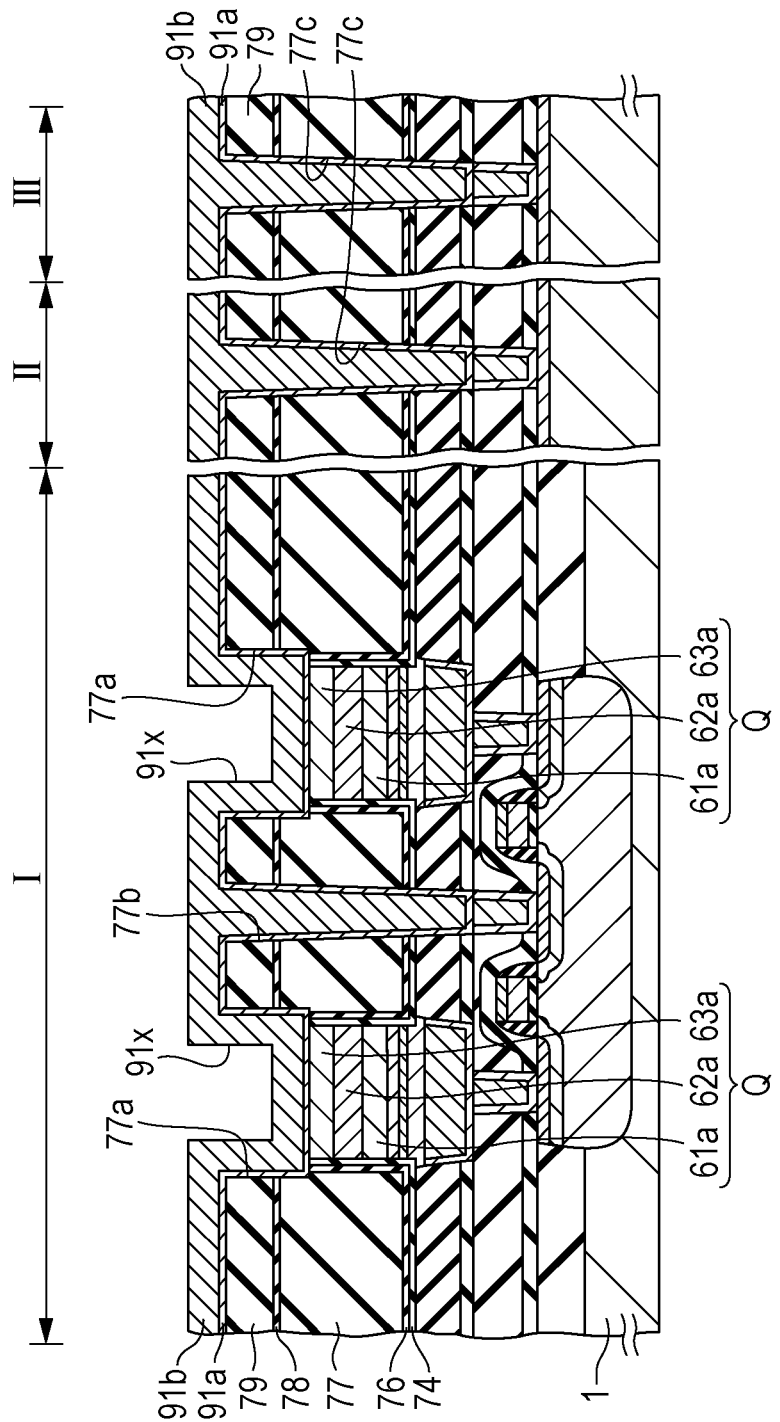
FIG. 57 is a cross-sectional view (part 1) illustrating a process of producing a semiconductor device according to a fourth embodiment.

First, a process of forming the cross-sectional structure illustrated in FIG. 57 will be described.

First, in accordance with the process illustrated in FIGS. 32A to 52 of the third embodiment, the structure in which the first to third holes 77a to 77c are formed in the second interlayer insulating film 79 is formed.

Next, as in the third embodiment, an adhesion film 91a and a tungsten film 91b are formed on the upper surface of the second interlayer insulating film 79 and on the inner surfaces of the first to third holes 77a to 77c in that order.

However, in the fourth embodiment, the first hole 77a is not completely filled with the tungsten film 91b. A recess 91x that reflects the shape of the first hole 77a is formed in the upper surface of the tungsten film 91b.

On the other hand, the second hole 77b and the third holes 77c are completely filled with the tungsten film 91b.

In order to form the structure in which the second hole 77b and the third holes 77c are completely filled with the tungsten film 91b and the first hole 77a is not completely filled with the tungsten film 91b, the tungsten film 91b is formed so as to have a thickness of about 250 to 350 nm.

Figure 58:
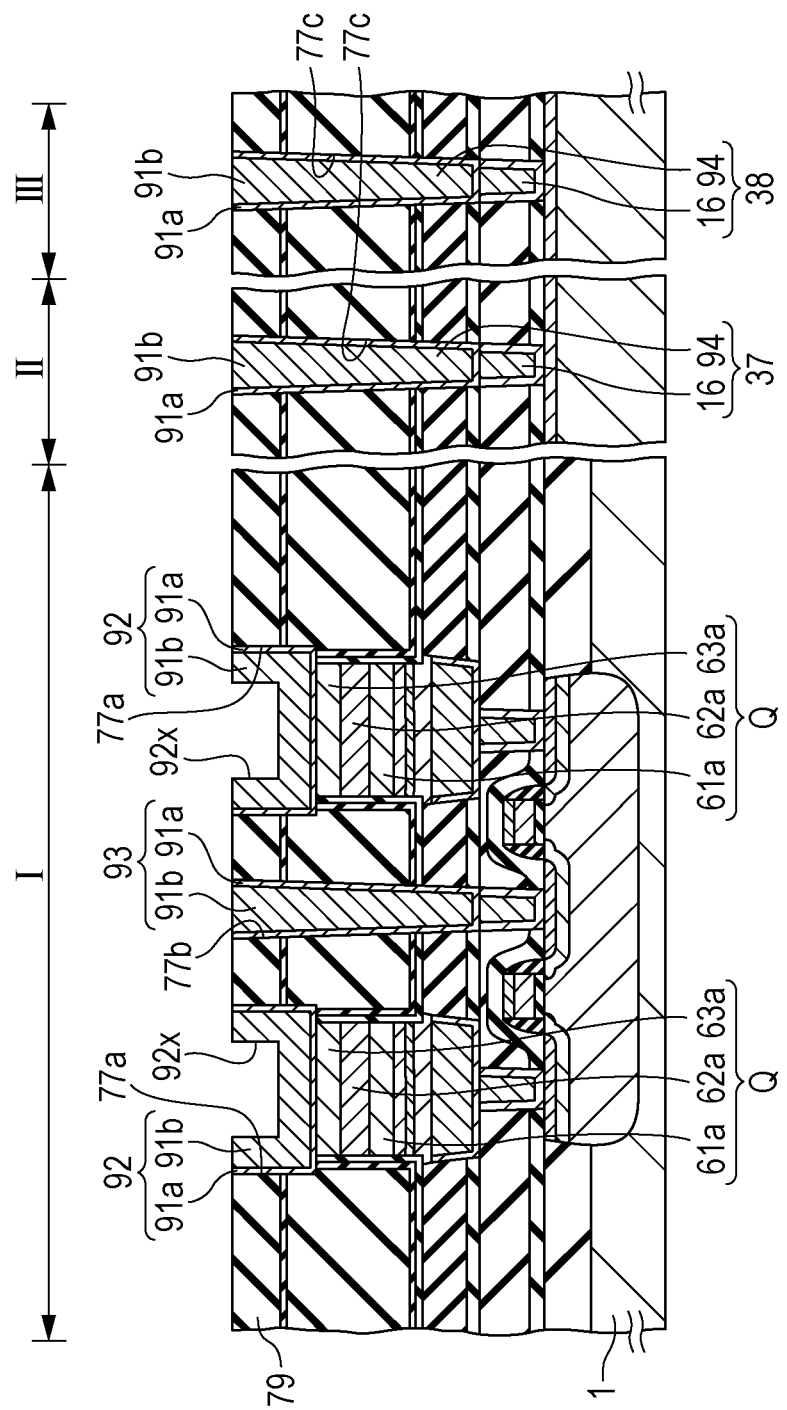
FIG. 58 is a cross-sectional view (part 2) illustrating a process of producing a semiconductor device according to the fourth embodiment.

Next, as illustrated in FIG. 58, unwanted portions of the adhesion film 91a and the tungsten film 91b on the second interlayer insulating film 79 are removed by CMP.

Accordingly, as in the third embodiment, a first conductor plug 92 and a second conductor plug 93 are respectively formed in the first hole 77a and the second hole 77b.

In the upper surface of the first conductor plug 92, a recess 92x is formed as described above.

An upper ring 94 serving as a part of a conductor ring 37 is formed in the third hole 77c of the cell peripheral portion II. An upper ring 94 serving as a part of a moisture-resistant ring 38 is formed in the third hole 77c of the chip peripheral portion III.

Figure 59:
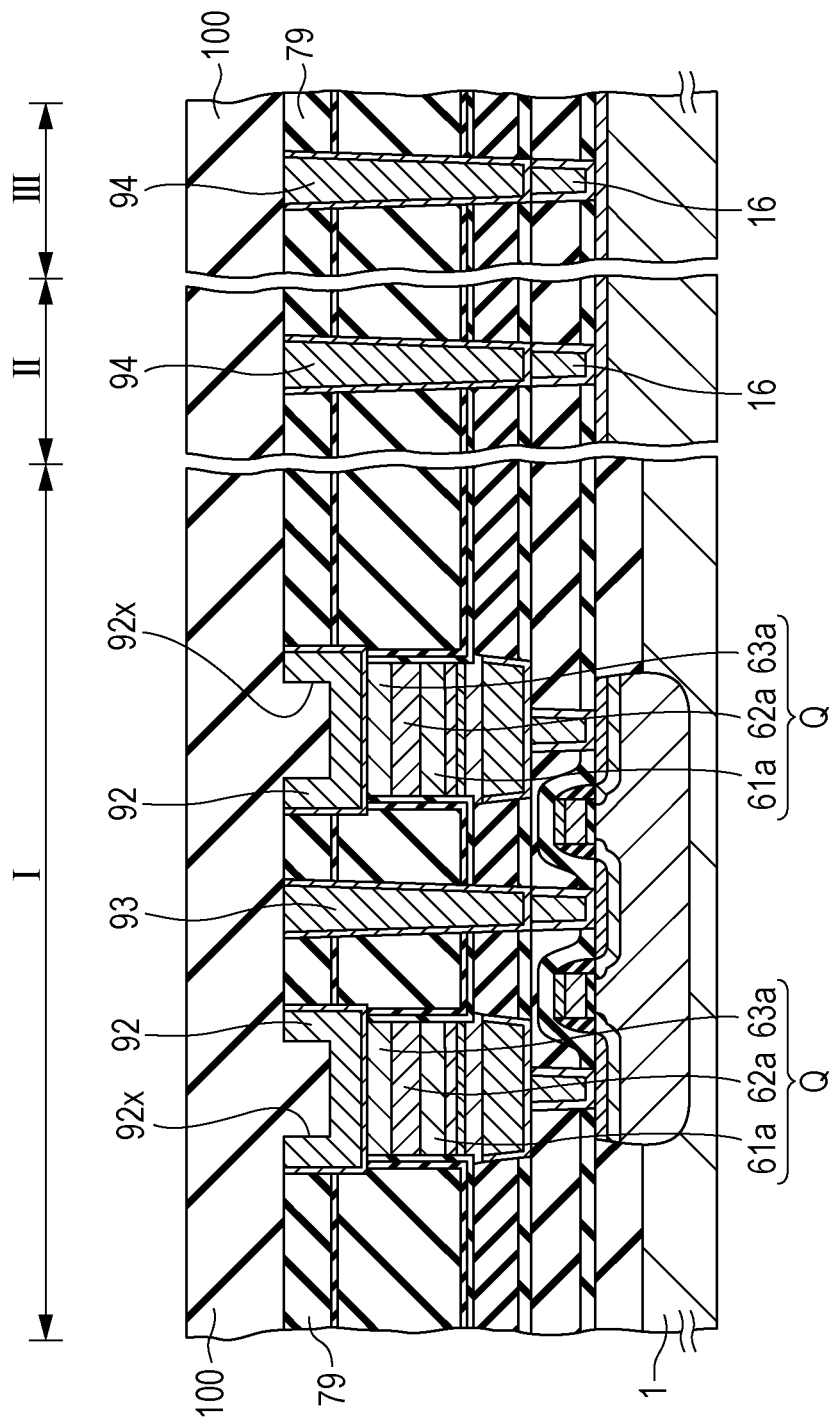
FIG. 59 is a cross-sectional view (part 3) illustrating a process of producing a semiconductor device according to the fourth embodiment.

Subsequently, as illustrated in FIG. 59, a silicon oxide film is formed as a third insulating film 100 on the second interlayer insulating film 79, the first conductor plug 92, the second conductor plug 93, and the upper rings 94 by a plasma CVD method using TEOS gas so as to have a thickness of about 300 nm.

Figure 60:
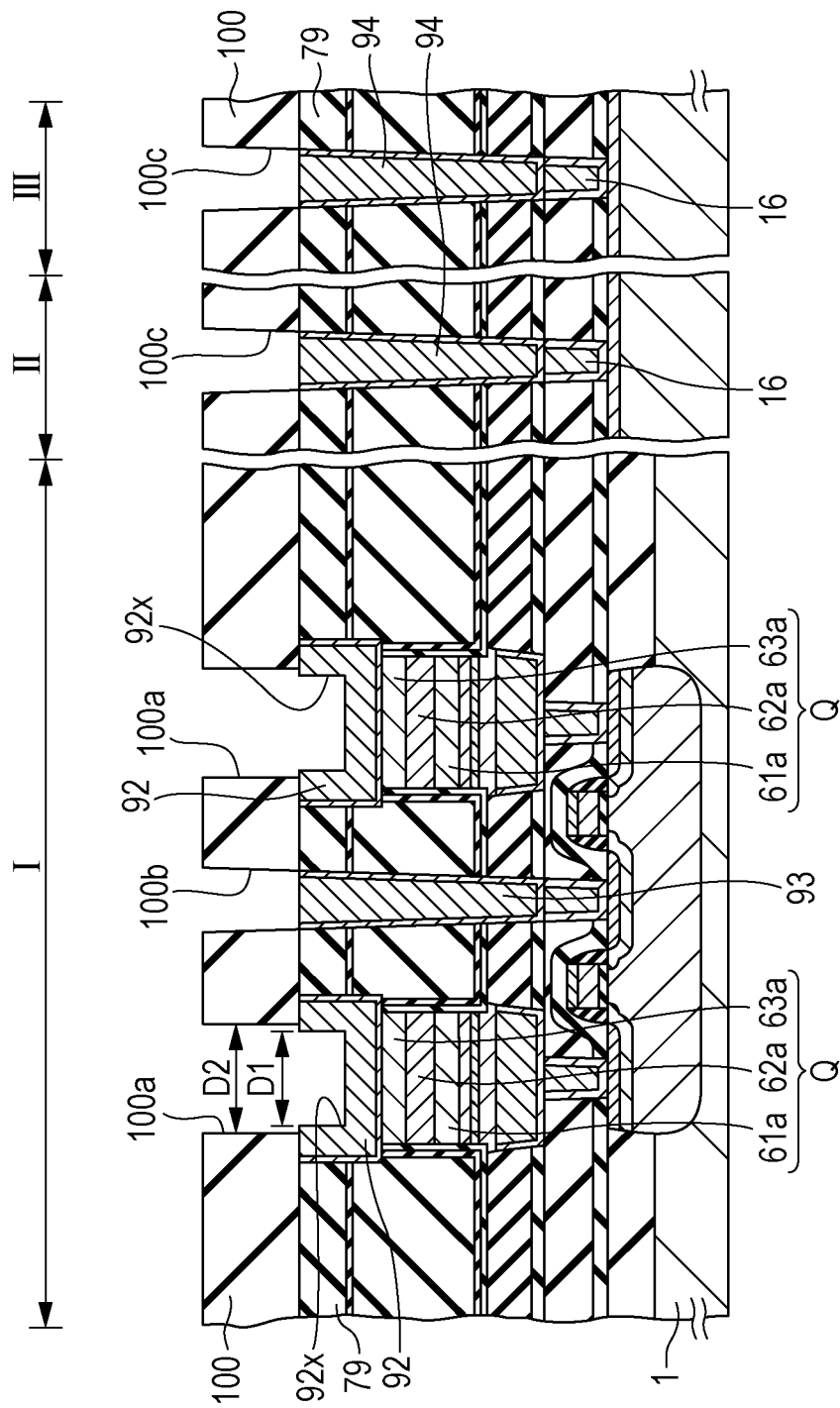
FIG. 60 is a cross-sectional view (part 4) illustrating a process of producing a semiconductor device according to the fourth embodiment.

Subsequently, as illustrated in FIG. 60, the third insulating film 100 is patterned by photolithography and dry etching to form a first wiring groove 100a continuous to the recess 92x.

An etching gas used in the dry etching is not particularly limited. In the fourth embodiment, a mixed gas of $C_4F_8$, Ar, $O_2$, and CO is used as the etching gas.

The width of the first wiring groove 100a is also not particularly limited. However, it is preferable that a width D2 of the first wiring groove 100a be larger than a width D1 of the recess 92x in consideration of a positional shift between the first wiring groove 100a and the recess 92x so that the whole recess 92x is exposed from the first wiring groove 100a even when such a positional shift occurs.

In the fourth embodiment, the width D1 of the recess 92x is about 0.5 to 0.8 μm, and the width D2 of the first wiring groove 100a is about 0.9 to 1.0 μm, which is larger than the width D1 of the recess 92x.

In this process, a first hole 100b and second holes 100c are also formed in the third insulating film 100 on the second conductor plug 93 and the upper rings 94, respectively.

Figure 61:
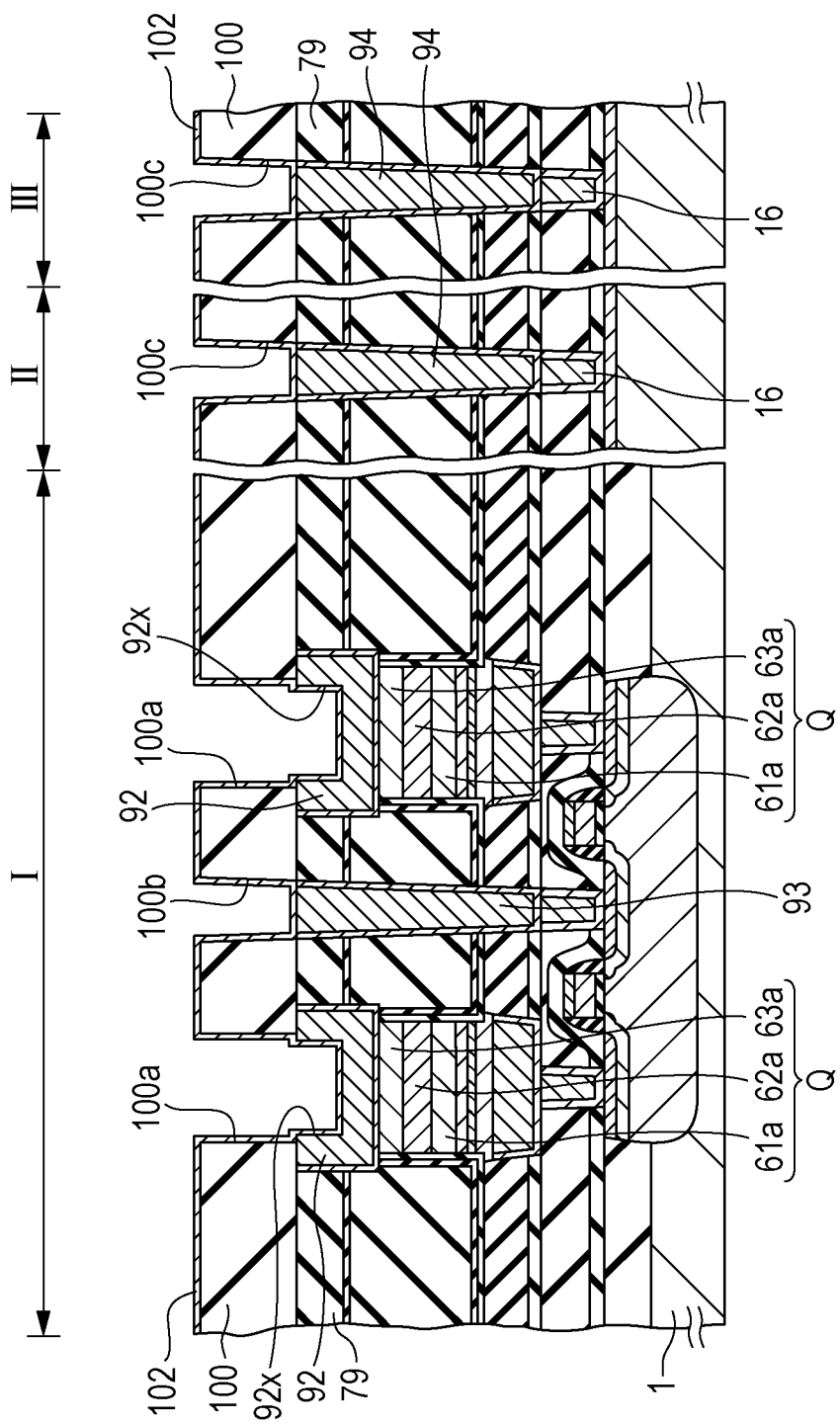
FIG. 61 is a cross-sectional view (part 5) illustrating a process of producing a semiconductor device according to the fourth embodiment.

Next, as illustrated in FIG. 61, a tantalum nitride film is formed as a first barrier metal film 102 against copper on the upper surface of the third insulating film 100 and the inner surfaces of the first wiring groove 100a, the first hole 100b, and the second holes 100c by a sputtering method so as to have a thickness of about 50 nm.

Figure 62:
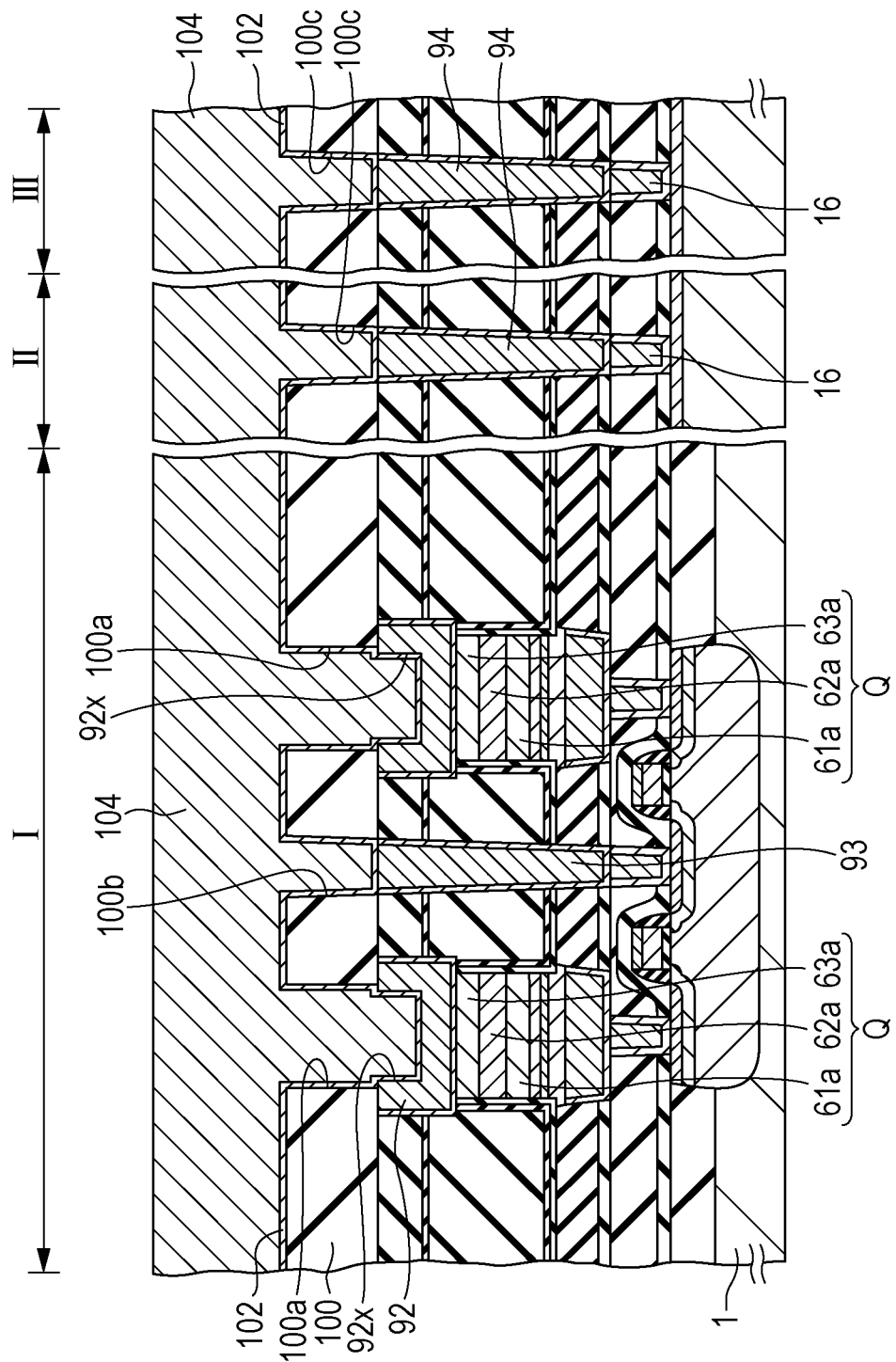
FIG. 62 is a cross-sectional view (part 6) illustrating a process of producing a semiconductor device according to the fourth embodiment.

Next, as illustrated in FIG. 62, a first copper film 104 is formed on the first barrier metal film 102 by a plating method or a CVD method so that each of the first wiring groove 100a, the first hole 100b, and the second holes 100c is completely filled with the first copper film 104.

Figure 63:
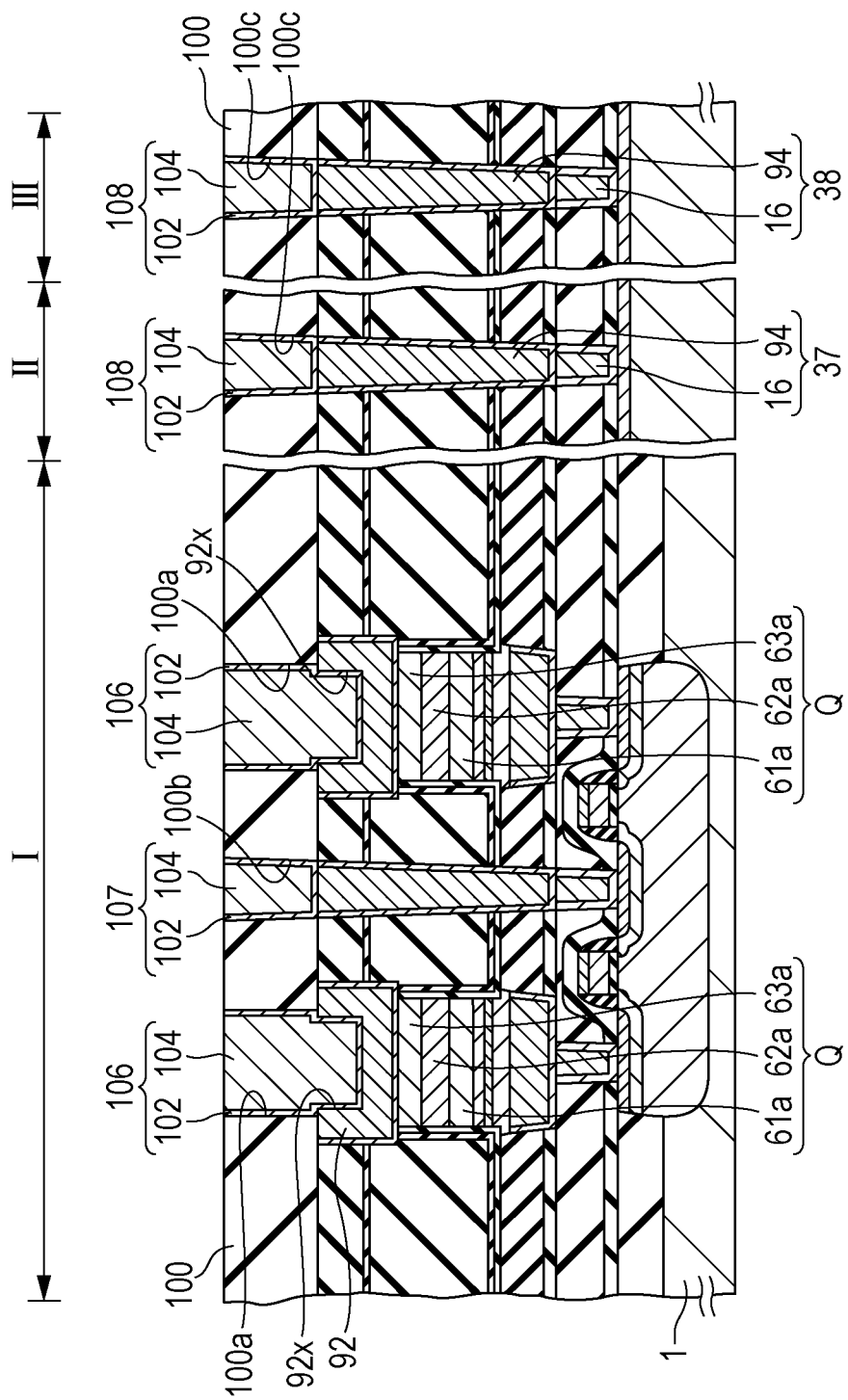
FIG. 63 is a cross-sectional view (part 7) illustrating a process of producing a semiconductor device according to the fourth embodiment.

Subsequently, as illustrated in FIG. 63, unwanted portions of the first barrier metal film 102 and the first copper film 104 on the third insulating film 100 are removed by CMP.

As a result, the first barrier metal film 102 and the first copper film 104 are left as a first copper wiring 106 in the first wiring groove 100a.

In the first hole 100b, the first barrier metal film 102 and the first copper film 104 are left as a first copper plug 107. In the second holes 100c, the barrier metal film 102 and the first copper film 104 are left as copper rings 108.

Figure 64:
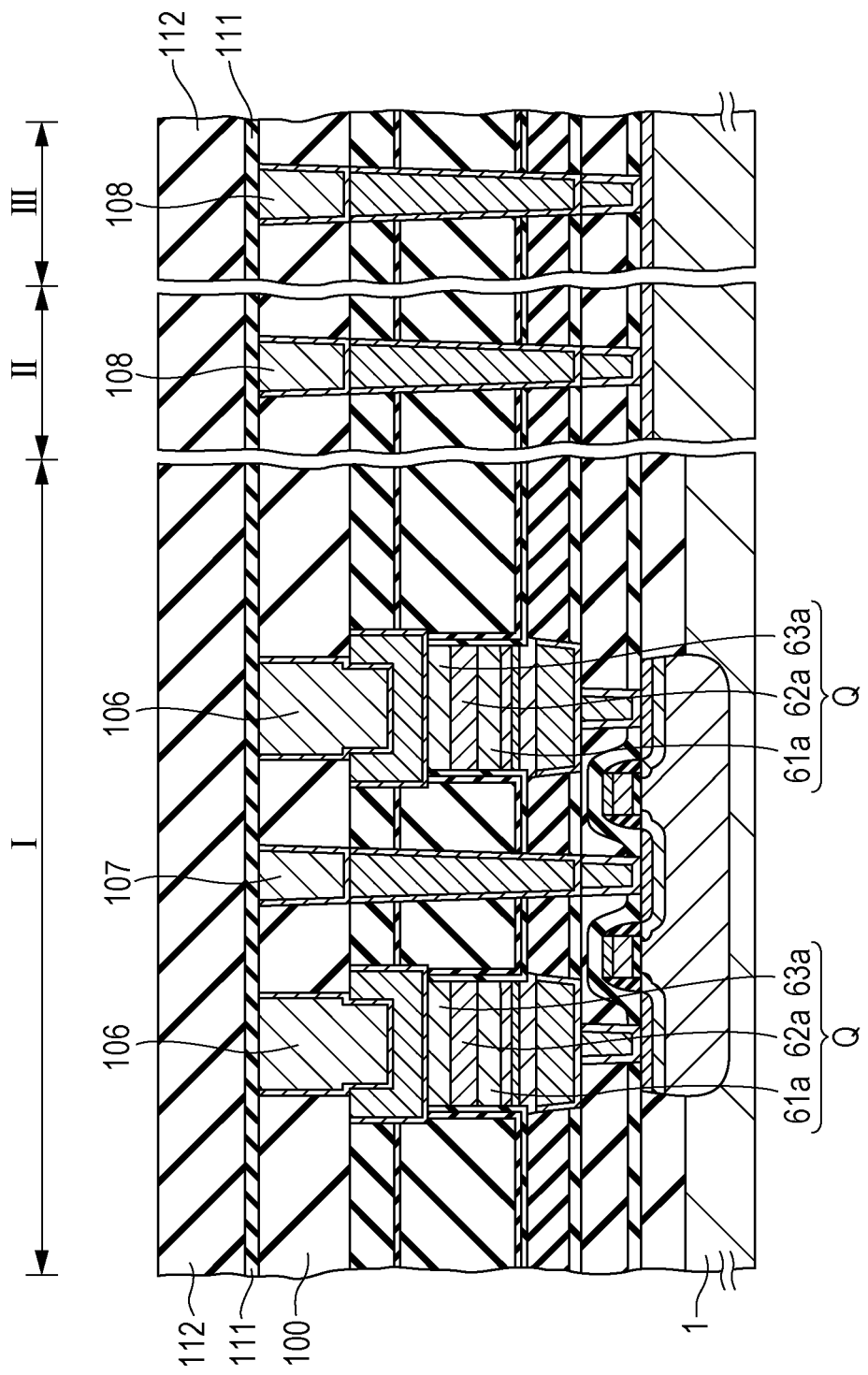
FIG. 64 is a cross-sectional view (part 8) illustrating a process of producing a semiconductor device according to the fourth embodiment.

Subsequently, as illustrated in FIG. 64, a silicon nitride film is formed as a third antioxidation insulating film 111 over the entire upper surface of the silicon substrate 1 by a CVD method so as to have a thickness of about 50 nm.

Furthermore, a silicon oxide film is formed on the third antioxidation insulating film 111 by a plasma CVD method using TEOS gas so as to have a thickness of about 500 nm. This silicon oxide film functions as a fourth insulating film 112.

The deposition atmosphere of the fourth insulating film 112 contains oxygen. However, since the third antioxidation insulating film 111 is formed prior to the deposition of the fourth insulating film 112, it is possible to suppress oxidation of the first copper wiring 106 and the first copper plug 107 by the oxygen.

Next, a process of forming the cross-sectional structure illustrated in FIG. 65 will be described.

First, the fourth insulating film 112 is patterned using the third antioxidation insulating film 111 as an etching stopper film. Thus, a second wiring groove 112a is formed on the first copper wiring 106.

Subsequently, the third antioxidation insulating film 111 located at the bottom of the second wiring groove 112a is patterned to form a third hole 111a. A second barrier metal film 113a and a second copper film 113b are then sequentially formed inside each of the third hole 111a and the second wiring groove 112a.

The second barrier metal film 113a is a tantalum nitride film formed by a sputtering method. The second copper film 113b is formed by a plating method or a CVD method.

Subsequently, unwanted portions of the second barrier metal film 113a and the second copper film 113b on the upper surface of the fourth insulating film 112 are removed by CMP. The second barrier metal film 113a and the second copper film 113b are left as a second copper wiring 115 only in the second wiring groove 112a.

Through the above process, a basic structure of the semiconductor device according to the fourth embodiment is formed.

Figure 65:
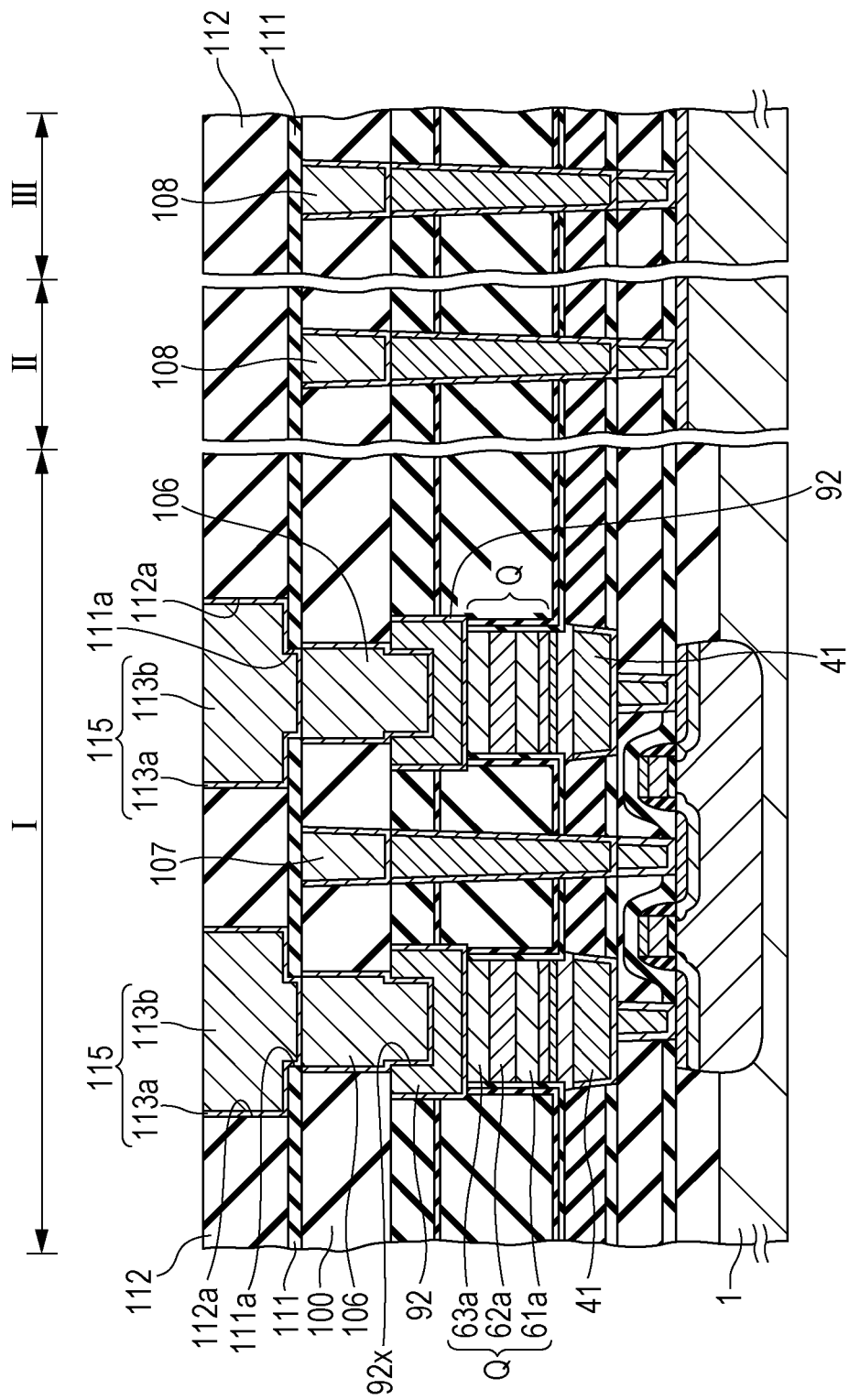
FIG. 65 is a cross-sectional view (part 9) illustrating a process of producing a semiconductor device according to the fourth embodiment.

According to the fourth embodiment, as illustrated in FIG. 65, the first conductor plug 92 and the conductor 41 that are respectively provided above and below the ferroelectric capacitor Q may protect the ferroelectric capacitor Q from gamma rays. Thus, the radiation resistance of the semiconductor device may be improved.

Furthermore, since the electrical resistance of the first copper wiring 106 is lower than aluminum, which is a main material of the metal wiring 95a (refer to FIG. 54) of the third embodiment, high-speed operation and low-power consumption of the semiconductor device may be realized compared with the third embodiment.

Since the recess 92x is provided in the first conductor plug 92 and the first copper wiring 106 is embedded in the recess 92x, the first copper wiring 106 has a thickness corresponds to the thickness of the third insulating film 100 and the depth of the recess 92x. Thus, the thickness of the first copper wiring 106 is increased by the length corresponding to the depth of the recess 92x. With this structure, the electrical resistance of the first copper wiring 106 may be reduced as compared with the case where the first copper wiring 106 is embedded only in the third insulating film 100 without providing the recess 92x, and thus higher-speed operation and lower-power consumption of the semiconductor device may be realized.

Furthermore, the first copper wiring 106 and the second copper wiring 115 are formed above the ferroelectric capacitor Q after the formation of the ferroelectric capacitor Q. Therefore, the first copper wiring 106 and the second copper wiring 115 are not exposed to crystallization annealing and recovery annealing performed on the ferroelectric capacitor Q. Thus, there is no risk that the first copper wiring 106 and the second copper wiring 115 are melted by the annealing.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A semiconductor device comprising:
a semiconductor substrate;
a first insulating film that is formed over the semiconductor substrate;
a capacitor that is formed over the first insulating film and is formed by sequentially stacking a lower electrode, a capacitor dielectric film, and an upper electrode;
a second insulating film that is formed over the capacitor and has a hole including the entire region of the upper electrode in plan view; and
a conductor plug that is formed in the hole and contains tungsten.

2. The semiconductor device according to claim 1,
wherein the center of gravity of the hole and the center of gravity of the upper electrode coincide with each other in plan view.

3. The semiconductor device according to claim 1,
wherein the shape of the hole is similar to the shape of the upper electrode in plan view.

4. The semiconductor device according to claim 1,
wherein the hole is larger than a lower surface of the upper electrode in plan view.

5. The semiconductor device according to claim 1,
wherein the conductor plug includes a tungsten film having a recess in an upper surface of the tungsten film, and a copper wiring is formed in the recess.

6. The semiconductor device according to claim 5, further comprising:
a third insulating film that is formed over the second insulating film and has a wiring groove on the hole, the wiring groove being continuous to the recess,
wherein the copper wiring is formed in the recess and the wiring groove.

7. The semiconductor device according to claim 6,
wherein the wiring groove has a width larger than a width of the recess.

8. The semiconductor device according to claim 1, further comprising:
an opening that is formed in the first insulating film under the capacitor and includes the entire region of the lower electrode in plan view, and
a conductor that contains tungsten and is embedded in the fast opening.

9. The semiconductor device according to claim 8, further comprising:
an element isolation insulating film that is formed in the semiconductor substrate,
wherein the opening is formed on the element isolation insulating film.

10. The semiconductor device according to claim 8, further comprising:
an antioxidation insulating film that is formed over the conductor and the first insulating film and suppresses oxidation of the conductor, and,
wherein the capacitor is formed on the antioxidation insulating film.

11. The semiconductor device according to claim 1, further comprising:
an impurity diffusion region that is formed in the semiconductor substrate;
a contact plug that is embedded in the first insulating film over the impurity diffusion region and is electrically connected to the impurity diffusion region;
an interlayer insulating film that is formed over the first insulating film and has an opening on the contact plug, the opening including the entire region of the lower electrode in plan view; and
a conductor that is embedded in the opening, the conductor containing tungsten and being electrically connected to the contact plug and the lower electrode of the capacitor which is formed on the conductor.

12. The semiconductor device according to claim 11, further comprising:
a conductive film that is formed on the conductor so to fill the opening,
wherein the conductor is formed up to a halfway position of the opening in a depth direction, and
the capacitor is formed on the conductive film.

13. The semiconductor device according to claim 12,
wherein the conductive film has a first upper surface right under the capacitor, a side face that is connected to the first upper surface and is flush with a side face of the lower electrode, and a second upper surface connected to the side face and extending in a parallel to a surface of the substrate.

14. The semiconductor device according to claim 1,
wherein a plurality of the capacitors and a plurality of the conductor plugs are provided, and
a radioactive ray coming toward the capacitor dielectric film right under the upper electrode of one of the capacitors is blocked by the conductor plug on the other capacitor.

15. The semiconductor device according to claim 14, wherein among radiation that is incident on the capacitor dielectric film without being blocked by the conductor plug on the other capacitor, the radiation having the maximum incident angle has a tangent of the incident angle, the tangent being equal to a value $(a-d)/(2(b-e))$, where a represents a distance between lower surfaces of the upper electrodes of adjacent capacitors, b represents a distance between the lower surface of the upper electrode and an upper surface of the conductor plug, d represents a distance between lower surfaces of adjacent conductor plugs, and e represents a distance between the upper surface and the lower surface of the conductor plug.

16. The semiconductor device according to claim 15, wherein the tangent is represented by $(c+d)/(2e)$ where c represents a distance between the upper surfaces of the adjacent conductor plugs.

17. The semiconductor device according to claim 1, wherein another conductor plug containing tungsten is provided in the second insulating film on a side of the capacitor, and radiation coming toward the capacitor dielectric film right under the upper electrode is blocked by the another conductor plug.

18. The semiconductor device according to claim 1, further comprising:

a blocking body formed above the second insulating film and containing tungsten, wherein radiation coming toward the capacitor dielectric film right under the upper electrode is blocked by the blocking body.

19. The semiconductor device according to claim 1, wherein the semiconductor substrate has a cell region where a plurality of the capacitors are formed, and a conductor ring containing tungsten, the conductor ring having a height at least reaching the upper surface of the second insulating film and surrounding the cell region in plan view, is provided on the semiconductor substrate.

20. A method for producing a semiconductor device comprising:

forming a first insulating film on a semiconductor substrate;

forming, on the first insulating film, a capacitor by sequentially stacking a lower electrode, a capacitor dielectric film, and an upper electrode;

forming a second insulating film that covers the capacitor;

forming a hole in the second insulating film by pattering the second insulating film, the hole including the entire region of the upper electrode in plan view; and forming, in the hole, a conductor plug that is electrically connected to the upper electrode and that contains tungsten.

* * * * *